United States Patent
Yoneda et al.

(10) Patent No.: US 11,917,318 B2
(45) Date of Patent: Feb. 27, 2024

(54) IMAGING DEVICE, OPERATION METHOD THEREOF, AND ELECTRONIC DEVICE

(71) Applicant: Semiconductor Energy Laboratory Co., Ltd., Atsugi (JP)

(72) Inventors: Seiichi Yoneda, Isehara (JP); Hiroki Inoue, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 25 days.

(21) Appl. No.: 17/768,972

(22) PCT Filed: Oct. 27, 2020

(86) PCT No.: PCT/IB2020/060041
§ 371 (c)(1),
(2) Date: Apr. 14, 2022

(87) PCT Pub. No.: WO2021/090110
PCT Pub. Date: May 14, 2021

(65) Prior Publication Data
US 2023/0247331 A1   Aug. 3, 2023

(30) Foreign Application Priority Data
Nov. 7, 2019   (JP) .................. 2019-202403

(51) Int. Cl.
*H04N 25/78*   (2023.01)
*H04N 25/709*   (2023.01)
(Continued)

(52) U.S. Cl.
CPC ........... *H04N 25/78* (2023.01); *H04N 25/709* (2023.01); *H04N 25/77* (2023.01); *H10K 39/32* (2023.02)

(58) Field of Classification Search
CPC ..... H01L 27/146; H01L 29/786; H10K 30/30; H10K 39/32; H04N 25/47; H04N 25/707; H04N 25/709; H04N 25/77; H04N 25/78
See application file for complete search history.

(56) References Cited

U.S. PATENT DOCUMENTS 5,376,782 A   12/1994 Ikeda et al.
5,949,064 A *   9/1999 Chow .................. H04B 10/032
                                                         348/E3.018
(Continued)

FOREIGN PATENT DOCUMENTS

JP   2011-119711 A   6/2011
JP   2017-005693 A   1/2017
(Continued)

OTHER PUBLICATIONS

International Search Report (Application No. PCT/IB2020/060041) dated Feb. 9, 2021.
(Continued)

*Primary Examiner* — Amy R Hsu
(74) *Attorney, Agent, or Firm* — Eric J. Robinson; Robinson Intellectual Property Law Office, P.C.

(57) ABSTRACT

An imaging device with low power consumption is provided. A pixel includes a first circuit and a second circuit. The first circuit can generate imaging data and retain difference data that is a difference between the imaging data and data obtained in an initial frame. The second circuit includes a circuit that compares the difference data and a voltage range set arbitrarily. The second circuit supplies a reading signal based on the comparison result. With the use of the structure, reading from the pixel is not performed when it is determined that the difference data is within the
(Continued)

set voltage range and reading from the pixel can be performed when it is determined that the difference data is outside the voltage range.

13 Claims, 33 Drawing Sheets

(51) Int. Cl.
*H04N 25/77* (2023.01)
*H10K 39/32* (2023.01)

(56) References Cited

U.S. PATENT DOCUMENTS

| | | | |
|---|---|---|---|
| 6,075,251 | A | 6/2000 | Chow et al. |
| 8,947,573 | B2 | 2/2015 | Sogoh et al. |
| 9,177,980 | B2 | 11/2015 | Sogoh et al. |
| 9,419,045 | B2 | 8/2016 | Sogoh et al. |
| 9,450,121 | B2* | 9/2016 | Nagahiro .......... H01L 27/14632 |
| 9,772,702 | B2 | 9/2017 | Kurokawa. et al. |
| 10,200,573 | B2 | 2/2019 | Yoneda et al. |
| 10,205,894 | B2 | 2/2019 | Kawabata et al. |
| 10,373,991 | B2 | 8/2019 | Ohmaru et al. |
| 10,468,439 | B2 | 11/2019 | Ikeda et al. |
| 10,536,657 | B2 | 1/2020 | Nakagawa et al. |
| 10,992,891 | B2 | 4/2021 | Ohmaru et al. |
| 11,330,213 | B2 | 5/2022 | Nakagawa et al. |
| 2004/0222351 | A1 | 11/2004 | Rossi |
| 2008/0117739 | A1* | 5/2008 | Jung ................ G11B 20/10009 369/44.39 |
| 2016/0037110 | A1* | 2/2016 | Choi ..................... H04N 25/75 348/294 |
| 2016/0356645 | A1 | 12/2016 | Yoneda et al. |
| 2017/0038471 | A1 | 2/2017 | Ikeda et al. |
| 2017/0054930 | A1* | 2/2017 | Ohmaru ............... H04N 23/667 |
| 2018/0227526 | A1* | 8/2018 | Tokuhara ............. H04N 25/585 |
| 2019/0096206 | A1* | 3/2019 | Nakagawa ............. H04N 25/74 |
| 2019/0132533 | A1 | 5/2019 | Kawabata et al. |
| 2021/0314517 | A1 | 10/2021 | Ohmaru et al. |

FOREIGN PATENT DOCUMENTS

| | | |
|---|---|---|
| JP | 2017-041878 A | 2/2017 |
| KR | 2016-0144314 A | 12/2016 |
| KR | 2018-0123547 A | 11/2018 |
| WO | WO-2017/158478 | 9/2017 |

OTHER PUBLICATIONS

Written Opinion (Application No. PCT/IB2020/060041) dated Feb. 9, 2021.

* cited by examiner

FIG. 32A1
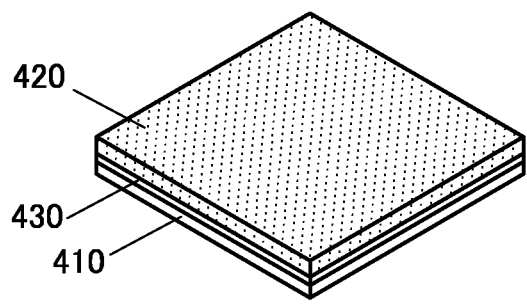
FIG. 32B1
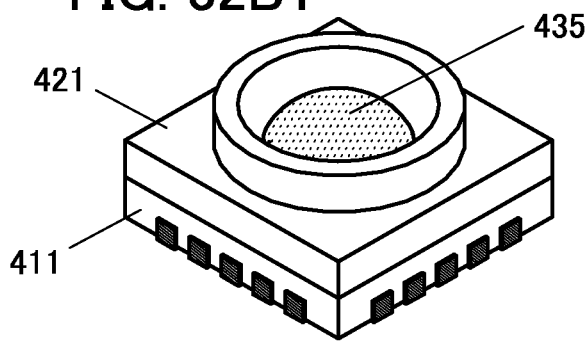
FIG. 32A2
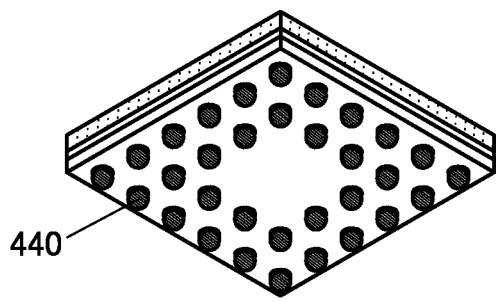
FIG. 32B2
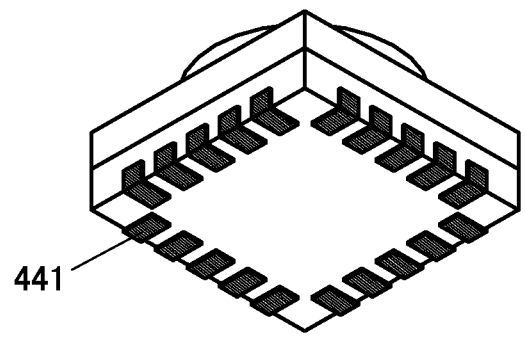
FIG. 32A3
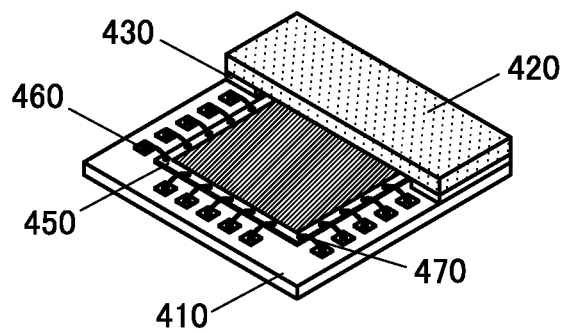
FIG. 32B3
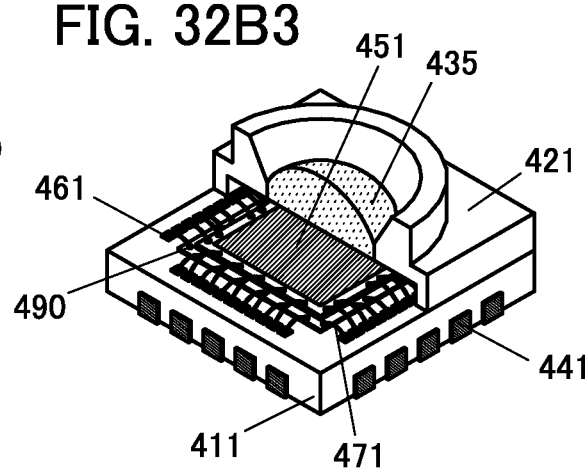

IMAGING DEVICE, OPERATION METHOD THEREOF, AND ELECTRONIC DEVICE

TECHNICAL FIELD

One embodiment of the present invention relates to an imaging device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Accordingly, more specific examples of the technical field of one embodiment of the present invention disclosed in this specification include a semiconductor device, a display device, a liquid crystal display device, a light-emitting device, a lighting device, a power storage device, a memory device, an imaging device, an operation method thereof, and a manufacturing method thereof.

In this specification and the like, a semiconductor device means every device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

A technique for forming a transistor by using an oxide semiconductor thin film formed over a substrate has attracted attention. For example, an imaging device with a structure in which a transistor that includes an oxide semiconductor and has an extremely low off-state current is used in a pixel circuit is disclosed in Patent Document 1.

REFERENCE

Patent Document

[Patent Document 1] Japanese Published Patent Application No. 2011-119711

SUMMARY OF THE INVENTION

Problems to be Solved by the Invention

In capturing moving images using a CMOS image sensor or the like, operation of reading out data obtained in all pixels is performed every frame. In this operation, data that can be regarded as being identical is sometimes obtained in the same pixel in a plurality of successive frames.

For example, a stationary subject outdoors undergoes variations of natural light and shade over time; few changes are noticed by a human at a short interval of $1/10$ seconds or less, which corresponds to the frame rate of a moving image. In other words, data that can be regarded as being identical is obtained over a plurality of frames.

The data is read out every frame, consuming power. Omitting the reading operation of the data that can be regarded as being identical results in a reduction in power consumption.

In view of the above, an object of one embodiment of the present invention is to provide an imaging device with low power consumption. Another object is to provide an imaging device capable of detecting a change in a subject. Another object is to provide a highly reliable imaging device. Another object is to provide a novel imaging device or the like. Another object is to provide a method for operating the above imaging device. Another object is to provide a novel semiconductor device or the like.

Note that the description of these objects does not preclude the existence of other objects. One embodiment of the present invention does not have to achieve all these objects. Note that other objects will be apparent from the description of the specification, the drawings, the claims, and the like, and other objects can be derived from the description of the specification, the drawings, the claims, and the like.

Means for Solving the Problems

One embodiment of the present invention relates to an imaging device including a circuit that compares data between adjacent frames and determines a pixel subjected to reading.

One embodiment of the present invention is an imaging device including a pixel including a first circuit and a second circuit. The first circuit includes a first node, a second node, and a first switch. The first node has a function of retaining first image data generated in a first frame period. The first node has a function of retaining second image data generated in an n-th frame (n is a natural number of 2 or more) period. The second node has a function of retaining difference data that is a difference between the first image data and the second image data. The first switch has a function of controlling output of the first image data and the second image data. The second circuit includes a comparison circuit and an output circuit. The comparison circuit has a function of determining whether the difference data is within a voltage range set arbitrarily. The output circuit has a function of outputting a voltage for turning off the first switch when the difference data is within the voltage range and outputting a voltage for turning on the first switch when the difference data is outside the voltage range.

The first circuit can have a structure including a photoelectric conversion device, a first transistor, a second transistor, a third transistor, a fourth transistor, a fifth transistor, a sixth transistor, a first capacitor, and a second capacitor. One electrode of the photoelectric conversion device is electrically connected to one of a source and a drain of the first transistor, the other of the source and the drain of the first transistor is electrically connected to one of a source and a drain of the second transistor, a gate of the third transistor, one electrode of the first capacitor, and one electrode of the second capacitor. One of a source and a drain of the third transistor is electrically connected to one of a source and a drain of the fourth transistor. The other of the source and the drain of the third transistor is electrically connected to one of a source and a drain of the fifth transistor. The other electrode of the second capacitor is electrically connected to one of a source and a drain of the sixth transistor. The fifth transistor can operate as the first switch.

The first circuit may have a structure further including a seventh transistor. One of a source and a drain of the seventh transistor is electrically connected to the other of the source and the drain of the first transistor and the one of the source and the drain of the second transistor. The other of the source and the drain of the seventh transistor is electrically connected to the gate of the third transistor, the one electrode of the first capacitor, and the one electrode of the second capacitor.

The first transistor to the seventh transistor each preferably include a metal oxide in a channel formation region. The metal oxide can include In, Zn, and M (M is one or more of Al, Ti, Ga, Ge, Sn, Y, Zr, La, Ce, Nd, and Hf).

The comparison circuit can have a structure including a first sense amplifier and a second sense amplifier. The first sense amplifier includes a third node, the second sense amplifier includes a fourth node, and the output circuit includes a fifth node. The first sense amplifier includes a first input unit to which a lowest voltage in the voltage range is input. The second sense amplifier includes a second input unit to which a highest voltage in the voltage range is input. The first sense amplifier and the second sense amplifier each include a third input unit to which the second node is electrically connected. The third node and the fourth node are electrically connected to the output circuit. The fifth node is electrically connected to the first switch.

The third input unit may be electrically connected to the second node of one pixel and the fifth node may be electrically connected to the first switches of a plurality of pixels.

The second circuit further can include an inverter circuit. Transistors included in the inverter circuit, the first sense amplifier, the second sense amplifier, and the output circuit can each include silicon in a channel formation region.

The first sense amplifier and the second sense amplifier each include a first power switch and a second power switch. The first power switch may include a p-channel transistor, the second power switch may include an n-channel transistor, and the n-channel transistor may include a metal oxide in a channel formation region. The metal oxide preferably includes In, Zn, and M (M is one or more of Al, Ti, Ga, Ge, Sn, Y, Zr, La, Ce, Nd, and Hf).

A region where the first circuit and the second circuit overlap with each other can be included. Alternatively, a region where a plurality of first circuits and one second circuit overlap with each other may be included.

Another embodiment of the present invention is an operation method of an imaging device, including the steps of setting a first voltage and a second voltage (the first voltage<the second voltage) in a pixel, obtaining first image data of a first frame period, obtaining second image data of an n-th frame (n is a natural number of 2 or more) period, calculating a third voltage, which is a difference between the first image data and the second image data, and comparing the first voltage, the second voltage, and the third voltage. The second data is not read out from the pixel when the third voltage is greater than the first voltage and less than the second voltage, and the second data is read out from the pixel when the third voltage is less than the first voltage or the third voltage is greater than the second voltage.

Effect of the Invention

With the use of one embodiment of the present invention, an imaging device with low power consumption can be provided. An imaging device capable of detecting a change in a subject can be provided. A highly reliable imaging device can be provided. A novel imaging device or the like can be provided. A method for operating the above imaging device can be provided. A novel semiconductor device or the like can be provided.

BRIEF DESCRIPTION OF THE DRAWINGS

FIG. 32A1 to FIG. 32A3 and FIG. 32B1 to FIG. 32B3 are perspective views of a package and a module in each of which an imaging device is placed.

MODE FOR CARRYING OUT THE INVENTION

Figure 1:
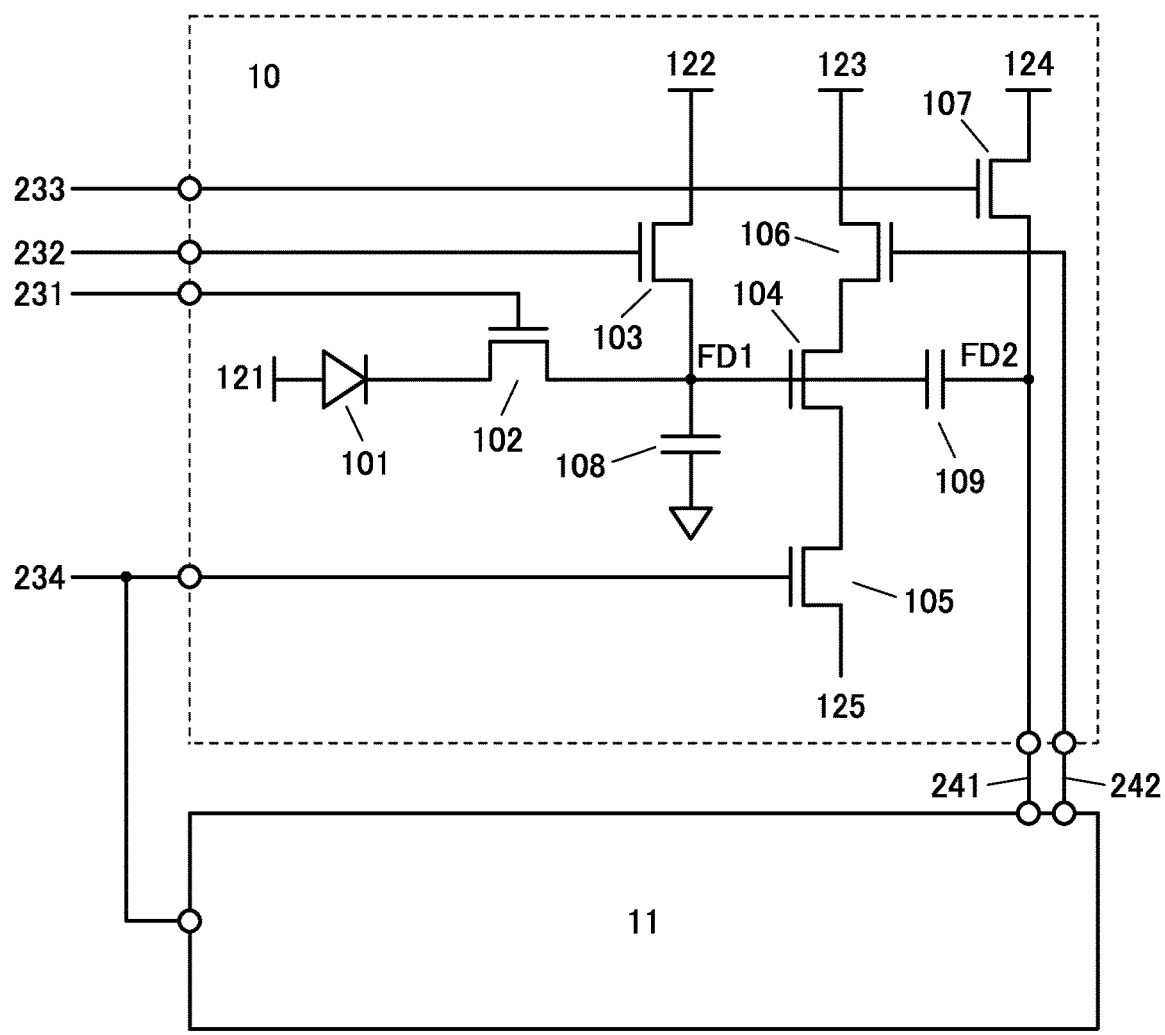
FIG. 1 is a diagram showing a pixel.

Embodiments will be described in detail with reference to the drawings. However, the present invention is not limited to the following description, and it is readily appreciated by those skilled in the art that modes and details can be modified in various ways without departing from the spirit and the scope of the present invention. Therefore, the present invention should not be interpreted as being limited to the description of embodiments below. Note that in structures of the invention described below, the same portions or portions having similar functions are denoted by the same reference numerals in different drawings, and the description thereof is not repeated in some cases. In some cases, the same components are denoted by different hatching patterns in different drawings, or the hatching patterns are omitted.

Even in the case where a single component is illustrated in a circuit diagram, the component may be composed of a plurality of parts as long as there is no functional inconvenience. For example, in some cases, a plurality of transistors that operate as switches are connected in series or in parallel. In some cases, capacitors are divided and arranged in a plurality of positions.

One conductor has a plurality of functions such as a wiring, an electrode, and a terminal in some cases. In this specification, a plurality of names are used for the same component in some cases. Even in the case where components are illustrated in a circuit diagram as if they were directly connected to each other, the components may actually be connected to each other through one conductor or a plurality of conductors. In this specification, even such a structure is included in direct connection.

Embodiment 1

In this embodiment, an imaging device of one embodiment of the present invention will be described with reference to drawings.

One embodiment of the present invention has a function of comparing data between frames and determining whether reading is performed according to the comparison result. Whether reading is performed can be controlled in each pixel.

A first circuit and a second circuit are provided in a pixel. The first circuit can generate imaging data and retain difference data that is a difference between the imaging data and data of an initial frame. The second circuit includes a circuit that compares the difference data and a voltage range set arbitrarily. The second circuit supplies a reading signal based on the comparison result to the first circuit.

With the use of the structure, for example, reading from the pixel is not performed when it is determined that the difference data is within the set voltage range and reading from the pixel can be performed when it is determined that the difference data is outside the voltage range.

Thus, reading operation can be omitted in the case where data that can be regarded as being identical to the data of the initial frame is obtained, reducing power consumption. Note that in the case where this operation is performed, only data of a pixel where reading has been performed may be rewritten on the basis of the data of the initial frame to generate frame data.

<Pixel Circuit>

FIG. 1 is a circuit diagram of a pixel included in the imaging device of one embodiment of the present invention. The pixel includes a circuit 10 and a circuit 11. The circuit 10 has a function of generating and retaining imaging data. The circuit 10 can also retain difference data that is a difference between data obtained in a first frame (initial frame) period and data obtained in an n-th (n is a natural number of 2 or more) frame (subject frame) period. The circuit 11 is a determination circuit, which can determine the level of the difference data and determine whether reading from the circuit 10 is to be performed or not.

<Circuit 10>

The circuit 10 includes a photoelectric conversion device 101, a transistor 102, a transistor 103, a transistor 104, a transistor 105, a transistor 106, a transistor 107, a capacitor 108, and a capacitor 109. Note that the capacitor 108 can be omitted.

One electrode of the photoelectric conversion device 101 is electrically connected to one of a source and a drain of the transistor 102. The other of the source and the drain of the transistor 102 is electrically connected to one of a source and a drain of the transistor 103, a gate of the transistor 104, one electrode of the capacitor 108, and one electrode of the capacitor 109. One of a source and a drain of the transistor 104 is electrically connected to one of a source and a drain of the transistor 105. The other of the source and the drain of the transistor 104 is electrically connected to one of a source and a drain of the transistor 106. The other electrode of the capacitor 109 is electrically connected to one of a source and a drain of the transistor 107.

A gate of the transistor 106 is electrically connected to the circuit 11 through a wiring 242. The other electrode of the capacitor 109 is electrically connected to the circuit 11 through a wiring 241.

Here, a point (a wiring) where the other of the source and the drain of the transistor 102, the one of the source and the drain of the transistor 103, the gate of the transistor 104, the one electrode of the capacitor 108, and the one electrode of the capacitor 109 are connected is referred to as a node FD1. Furthermore, a point (a wiring) where the other electrode of the capacitor 109, the one of the source and the drain of the transistor 107, and the wiring 241 are connected is referred to as a node FD2. At the node FD1, data obtained in each frame period can be retained. At the node FD2, the data of the initial frame or the difference data that is a difference between the data of the initial frame and the data of the subject frame can be retained.

The other electrode of the photoelectric conversion device 101 is electrically connected to a wiring 121. The other of the source and the drain of the transistor 103 is electrically connected to a wiring 122. The other of the source and the drain of the transistor 105 is electrically connected to a wiring 125. The other of the source and the drain of the transistor 106 is electrically connected to a wiring 123. The other of the source and the drain of the transistor 107 is electrically connected to a wiring 124.

A gate of the transistor 102 is electrically connected to a wiring 231. A gate of the transistor 103 is electrically connected to a wiring 232. A gate of the transistor 105 is electrically connected to a wiring 234. A gate of the transistor 107 is electrically connected to a wiring 233. Note that the wiring 234 is also electrically connected to the circuit 11.

Figure 2A:
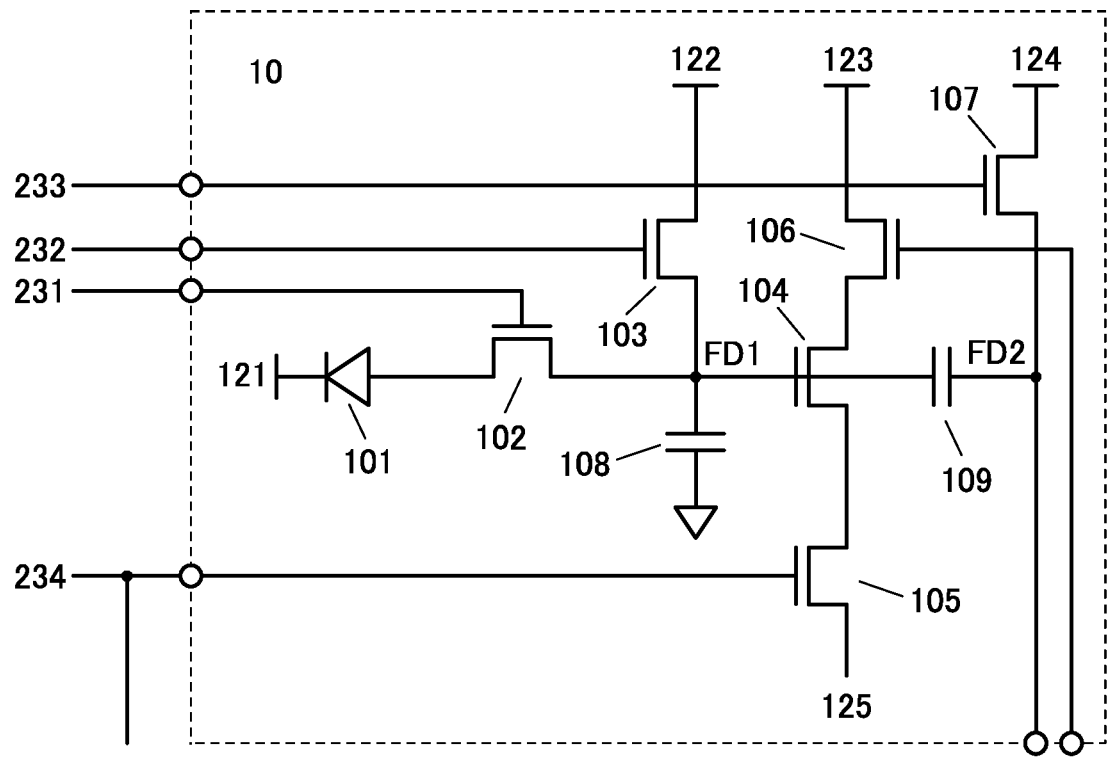
FIG. 2A and FIG. 2B are circuit diagrams each showing a circuit 10.

The wirings 121 to 124 can each have a function of a power supply line. For example, the wiring 121 can function as a low potential power supply line, and the wirings 122, 123, and 124 can each function as a high potential power supply line. Note that in the structure illustrated in FIG. 1, a cathode side of the photoelectric conversion device 101 is electrically connected to the transistor 102, and thus, the power supply lines are as described above. In contrast, an anode side of the photoelectric conversion device 101 may be electrically connected to the transistor 102 as illustrated in FIG. 2A. In that case, the 122 can function as a low potential power supply line and the wirings 121, 123, and 124 can each function as a high potential power supply line.

The wirings 231 to 234 can each have a function of a signal line that controls the conduction of each transistor. The wiring 125 can have a function of an output line and is electrically connected to, for example, a reading circuit including an interlayer double sampling circuit (CDS circuit), an A/D converter circuit, or the like.

The transistor 102 has a function of controlling the potential of the node FD1. The transistor 103 has a function of resetting the potential of the node FD1. The transistor 104 functions as a component of a source follower circuit. The transistor 105 and the transistor 106 have a function of selecting output from a pixel. The transistor 107 has a function of resetting the potential of the node FD2.

A transistor including a metal oxide in its channel formation region (hereinafter, an OS transistor) is preferably used as each of the transistors included in the circuit 10. The OS transistor has a feature of an extremely low off-state current. In particular, a transistor with a low off-state current is preferably used as each of the transistors 102, 103, and 107.

With the use of the OS transistors as these transistors, charge can be retained at the node FD1 and the node FD2 for a significantly long period, so that image data with less degradation can be read out.

A transistor including silicon in its channel formation region (hereinafter, a Si transistor) can also be used as each of the transistors 102 to 107. Examples of the Si transistor include a transistor including amorphous silicon and a transistor including crystalline silicon (microcrystalline silicon, low-temperature polysilicon, or single crystal silicon). The Si transistor has high mobility and is suitable for high-speed operation.

Figure 2B:
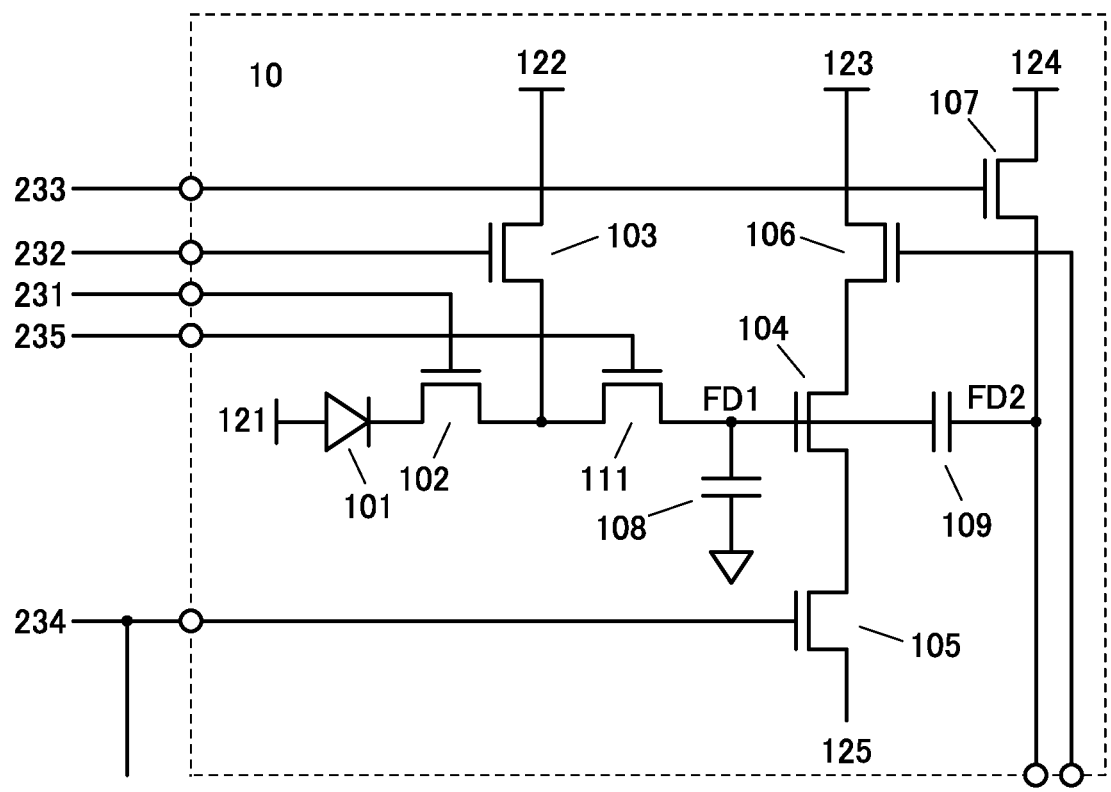

In the case where the transistors 102 and 103 are Si transistors, a transistor 111 is preferably provided additionally as illustrated in FIG. 2B. Here, the transistor 111 is an OS transistor.

One of a source and a drain of the transistor 111 is electrically connected to the other of the source and the drain of the transistor 102 and the one of the source and the drain of the transistor 103. The other of the source and the drain of the transistor 111 is electrically connected to the gate of the transistor 104, the one electrode of the capacitor 108, and the one electrode of the capacitor 109.

A gate of the transistor 111 is electrically connected to a wiring 235. The wiring 235 can have a function of a signal line that controls the conduction of the transistor 111.

In the structure of FIG. 2B, a point (a wiring) where the other of the source and the drain of the transistor 111, the gate of the transistor 104, the one electrode of the capacitor 108, and the one electrode of the capacitor 109 are connected is referred to as the node FD1.

Since the transistor 111 is an OS transistor with a low off-state current, the charge retention function of the node FD1 and the node FD2 can be increased. In addition, the photoelectric conversion device 101 can be an embedded photodiode formed in a silicon substrate; thus, a pixel circuit with little noise can be formed.

<Circuit 11>

Figure 3:
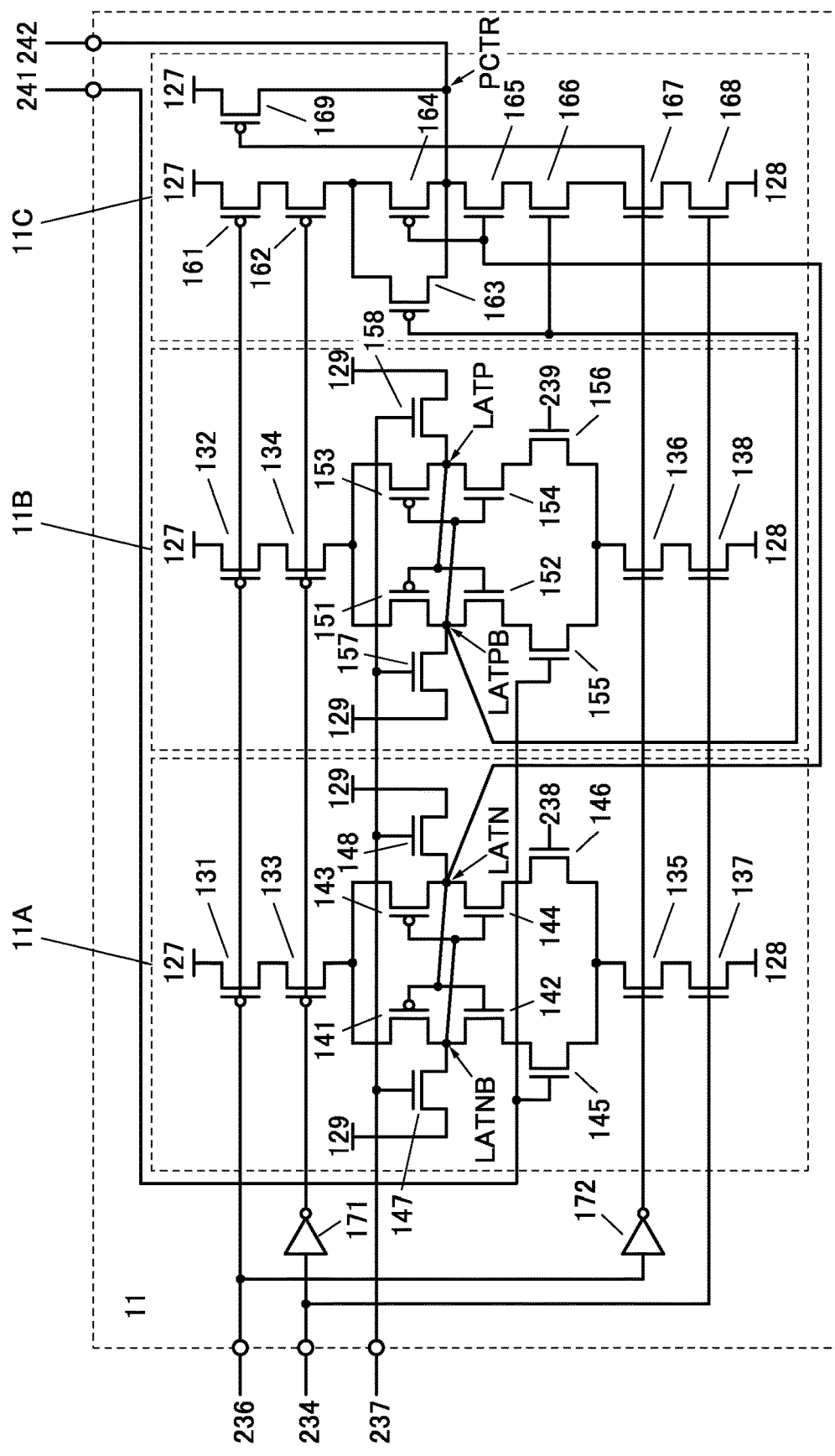
FIG. 3 is a circuit diagram showing a circuit 11.

FIG. 3 shows a circuit diagram of the circuit 11. The circuit 11 includes a sense amplifier 11A and a sense amplifier 11B as comparison circuits. The circuit 11 also includes an output circuit 11C. Inverters 171 and 172 are connected to some of signal lines connected to the sense amplifiers 11A and 11B and the output circuit 11C. Note that FIG. 3 is referred to for the connection relation of components constituting the circuit 11, and detained description thereof is omitted.

The sense amplifier 11A has a structure in which an inverter latch circuit (transistors 141, 142, 143, and 144) is electrically connected to power switches (transistors 131 and 133) connected to a high potential power supply line (a wiring 127), and the inverter latch circuit is electrically connected to power switches (transistors 135 and 137), which are connected to a low potential power supply line (a wiring 128) through a transistor 145 and a transistor 146.

A gate of the transistor 145 is electrically connected to the node FD2 of the circuit 10 through the wiring 241. A gate of the transistor 146 is electrically connected to a wiring 238. The wiring 238 is a wiring to which a constant potential determined based on the objective is supplied.

A transistor 147 and a transistor 148 are electrically connected to a node LATNB and a node LATN, respectively, of the inverter latch circuit. The transistor 147 has a function of precharging the node LATNB to the potential of a wiring 129. The transistor 148 has a function of precharging the node LATN to the potential of the wiring 129. The potential of the wiring 129 can be, for example, a potential substantially intermediate between the potential of the wiring 127 and the potential of the wiring 128.

The sense amplifier 11B has a structure in which an inverter latch circuit (transistors 151, 152, 153, and 154) is electrically connected to power switches (transistors 132 and 134) connected to a high potential power supply line (the wiring 127), and the inverter latch circuit is electrically connected to power switches (transistors 136 and 138), which are connected to a low potential power supply line (the wiring 128) through a transistor 155 and a transistor 156.

A gate of the transistor 155 is electrically connected to the node FD2 of the circuit 10 through the wiring 241. A gate of the transistor 156 is electrically connected to a wiring 239.

The wiring 239 is a wiring to which a constant potential determined based on the objective is supplied.

A transistor 157 and a transistor 158 are electrically connected to a node LATPB and a node LATP, respectively, of the inverter latch circuit. The transistor 157 has a function of precharging the node LATPB to the potential of the wiring 129. The transistor 158 has a function of precharging the node LATP to the potential of the wiring 129.

The output circuit 11C includes power switches (transistors 161 and 162) connected to a high potential power supply line (the wiring 127), power switches (transistors 167 and 168) connected to a low potential power supply line (the wiring 128), and transistors 163, 164, 165, 166, and 169. Each of the transistors is electrically connected to an output node PCTR.

Gates of the transistors 164 and 165 are electrically connected to the node LATN. Gates of the transistors 163 and 166 are electrically connected to the node LATPB. A gate of the transistor 169 is electrically connected to a wiring 236 through the inverter 172. The output node PCTR is electrically connected to the gate of the transistor 106 included in the circuit 10 through the wiring 242.

The circuit 11 is electrically connected to wirings 236, 234, and 237. The wirings 236, 234, and 237 are signal lines for controlling conduction of the transistors.

When a high potential ("H") is supplied to the wiring 236, the potential of the node PCTR is forced to become the high potential ("H"), so that the transistor 106 of the circuit 10 is turned on. That is, the transistor 106, which is one of the two selection transistors included in the circuit 10, can be forced to be turned on.

The wiring 236 can be electrically connected to gates of the transistors 131, 131, and 161. In addition, the wiring 236 can be electrically connected to gates of the transistors 135, 136, 167, and 169 through the inverter 172.

The wiring 234 can be electrically connected to gates of the transistors 133, 134, and 162 through the inverter 171. In addition, the wiring 234 can be electrically connected to gates of the transistors 137, 138, and 168. When a low potential ("L") is supplied to the wiring 236 and the high potential ("H") is supplied to the wiring 234, the power switches can be turned on.

The wiring 237 can be electrically connected to gates of the transistors 147, 148, 157, and 158. When the high potential ("H") is supplied to the wiring 237, the transistors 147, 148, 157, and 158 are turned on, so that the node LATNB, the node LATN, the node LATPB, and the node LATP can be precharged.

The circuit 11 includes p-channel transistors (the transistors 131, 132, 133, 134, 141, 143, 151, 153, 161, 162, 164, and 169). The circuit 11 also includes n-channel transistors (the transistors 135, 136, 137, 138, 142, 144, 145, 146, 147, 148, 152, 154, 155, 156, 157, 158, 165, 166, 167, and 168).

Si transistors are preferably used as these transistors. Alternatively, OS transistors may be used as the n-channel transistors. In particular, the use of OS transistors as the transistors 135, 136, 137, and 138 constituting the power switches can reduce unnecessary leakage current which is caused between the power supply lines when the transistors are not in operation, resulting in a reduction in electric power consumption.

<Operation of Circuit 10 and Circuit 11>

Next, operation of the circuit 10 and the circuit 11 is described. The operation includes imaging operation and reading operation of an initial frame, normal imaging operation, difference calculation operation, determination operation, and the like, which are described in sequence. Note that in the description below, a high potential signal for turning on an n-channel transistor and a high potential signal for turning off a p-channel transistor are each denoted as "H", and a low potential signal for turning off an n-channel transistor and a low potential signal for turning on a p-channel transistor are each denoted as "L"

It is assumed that in the circuit 11, a potential VN and a potential VP are supplied to the wiring 238 and the wiring 239, respectively. The potential VN and the potential VP are respectively a lowest voltage and a highest voltage in a voltage range used for determination. The voltage range corresponds to the range where data of a subject frame can be regarded as being identical to data of the initial frame.

<Imaging Operation of Initial Frame>

Figure 4:
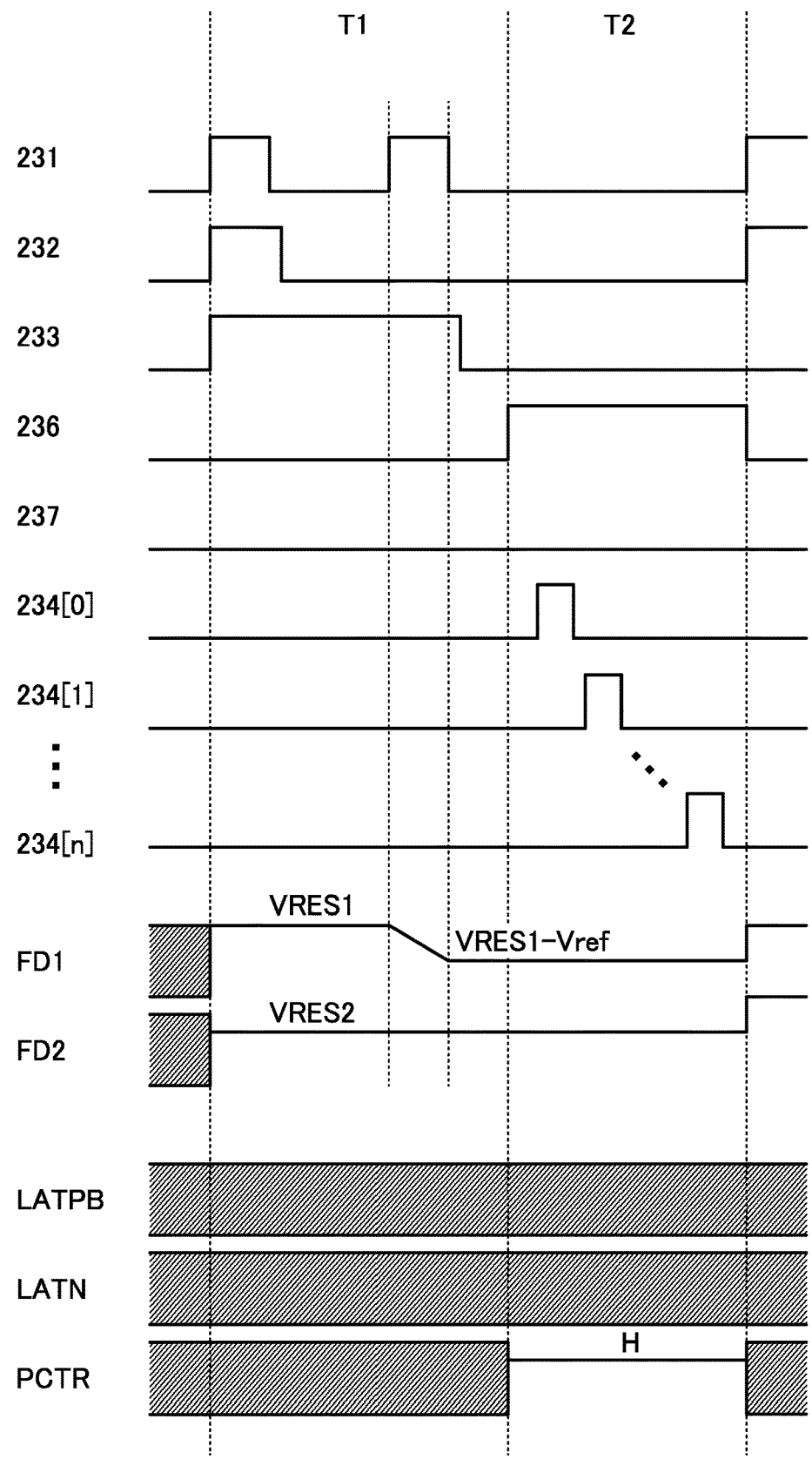
FIG. 4 is a timing chart showing pixel operation.

FIG. 4 is a timing chart showing the imaging operation (Period T1) and the reading operation (Period T2) of the initial frame. Note that in the drawing, [0] to [n] (n is a natural number) represent row numbers. The description below is made on only the row number [0].

In Period T1, the potential of the wiring 231 is set to "H", the potential of the wiring 232 is set to "H", the potential of the wiring 233 is set to "H", the potential of the wiring 236 is set to "L", the potential of the wiring 237 is set to "L", and the potentials of wirings 234[0:n] are set to "L"; then, in the circuit 10, the transistors 102, 103, and 107 are turned on and the potentials of the cathode of the photoelectric conversion device 101 and the node FD1 are reset to the potential of the wiring 122, "VRES1". Furthermore, the potential of the node FD2 is reset to the potential of the wiring 124, "VRES2".

Next, the potential of the wiring 231 is set to "L"; then, electric charge is accumulated in the cathode in response to the operation of the photoelectric conversion device 101. Furthermore, the potential of the wiring 232 is set to "L" to turn off the transistor 103, whereby the potential of the node FD1 is retained at "VRES1".

After a predetermined light exposure time elapsed, the potential of the wiring 231 is set to "H"; then, electric charge accumulated in the cathode of the photoelectric conversion device 101 is transferred to the node FD1. At this time, the potential of the node FD1 is lowered by a potential ("Vref") corresponding to the amount of the transferred electric charge, thereby being "VRES1–Vref". The node FD2 at this time is in the state of being supplied with "VRES2".

Next, the potential of the wiring 231 is set to "L" and the potential of the wiring 233 is set to "L"; then, the transistors 102 and 107 are turned off, so that the potential of the node FD1 is retained at "VRES1–Vref". Furthermore, the potential of the node FD2 is retained at "VRES2". Here, "VRES2" can be said to be a value obtained by replacing data of the initial frame. The above is the description of the imaging operation of the initial frame.

<Reading Operation of Initial Frame>

Figure 5:
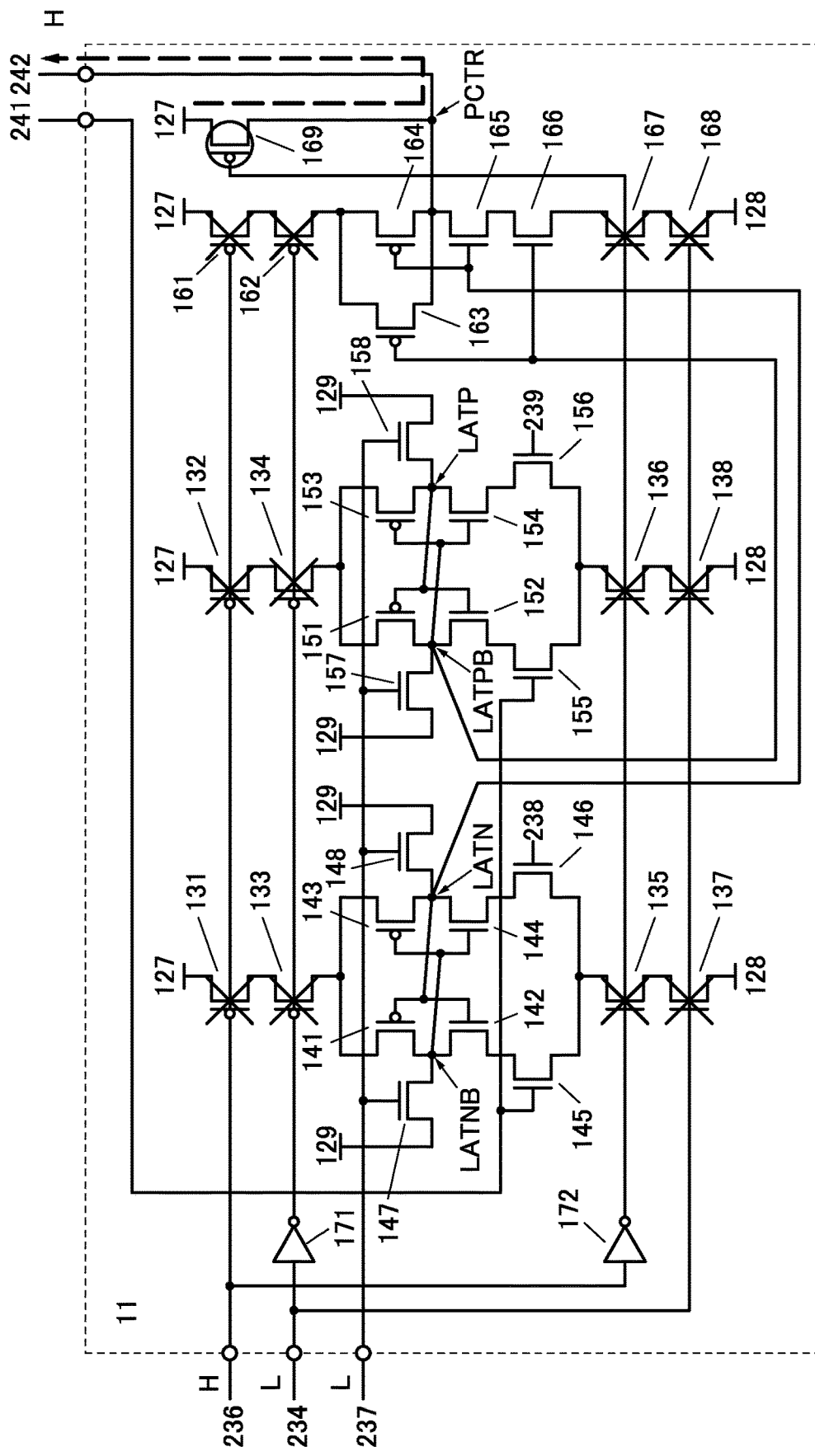
FIG. 5 is a diagram showing operation of the circuit 11.

In Period T2, the potential of the wiring 231 is set to "L", the potential of the wiring 232 is set to "L", the potential of the wiring 233 is set to "L", the potential of the wiring 236 is set to "H", the potential of the wiring 237 is set to "L", and the potentials of the wirings 234[0:n] are set to "L"; then, in the circuit 11, all the power switches are turned off and the transistor 169 is turned on as illustrated in FIG. 5. Thus, the potential of the output node PCTR becomes "H" and in the circuit 10, the transistor 106 is turned on and the potential of the wiring 123 (a power source potential) is supplied to the other of the source and the drain of the transistor 104. Note that O and X in the drawing denote the conduction of a transistor and the non-conduction of a transistor, respectively.

Next, the potential of the wiring 234[0] is set to "H"; then, the transistor 105 is turned on and data corresponding to the potential of the node FD1 is output to the wiring 125. The above is the description of the reading operation of the initial frame. The data that has been read out here can be retained in, for example, a frame memory.

<Normal Imaging Operation and Difference Calculation Operation>

Figure 6:
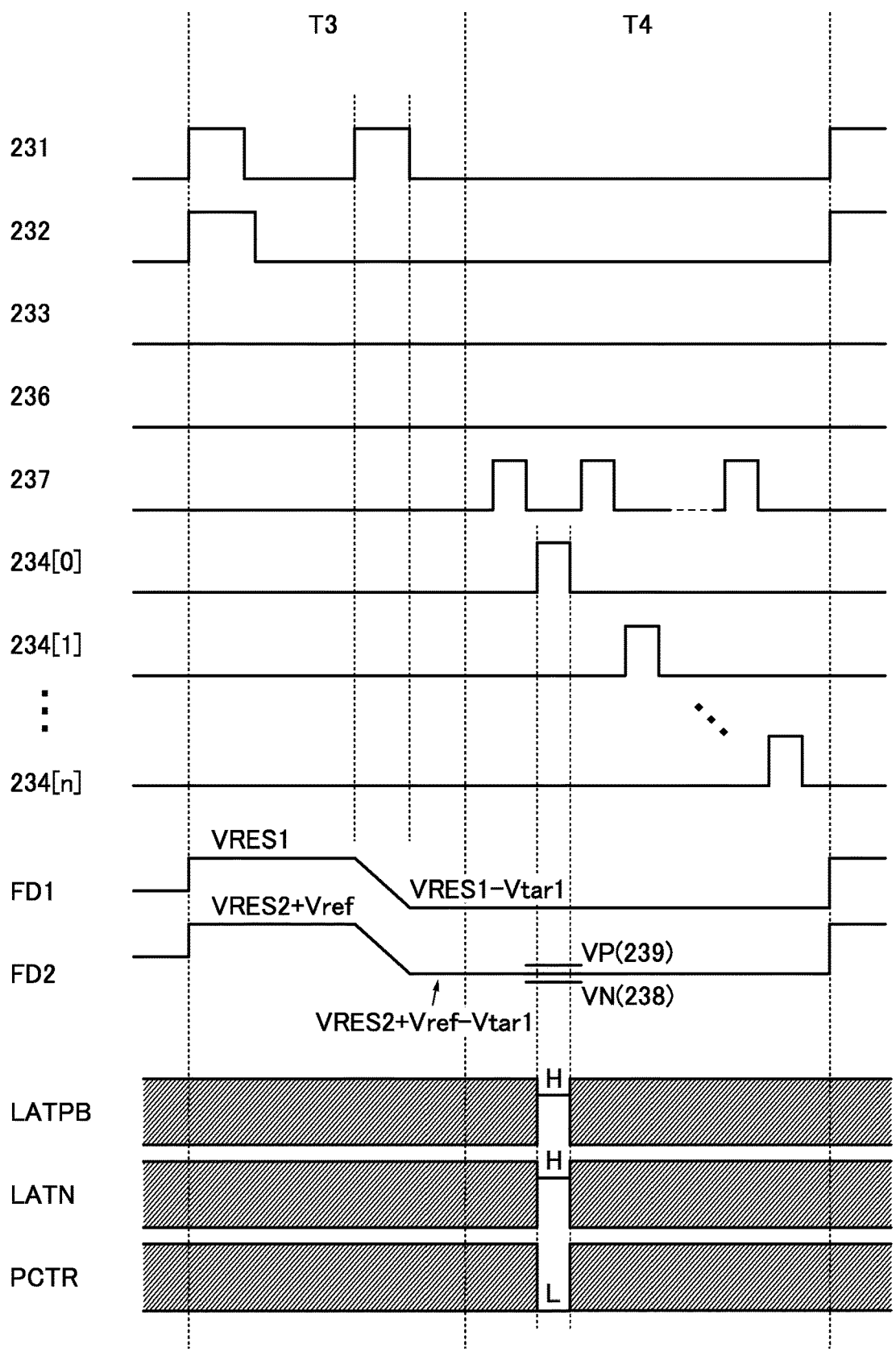
FIG. 6 is a timing chart showing pixel operation.

FIG. 6 is a timing chart showing the normal imaging operation and the difference calculation operation (Period T3), which follow the reading operation of the initial frame (Period T2 in FIG. 4), and difference determination operation and reading operation (Period T4).

In Period T3, the potential of the wiring 231 is set to "H", the potential of the wiring 232 is set to "H", the potential of the wiring 233 is set to "L", the potential of the wiring 236 is set to "L", the potential of the wiring 237 is set to "L", and the potentials of the wirings 234[0:n] are set to "L"; then, the transistors 102 and 103 are turned on and the potentials of the cathode of the photoelectric conversion device 101 and the node FD1 are reset to the potential of the wiring 122, "VRES1".

At this time, since the node FD2 is in a floating state, the amount of change in the potential of the node FD1 is added to the potential of the node FD2 by capacitive coupling of the capacitor 109. The amount of change in the potential of the node FD1 is "+Vref", and thus, the potential of the node FD2 becomes "VRES2+Vref".

Next, the potential of the wiring 231 is set to "L"; then, electric charge is accumulated in the cathode in response to the operation of the photoelectric conversion device 101. Furthermore, the potential of the wiring 232 is set to "L" to turn off the transistor 103, whereby the potential of the node FD1 is retained at "VRES1".

After a predetermined light exposure time elapsed, the potential of the wiring 231 is set to "H"; then, electric charge accumulated in the cathode of the photoelectric conversion device 101 is transferred to the node FD1. At this time, the potential of the node FD1 is lowered by a potential ("Vtar1") corresponding to the amount of the transferred electric charge, thereby being "VRES1–Vtar1". The amount of change in the potential of the node FD1 is added to the potential of the node FD2 by capacitive coupling of the capacitor 109. The amount of change in the potential of the node FD1 is "—Vtar1", and thus, the potential of the node FD2 becomes "VRES2+Vref–Vtar1".

Next, the potential of the wiring 231 is set to "L" to turn off the transistor 102, so that the potential of the node FD1 is retained at "VRES1–Vtar1". Furthermore, the potential of the node FD2 is retained at "VRES2+Vref–Vtar1".

The above is the normal imaging operation and the difference calculation operation. As a result of the normal imaging operation, "VRES1–Vtar1" is retained in the node FD1. As a result of the difference calculation operation, "VRES2+Vref−Vtar1" is retained in the node FD2. Although "VRES2" is a reset potential, it can be regarded as 0. Hence, "+Vref−Vtar1" is a difference itself between the data of the initial frame and data obtained in the normal imaging operation.

<Difference Determination Operation and Reading Operation (No Excess of Difference)>

Figure 7:
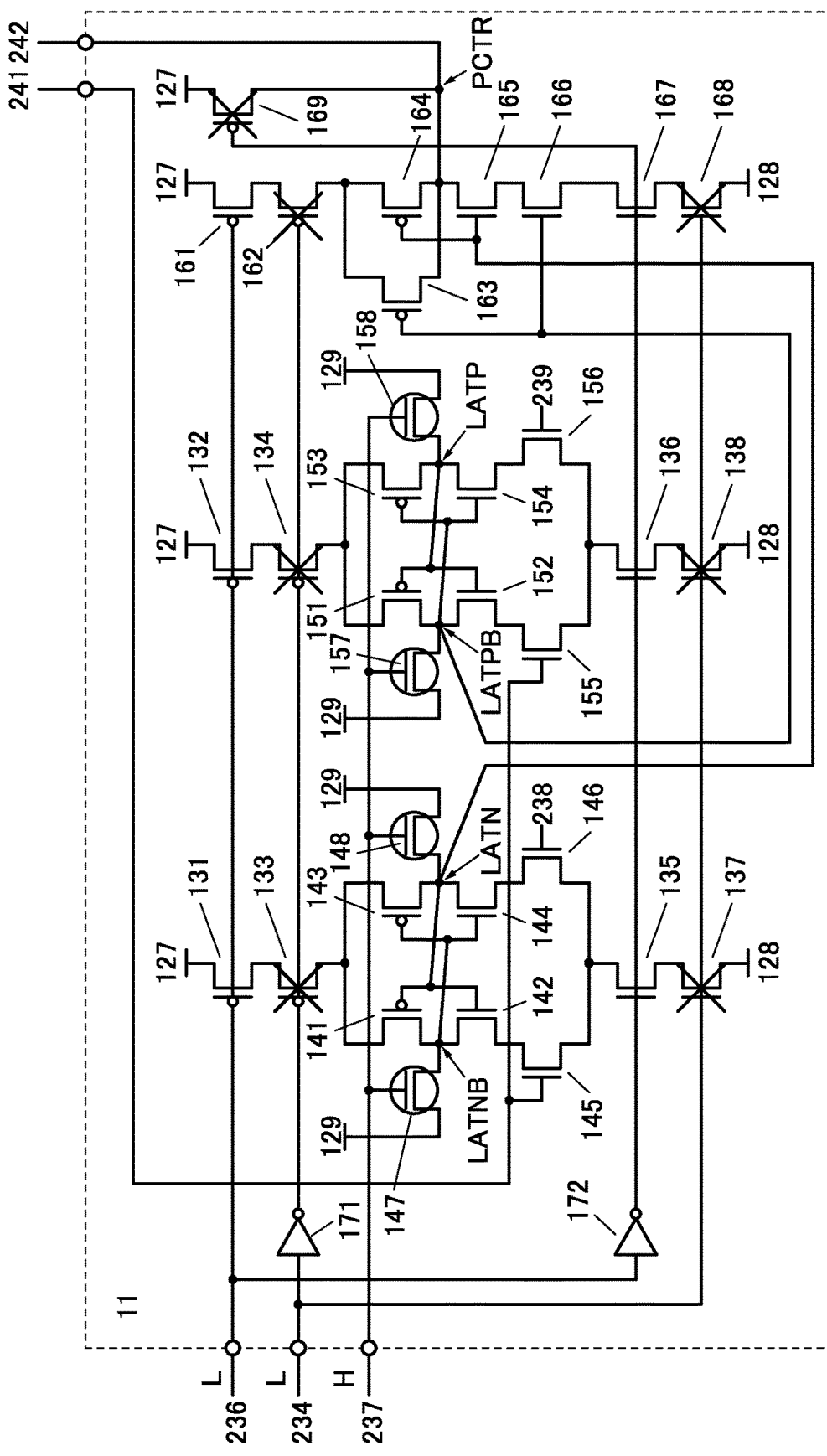
FIG. 7 is a diagram showing operation of the circuit 11.

In Period T4, the potential of the wiring 231 is set to "L", the potential of the wiring 232 is set to "L", the potential of the wiring 233 is set to "L", the potential of the wiring 236 is set to "L", the potential of the wiring 237 is set to "H", and the potentials of the wirings 234[0:n] are set to "L"; then, in the circuit 11, the transistors 147, 148, 157, and 158 are turned on as illustrated in FIG. 7 and the node LATNB, the node LATN, the node LATPB, and the node LATP are precharged to the potential of the wiring 129.

Figure 8:
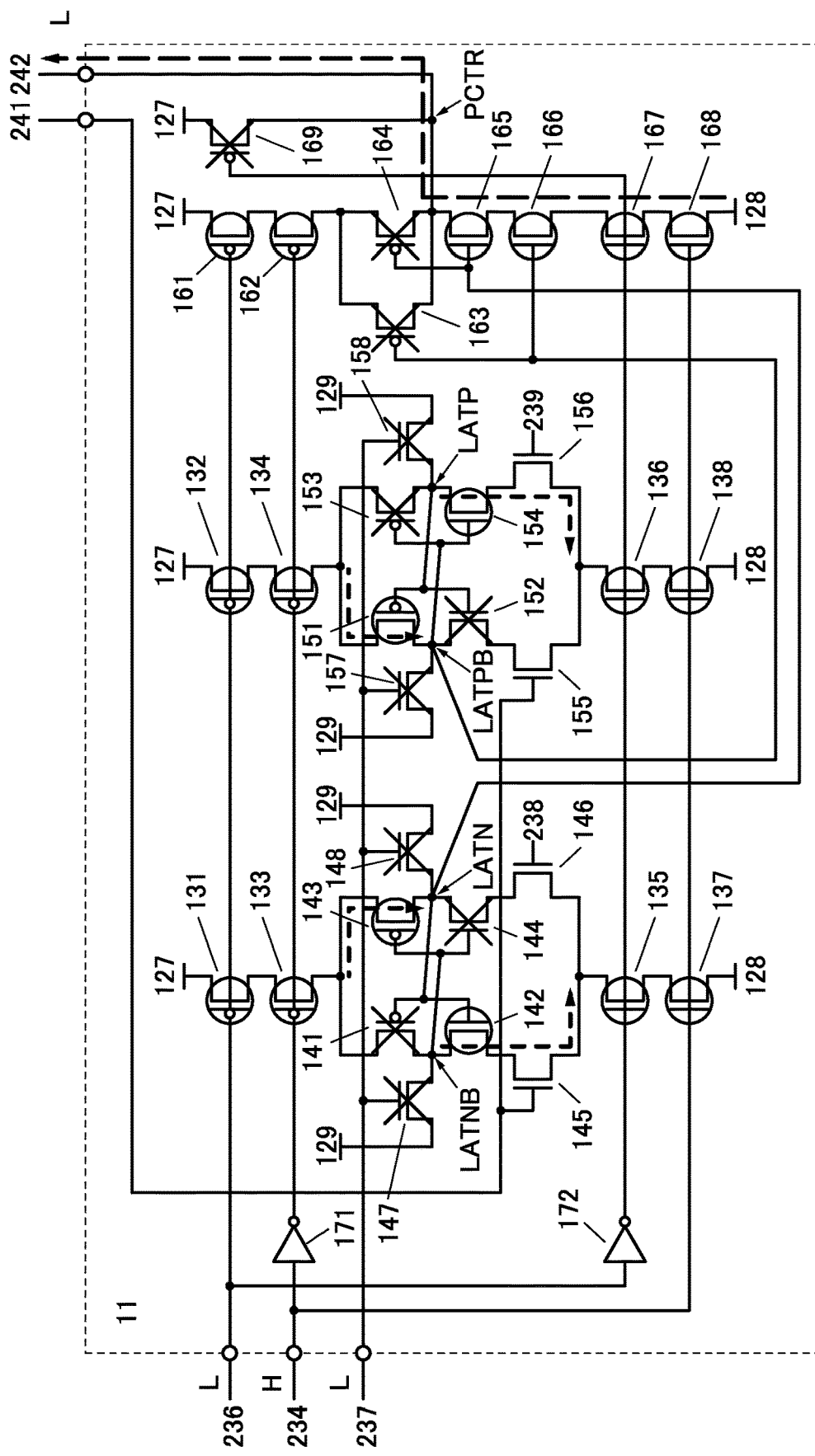
FIG. 8 is a diagram showing operation of the circuit 11.

Next, the potential of the wiring 237 is set to "L" and the potential of the wiring 234[0] is set to "H"; then, all the power switches are turned on as illustrated in FIG. 8 and current starts to flow in the sense amplifier. Here, the potential of the node FD2, "VRES2+Vref−Vtar1", is supplied to the gate of the transistor 145 and the gate of the transistor 155, the potential "VN" is supplied to the wiring 238, and the potential "VP" is supplied to the wiring 239.

At this time, when "VN"<"VRES2+Vref−Vtar1"<"VP" is satisfied as illustrated in FIG. 6, the precharge potential of the node LATNB is lowered prior to the precharge potential of the node LATN because the channel resistance of the transistor 145 is lower than that of the transistor 146. Thus, the transistors 142 and 143 are turned on and power source voltages are supplied from the wirings 127 and 128, whereby the potentials of the node LATNB and the node LATN are determined.

In addition, the precharge potential of the node LATP is lowered prior to the precharge potential of the node LATPB because the channel resistance of the transistor 156 is lower than that of the transistor 155. Thus, the transistors 151 and 154 are turned on and power source voltages are supplied from the wirings 127 and 128, whereby the potentials of the node LATP and the node LATPB are determined.

At this time, the potential of the node LATN and the potential of the node LATPB become "H"; thus, the transistors 165 and 166 are turned on and the transistors 163 and 164 are turned off, so that the potential of the output node PCTR becomes "L". Thus, since the transistor 106 is not turned on and no power source is supplied to the transistor 104 in the circuit 10, the data of the node FD1 is not output to the wiring 125 even when the transistor 105 is turned on. In other words, no data is output from the circuit 10 when "VN"<"VRES2+Vref−Vtar1"<"VP" is satisfied.

Here, a source follower bias transistor (not illustrated) is connected to the wiring 125, and thus, the potential of the wiring 125 is 0 V when no data is output from the transistor 104. A steady current flows in the bias transistor when data is read out. Hence, when the reading operation is not performed, electric power corresponding to the steady current can be reduced.

<Difference Determination Operation and Reading Operation (with Excess of Difference in Positive Side)>

The case where the difference exceeds the set voltage range is described with reference to the timing chart of FIG. 9. The description of Period T5 is omitted because in that period, the normal imaging operation and the difference calculation operation are performed as in Period T3. Note that the potential of the node FD1 in the normal imaging operation is "VRES1−Vtar2" (Vtar1>Vtar2), the potential of the node FD2 is "VRES1+Vref−Vtar2", and "VP"<"VRES1+Vref−Vtar2" is satisfied.

In period T6, the potential of the wiring 231 is set to "L", the potential of the wiring 232 is set to "L", the potential of the wiring 233 is set to "L", the potential of the wiring 236 is set to "L", the potential of the wiring 237 is set to "H", and the potentials of the wirings 234[0:n] are set to "L"; then, in the circuit 11, the transistors 147, 148, 157, and 158 are turned on as illustrated in FIG. 7 and the node LATNB, the node LATN, the node LATPB, and the node LATP are precharged to the potential of the wiring 129.

Figure 10:
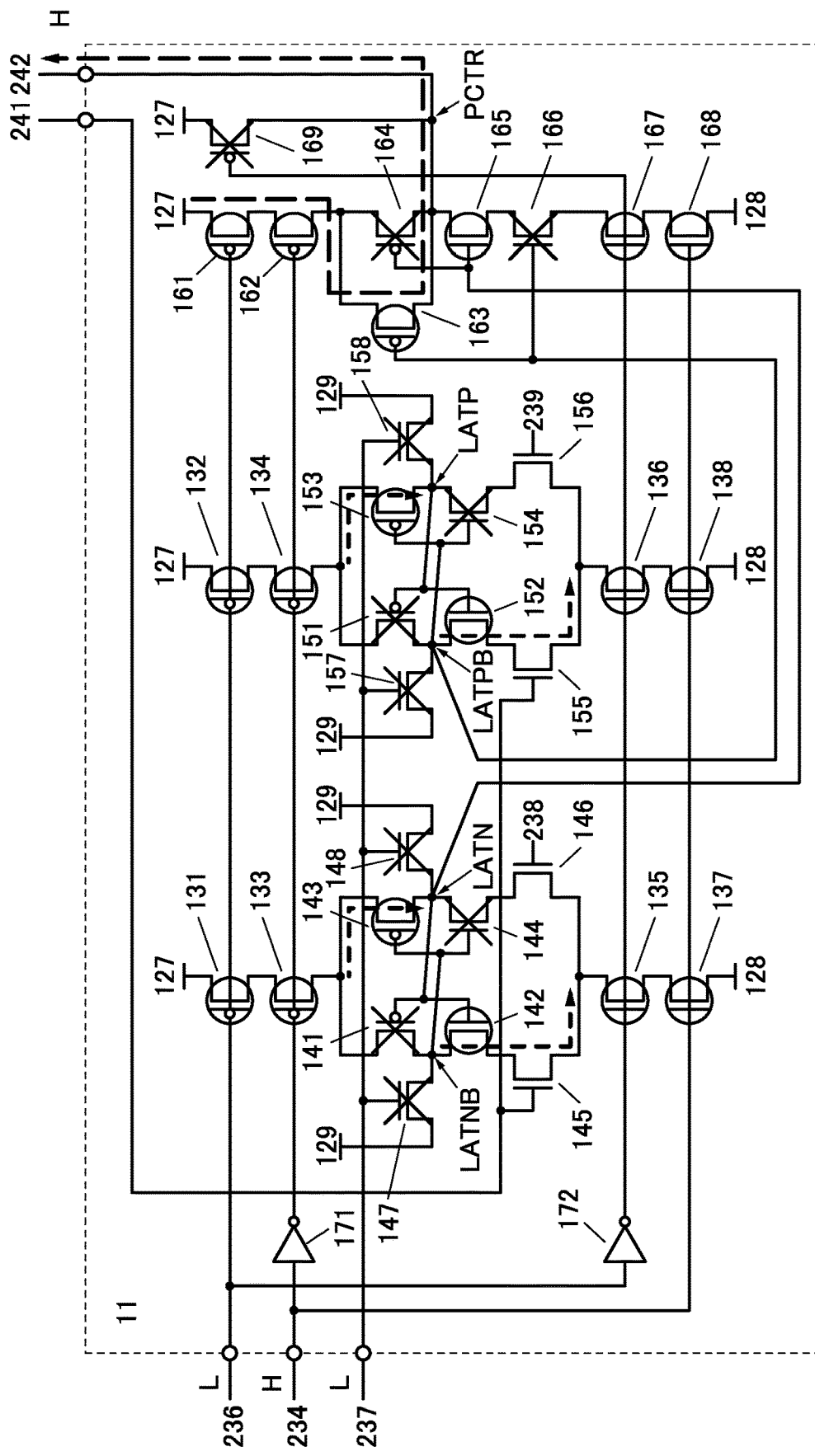
FIG. 10 is a diagram showing operation of the circuit 11.

Next, the potential of the wiring 237 is set to "L" and the potential of the wiring 234[0] is set to "H"; then, all the power switches are turned on as illustrated in FIG. 10 and current starts to flow in the sense amplifier. Here, the potential of the node FD2, "VRES2+Vref−Vtar2", is supplied to the gate of the transistor 145 and the gate of the transistor 155, the potential "VN" is supplied to the wiring 238, and the potential "VP" is supplied to the wiring 239.

Figure 9:
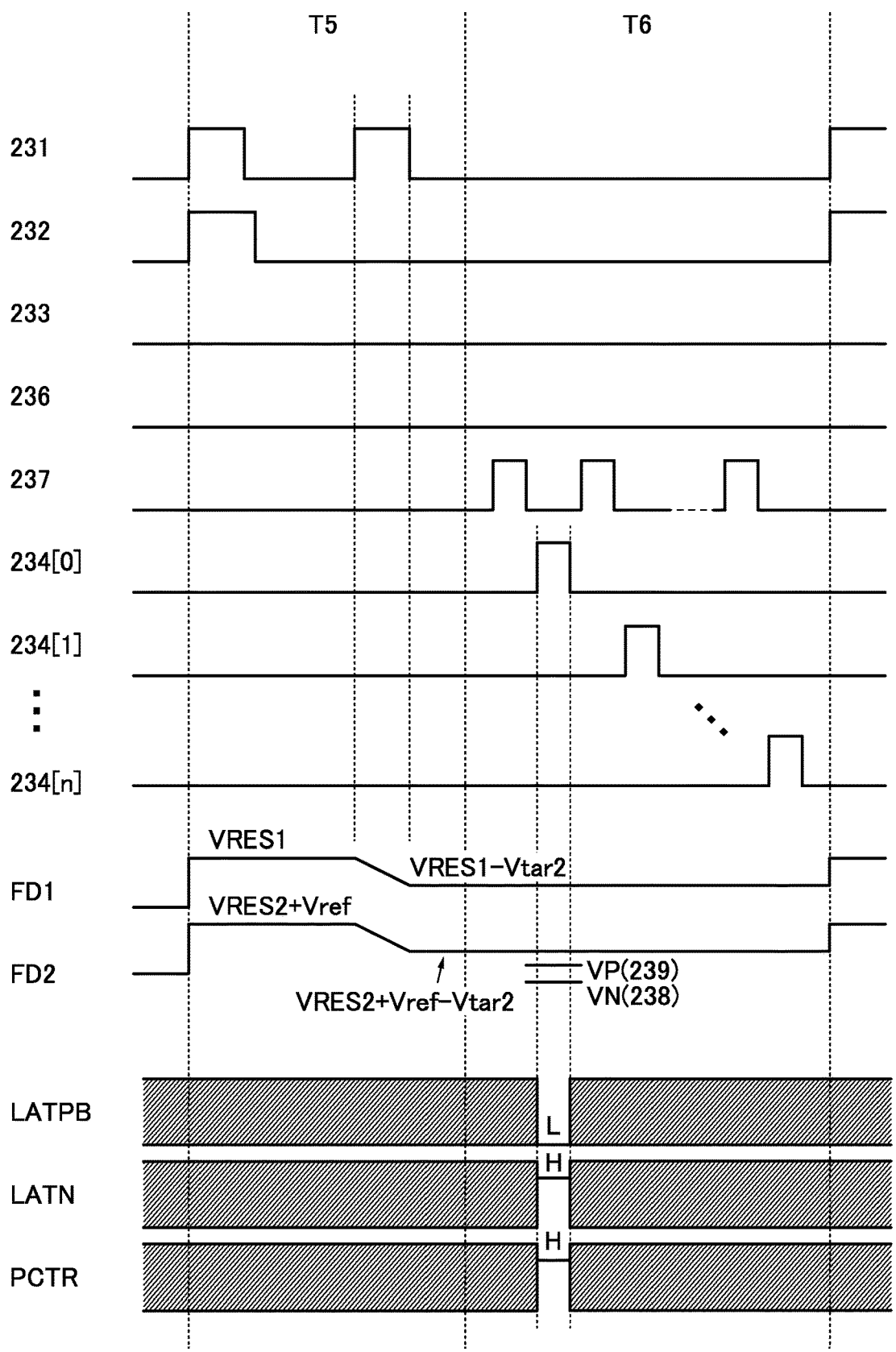
FIG. 9 is a timing chart showing pixel operation.

At this time, when "VN"<"VP"<"VRES2+Vref−Vtar2" is satisfied as illustrated in FIG. 9, the precharge potential of the node LATNB is lowered prior to the precharge potential of the node LATN because the channel resistance of the transistor 145 is lower than that of the transistor 146. Thus, the transistors 142 and 143 are turned on and power source voltages are supplied from the wirings 127 and 128, whereby the potentials of the node LATNB and the node LATN are determined.

In addition, the precharge potential of the node LATPB is lowered prior to the precharge potential of the node LATP because the channel resistance of the transistor 155 is lower than that of the transistor 156. Thus, the transistors 152 and 153 are turned on and power source voltages are supplied from the wirings 127 and 128, whereby the potentials of the node LATPB and the node LATP are determined.

At this time, the potential of the node LATN becomes "H" and the potential of the node LATPB becomes "L"; thus, the transistors 163 and 165 are turned on and the transistors 164 and 166 are turned off, so that the potential of the output node PCTR becomes "H". Thus, since the transistor 106 is turned on and a power source is supplied to the transistor 104 in the circuit 10, the data of the node FD1 is output to the wiring 125 when the transistor 105 is turned on. In other words, data is output from the circuit 10 when "VN"<"VP"<"VRES2+Vref−Vtar2" is satisfied.

The data output from the circuit 10 is stored in an address corresponding to the circuit 10 in the frame memory where the image data of the initial frame is stored. That is, data is rewritten only in the circuit 10 with the address where the data has been read out. Such operation can reduce writing power as compared with the case where data is rewritten in all the circuits 10.

Note that in the case where the reading operation is not performed, digital data corresponding to analog data of 0 V is generated in the A/D converter circuit. In the case where the digital data is generated, the writing operation to the frame memory is controlled not to be performed.

<Difference Determination Operation and Reading Operation (with Excess of Difference in Negative Side)>

The case where the difference is below the set voltage range is described with reference to the timing chart of FIG. 11. The description of Period T7 is omitted because in that period, the normal imaging operation and the difference calculation operation are performed as in Period T3. Note that the potential of the node FD1 in the normal imaging operation is "VRES1−Vtar3" ("Vtar3">"Vtar1"), the potential of the node FD2 is "VRES1+Vref−Vtar3", and "VRES1+Vref−Vtar3"<"VN"<"VP" is satisfied.

In period T8, the potential of the wiring 231 is set to "L", the potential of the wiring 232 is set to "L", the potential of the wiring 233 is set to "L", the potential of the wiring 236 is set to "L", the potential of the wiring 237 is set to "H", and the potentials of the wirings 234[0:n] are set to "L"; then, in the circuit 11, the transistors 147, 148, 157, and 158 are turned on as illustrated in FIG. 7 and the node LATNB, the node LATN, the node LATPB, and the node LATP are precharged to the potential of the wiring 129.

Figure 12:
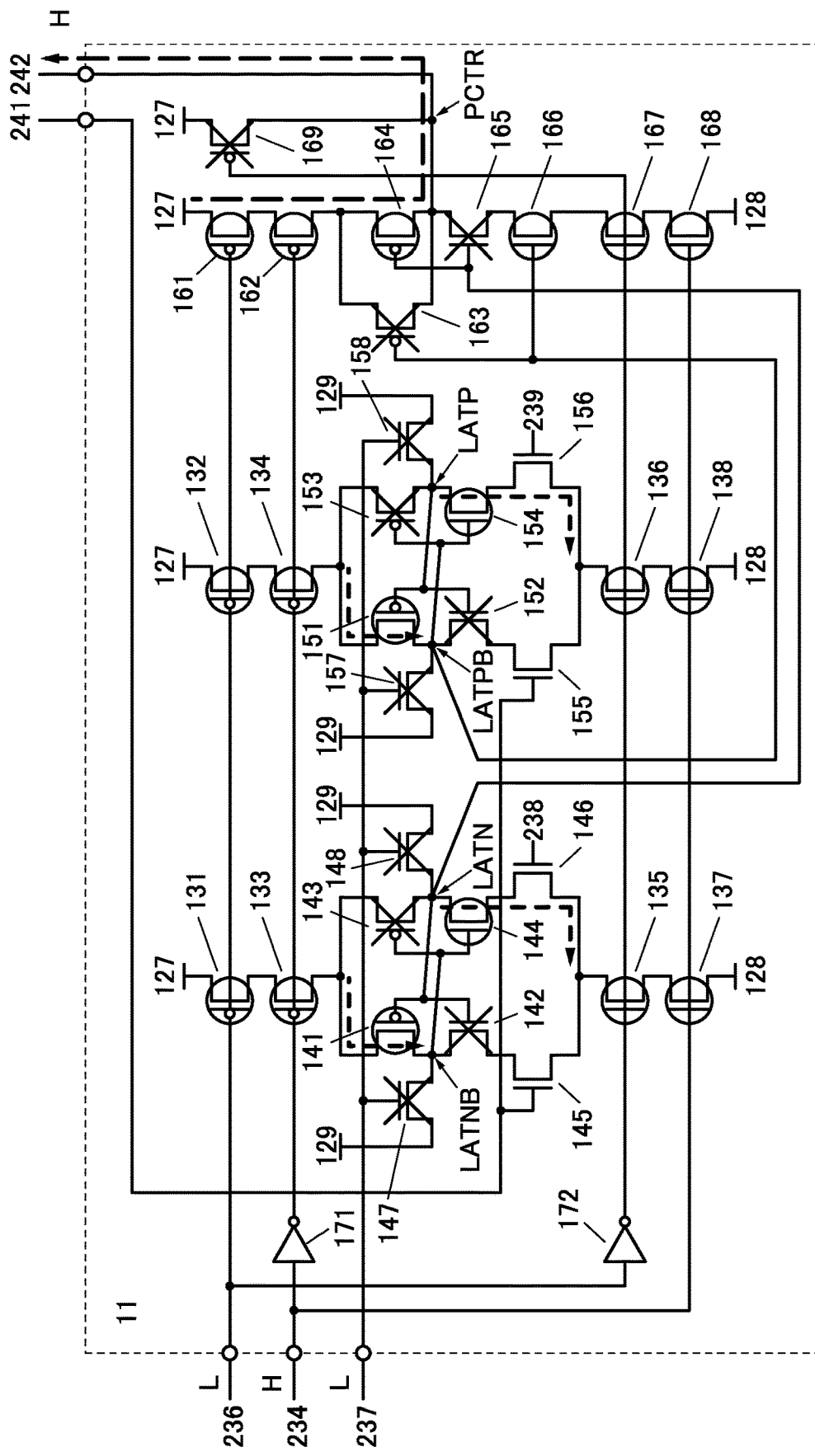
FIG. 12 is a diagram showing operation of the circuit 11.

Next, the potential of the wiring 237 is set to "L" and the potential of the wiring 234[0] is set to "H"; then, all the power switches are turned on as illustrated in FIG. 12 and current starts to flow in the sense amplifier. Here, the potential of the node FD2, "VRES2+Vref−Vtar3", is supplied to the gate of the transistor 145 and the gate of the transistor 155, the potential "VN" is supplied to the wiring 238, and the potential "VP" is supplied to the wiring 239.

Figure 11:
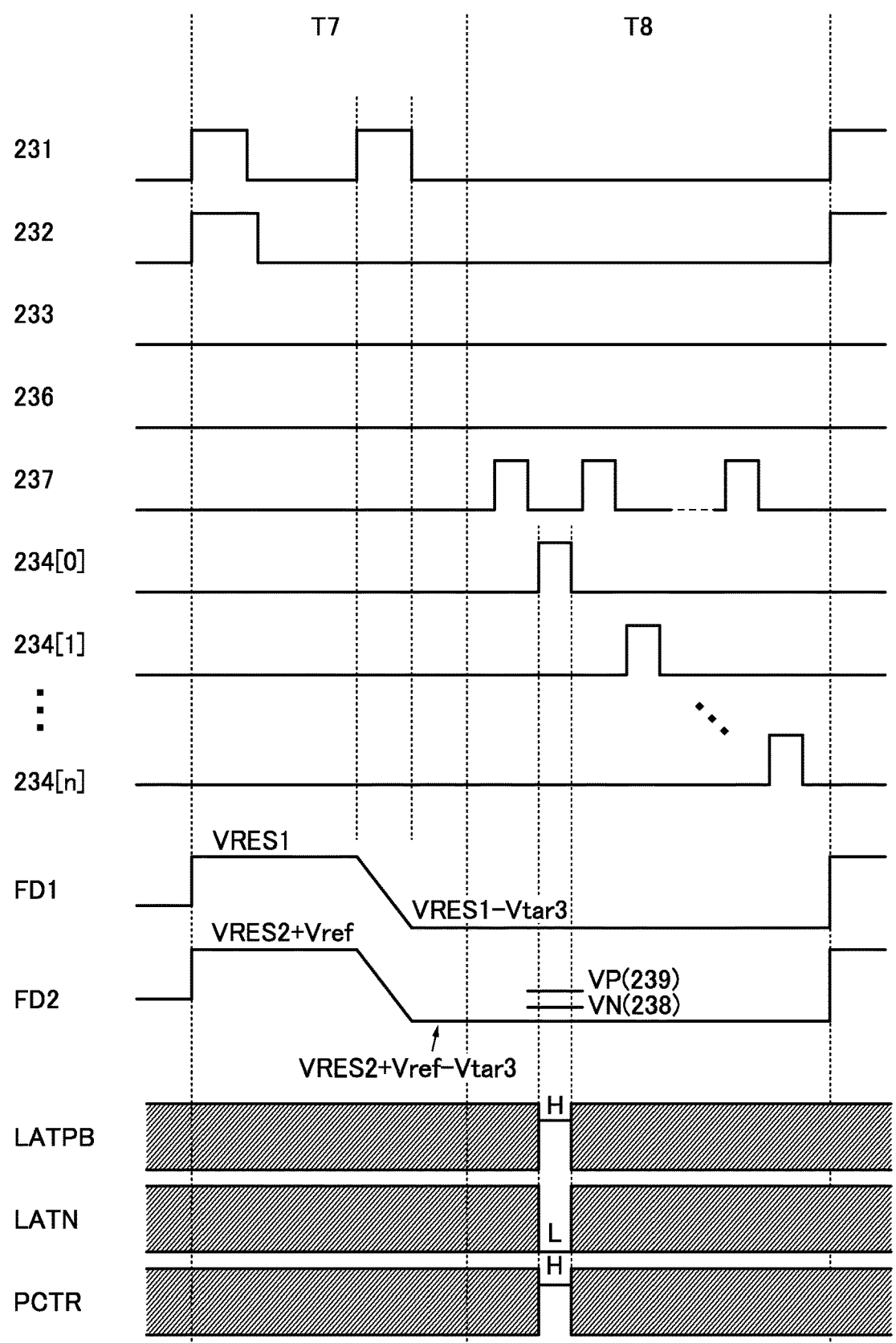
FIG. 11 is a timing chart showing pixel operation.

At this time, when "VRES2+Vref−Vtar3"<"VN"<"VP" is satisfied as illustrated in FIG. 11, the precharge potential of the node LATN is lowered prior to the precharge potential of the node LATNB because the channel resistance of the transistor 146 is lower than that of the transistor 145. Thus, the transistors 141 and 144 are turned on and power source voltages are supplied from the wirings 127 and 128, whereby the potentials of the node LATN and the node LATNB are determined.

In addition, the precharge potential of the node LATP is lowered prior to the precharge potential of the node LATPB because the channel resistance of the transistor 154 is lower than that of the transistor 155. Thus, the transistors 151 and 154 are turned on and power source voltages are supplied from the wirings 127 and 128, whereby the potentials of the node LATP and the node LATPB are determined.

At this time, the potential of the node LATN becomes "L" and the potential of the node LATPB becomes "H"; thus, the transistor 164 is turned on and the transistors 163 and 165 are turned off, so that the potential of the output node PCTR becomes "H". Thus, since the transistor 106 is turned on and a power source is supplied to the transistor 104 in the circuit 10, the data of the node FD1 is output to the wiring 125 when the transistor 105 is turned on. In other words, data is output from the circuit 10 when "VRES2+Vref−Vtar3"<"VN"<"VP" is satisfied.

As described above, the output from the circuit 10 can be controlled by the operation of the circuit 11. Since the difference between the data of the initial frame and the data of the subject frame becomes large as time passes, the data of the initial frame is preferably updated every predetermined period or every predetermined frame number. Note that the data of the initial frame may be updated every other frame.

Figure 13:
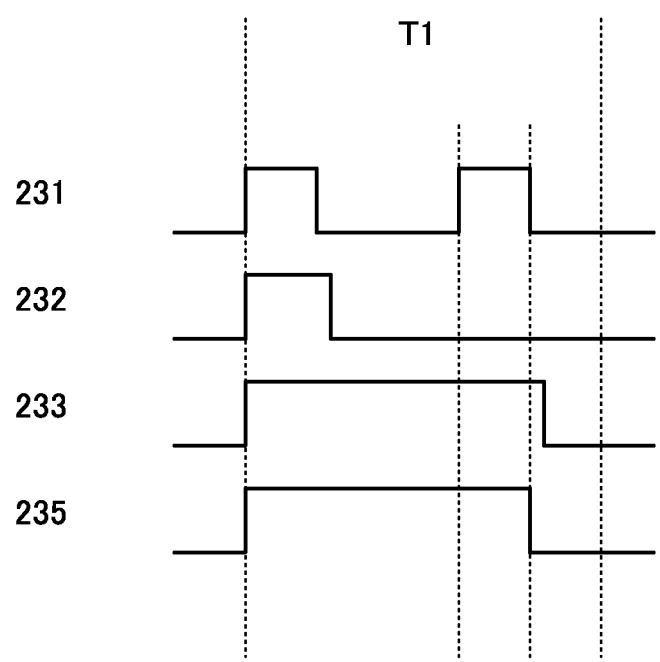
FIG. 13 is a timing chart showing pixel operation.

The timing charts of FIGS. 4, 6, 9, and 11 show the operation of the circuit 10 illustrated in FIG. 1; in the case where the circuit 10 has the structure of FIG. 2B, operation of supplying a potential to the wiring 235 is added as shown in FIG. 13. Although FIG. 13 shows the imaging operation of the initial frame (Period T1), the same applies to the normal imaging operation (Period T3 and the like).

<Structure of Imaging Device>

Figure 14:
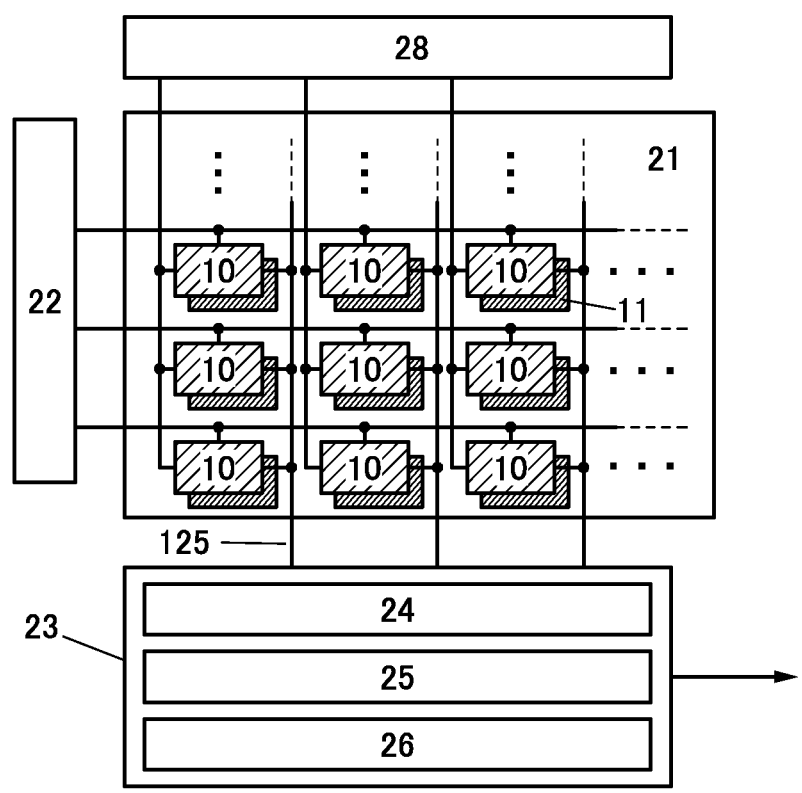
FIG. 14 is a block diagram showing an imaging device.

FIG. 14 is a block diagram illustrating the imaging device of one embodiment of the present invention. The imaging device includes a pixel array 21 including pixels (the circuits 10 and the circuits 11) arranged in a matrix, a circuit 22 (a row driver) having a function of selecting a row of the pixel array 21, a circuit 23 having a function of reading out data from the circuit 10, and a circuit 28 which supplies a power source potential. Note that in FIG. 14, the number of wirings connecting the components is reduced for simplicity. The circuits 22, 23, and 28 may each be two or more.

The circuit 23 can include a circuit 24 (a CDS circuit) for performing correlated double sampling processing on output data from the circuit 10, a circuit 25 (an A/D converter circuit or the like) having a function of converting analog data output from the circuit 24 into digital data, a circuit 26 (a column driver) having a function of selecting a column to which data is output, and the like. The circuit 10 and the circuit 23 are electrically connected to each other through the wiring 125.

Here, FIG. 14 illustrates a region where the circuit 10 and the circuit 11 overlap with each other. As described in detail later, the stacked structure of the circuit 10 and the circuit 11 easily reduces the pixel area to increase definition. In addition, when the circuit 11 is formed using a Si transistor and the circuit 10 is formed thereover using an OS transistor, the stacked structure can be formed without performing a bonding step and the like.

Figure 15A:
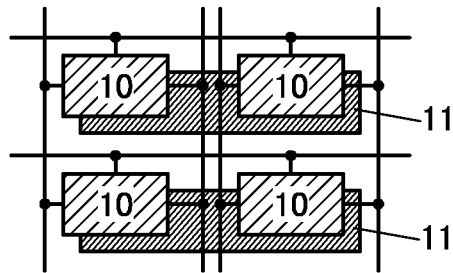
FIG. 15A to FIG. 15D are diagrams each showing a pixel structure.
Figure 15B:
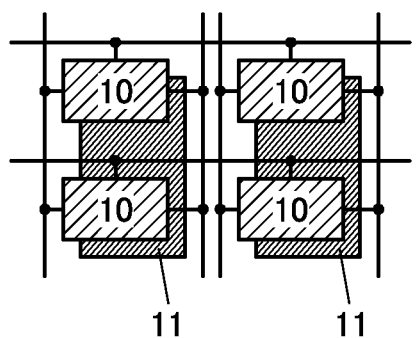
Figure 15C:
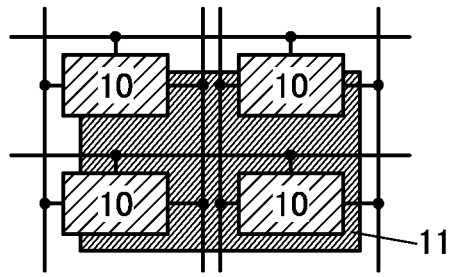
Figure 15D:
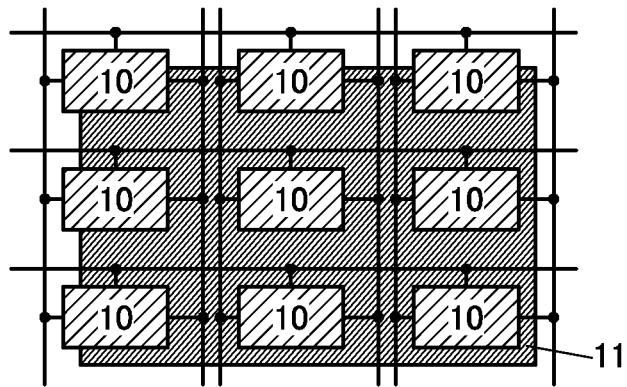

Note that the structure is not limited to the one where one circuit 10 and one circuit 11 overlap with each other. For example, it is possible to employ a structure where two circuits 10 arranged in a horizontal direction (a direction along a gate line) overlap with one circuit 11 as illustrated in FIG. 15A. It is also possible to employ a structure where two circuits 10 arranged in a vertical direction (a direction along a source line) overlap with one circuit 11 as illustrated in FIG. 15B. It is also possible to employ a structure where 2×2 circuits 10 arranged in the horizontal and the vertical direction overlap with one circuit 11 as illustrated in FIG. 15C. It is also possible to employ a structure where 3×3 circuits 10 arranged in the horizontal and the vertical direction overlap with one circuit 11 as illustrated in FIG. 15D. Alternatively, the number of circuits 10 overlapping with one circuit 11 may be greater than 3×3.

In such a structure where a plurality of circuits 10 are connected to one circuit 11, difference data of any one of the circuits 10 may be obtained and determined so that the other circuits 10 can be performed in a similar manner. An example thereof is explained below.

Figure 16:
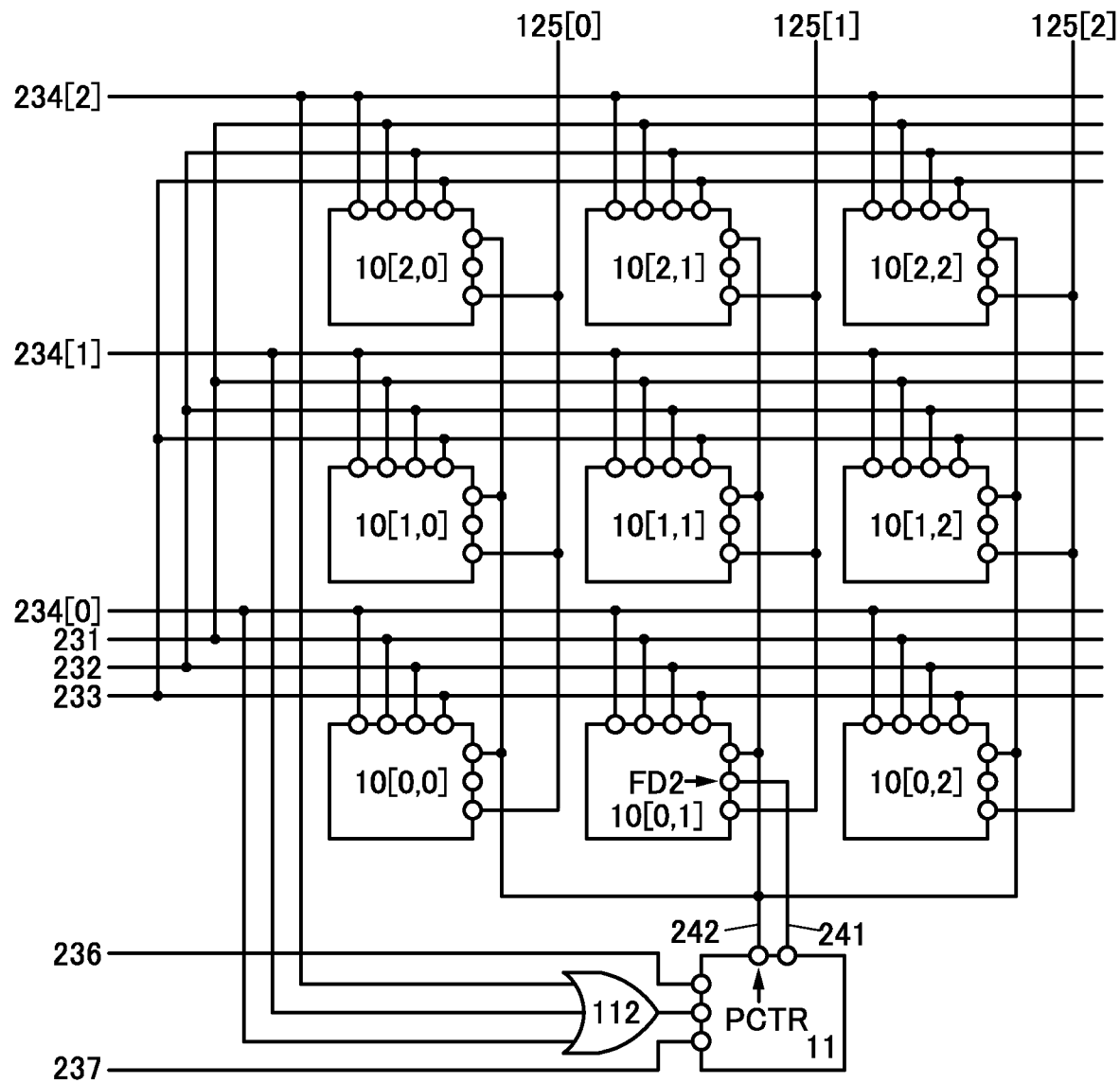
FIG. 16 is a block diagram showing a pixel structure.

FIG. 16 is a diagram showing a connection mode between 3×3 circuits 10 (circuits 10[0,0] to 10[2,2]) and one circuit 11. Three signal lines (the wirings 231, 232, and 233) in each row are electrically connected one another, whereby operation other than the reading operation is performed concurrently in the 3×3 circuits 10. Selection signal lines (the wirings 234[0:2]) in the respective rows are electrically connected to the circuit 11 through an OR circuit 112. Thus, the circuit 11 can operate in response to the selection operation of each row.

Here, the circuit 11 is electrically connected to the node FD2 of any one of the circuits 10. FIG. 16 illustrates an example in which the circuit 11 is connected to the node FD2 of the circuit 10[0,1], but the circuit 11 may be connected to the node FD2 of another circuit 10. The output node PCTR of the circuit 11 is electrically connected to all the circuits 10. Accordingly, whether reading from all the circuits 10 is performed is determined in accordance with the value of the node FD2 of one circuit 10. Such a structure allows a reduction in the number of circuits 11, thereby reducing electric power required for precharging the sense amplifier included in the circuit 11, and the like.

Figure 17:
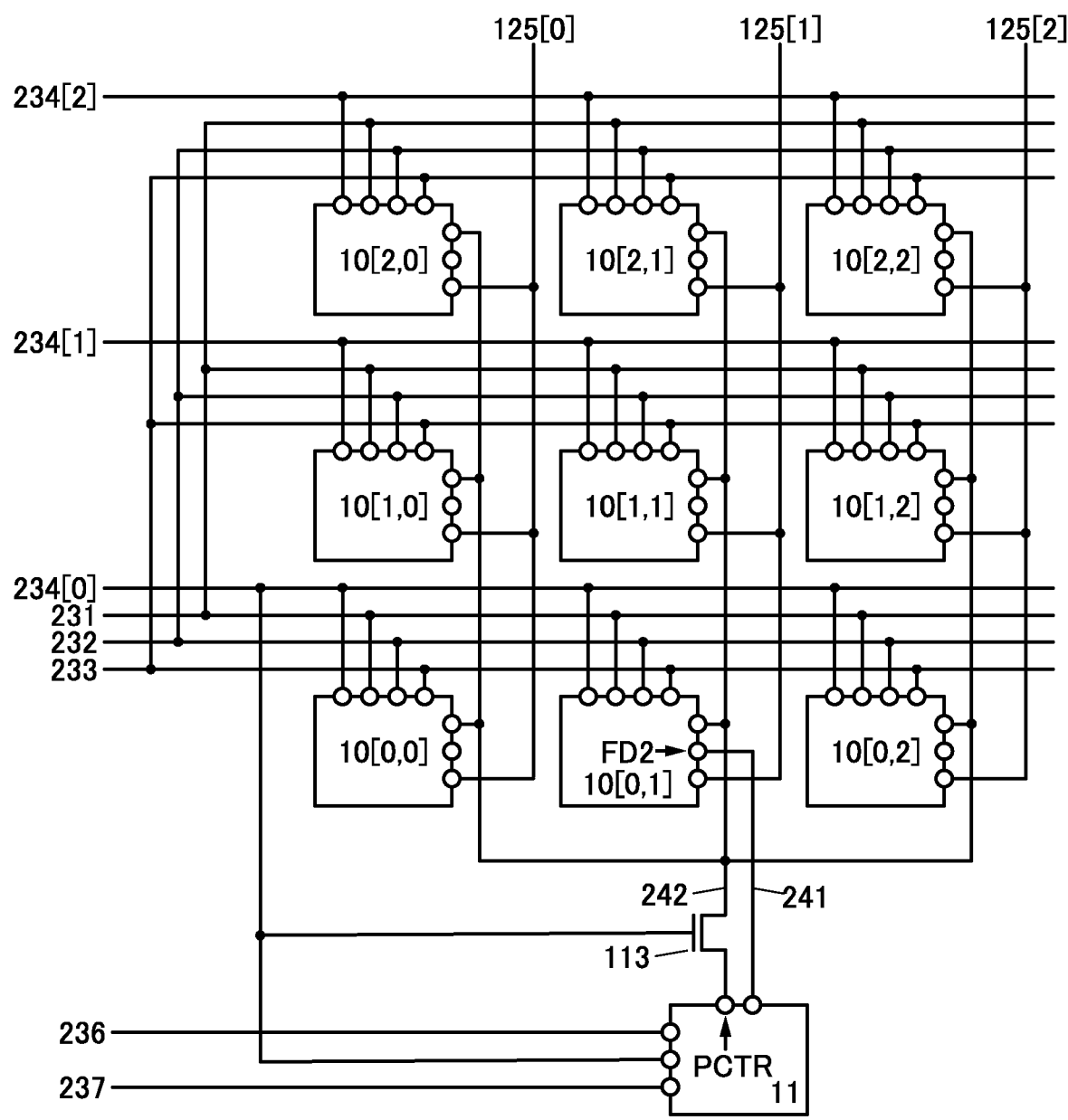
FIG. 17 is a block diagram showing a pixel structure.

In the structure of FIG. 17, a transistor 113 is added to and the OR circuit 112 is omitted from the structure of FIG. 16. The transistor 113 is provided between the output node PCTR of the circuit 11 and the wiring 242. In the structure of FIG. 17, the circuit 11 is connected to the node FD2 of the circuit 10 in a row that is read out first. A gate of the transistor 113 is connected to the wiring 234 connected to the circuits 10 in that row.

In the reading operation in the first row, the potential of the output node PCTR is determined in the circuit 11 and output to each circuit 10 when the transistor 113 is turned on. The transistor 113 is turned off in the reading operation in the next row, so that the potential of the wiring 242 is retained. Thus, the same operation (reading or no reading) can be performed in all the circuits 10.

With such a structure, the potential generated in the output node PCTR of the circuit 11 by the selection operation of the first row can be retained. This omits the necessity of generating the potential of the output node PCTR by the selection operation in the other rows, thereby reducing the number of times of operation of the circuit 11 and resulting in a reduction in power consumption.

Figure 18A:
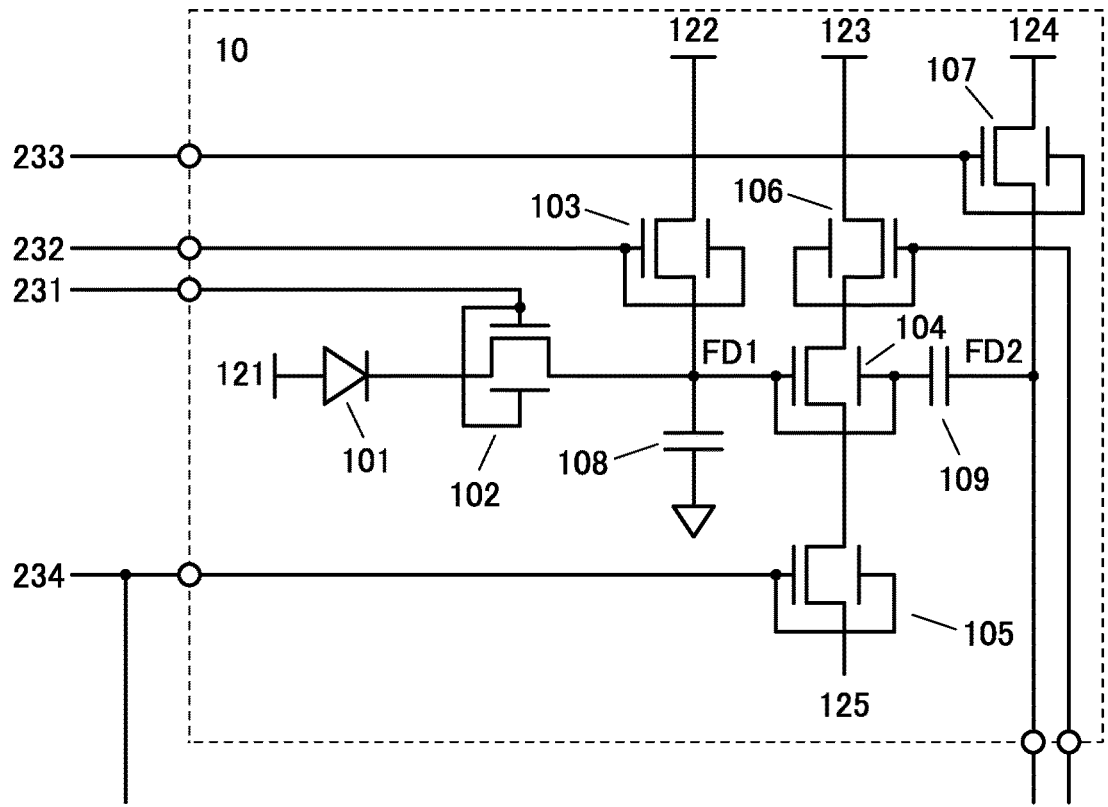
FIG. 18A and FIG. 18B are circuit diagrams each showing the circuit 10.
Figure 18B:
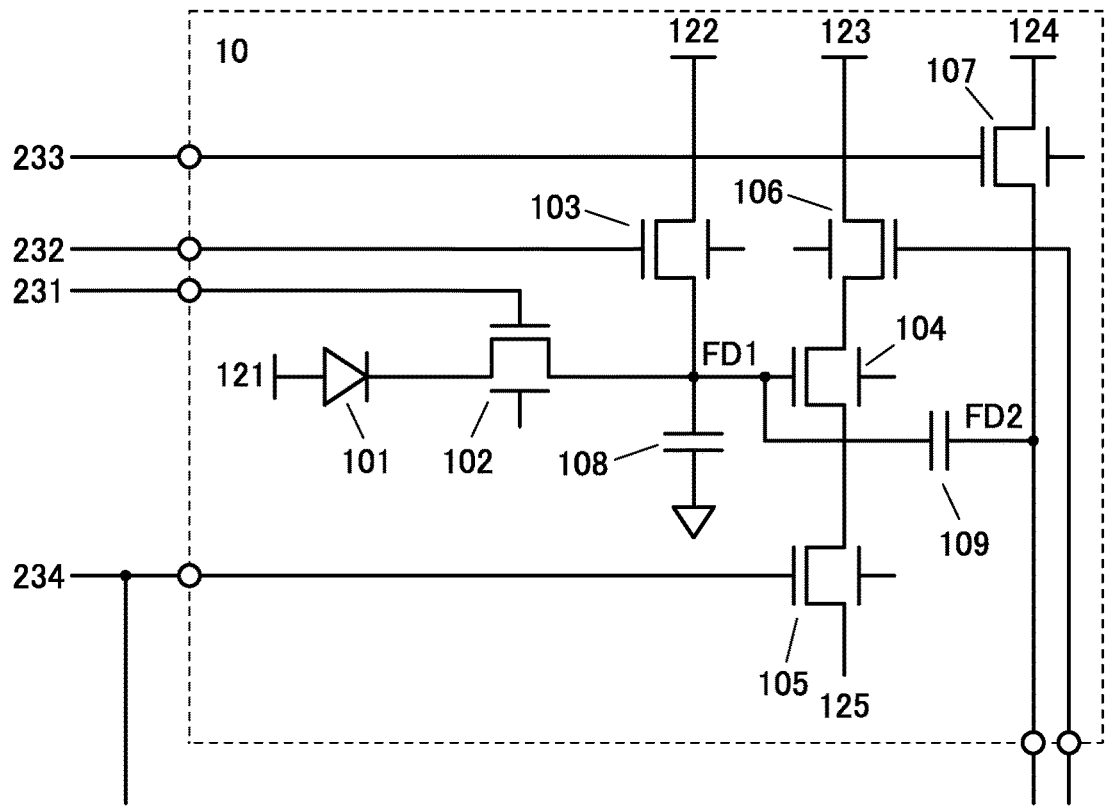
Figure 19A:
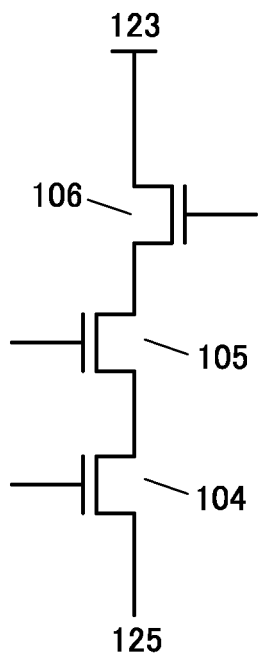
FIG. 19A to FIG. 19E are circuit diagrams each showing part of the circuit 10.
Figure 19B:
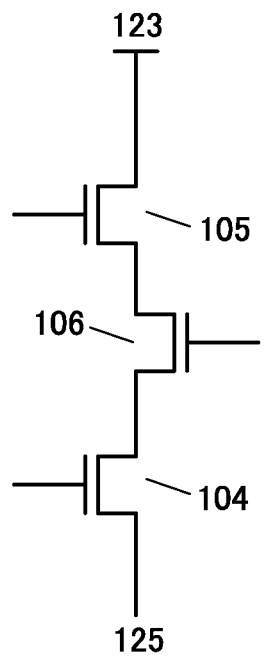
Figure 19C:
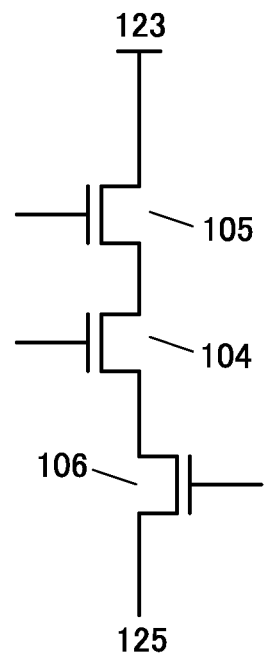
Figure 19D:
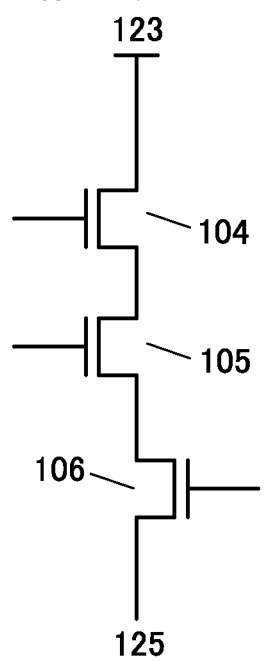
Figure 19E:
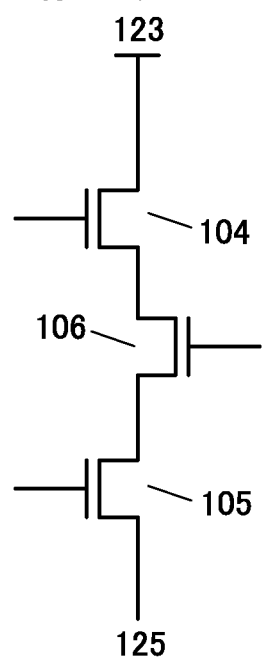

In one embodiment of the present invention, as illustrated in an example of FIG. 18A, a structure in which transistors are provided with back gates may be employed. FIG. 18A illustrates a structure in which back gates are electrically connected to front gates, which has an effect of increasing on-state currents. Alternatively, a structure in which a constant potential can be supplied to the back gates as illustrated in FIG. 18B may be employed. This structure enables control of the threshold voltages of the transistors. FIG. 18A and FIG. 18B may be mixed in one circuit. Furthermore, a transistor without a back gate may be provided.

In the circuit 10, the transistors 104, 105, and 106 connected in series between the wiring 123 and the wiring 125 may be arranged in the order as in the structure illustrated in FIG. 1 or in the structures illustrated in FIG. 19A to FIG. 19E.

Figure 20A:
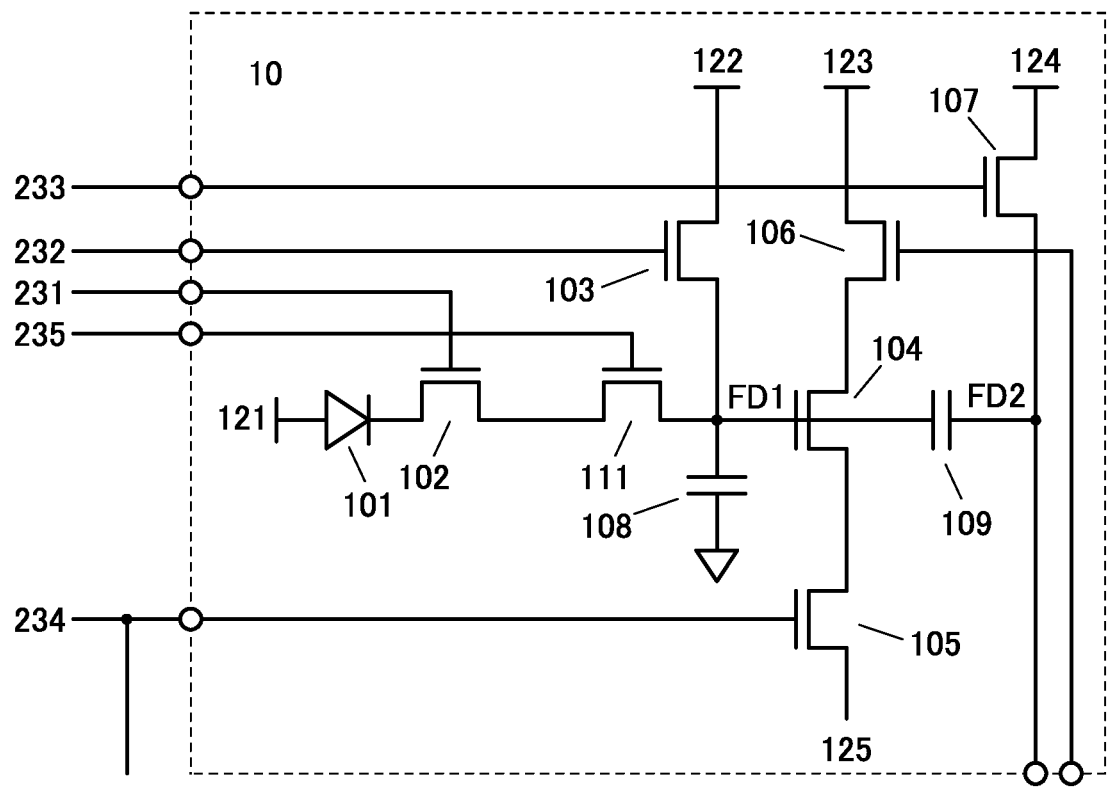
FIG. 20A and FIG. 20B are circuit diagrams each showing the circuit 10.
Figure 20B:
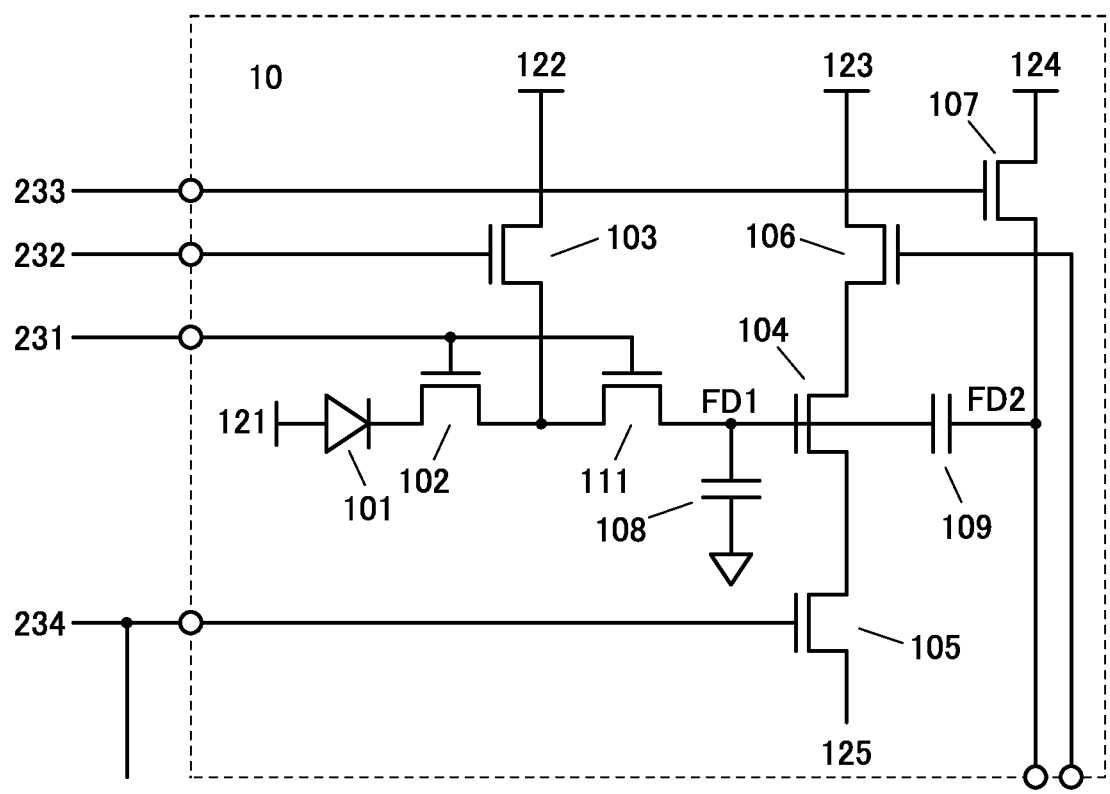

In the circuit 10 having the structure illustrated in FIG. 2B, as illustrated in FIG. 20A, the one of the source and the drain of the transistor 103 may be electrically connected to the other of the source and the drain of the transistor 111, the one electrode of the capacitor 108, and the gate of the transistor 104. Alternatively, as illustrated in FIG. 20B, the gate of the transistor 102 and the gate of the transistor 111 may be electrically connected to the wiring 231 and the wiring 235 may be omitted.

This embodiment can be combined with the description of the other embodiments as appropriate.

Embodiment 2

In this embodiment, structure examples and the like of an imaging device of one embodiment of the present invention will be described.

Structure Example

Figure 21A:
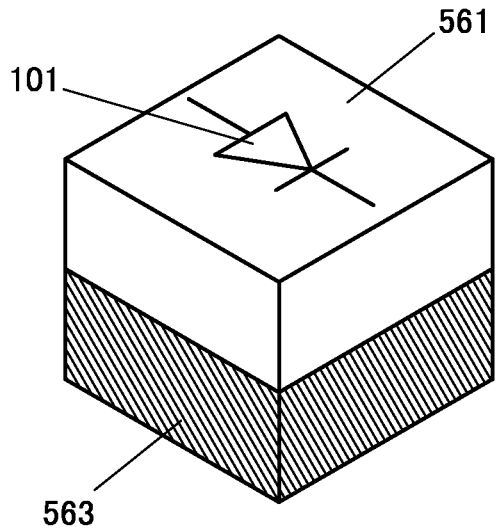
FIG. 21A to FIG. 21D are diagrams each showing a pixel structure of an imaging device.

FIG. 21A is a diagram illustrating a structure example of a pixel in the imaging device, and a stacked-layer structure of a layer 561 and a layer 563 can be employed.

Figure 22A:
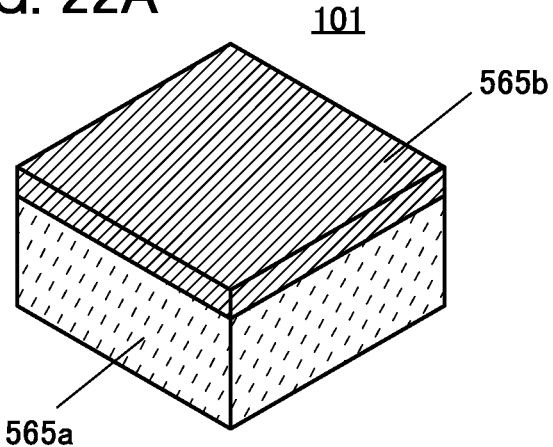
FIG. 22A to FIG. 22C are diagrams each showing a structure of a photoelectric conversion device.

The layer 561 includes the photoelectric conversion device 101. The photoelectric conversion device 101 can include a layer 565a and a layer 565b as illustrated in FIG. 22A. Note that a layer may be rephrased as a region, depending on the case.

The photoelectric conversion device 101 illustrated in FIG. 22A is a pn junction photodiode; for example, a p-type semiconductor can be used for the layer 565a, and an n-type semiconductor can be used for the layer 565b. Alternatively, an n-type semiconductor may be used for the layer 565a, and a p-type semiconductor may be used for the layer 565b.

The pn junction photodiode can be formed typically using single crystal silicon.

Figure 22B:
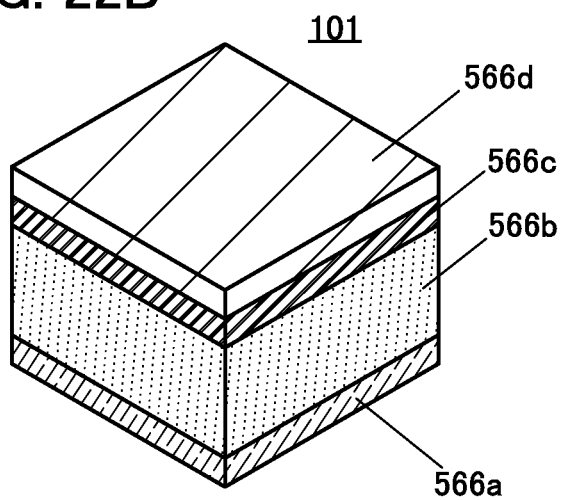

The photoelectric conversion device 101 included in the layer 561 may have a stack of a layer 566a, a layer 566b, a layer 566c, and a layer 566d as illustrated in FIG. 22B. The photoelectric conversion device 101 illustrated in FIG. 22B is an example of an avalanche photodiode; the layer 566a and the layer 566d correspond to electrodes, and the layers 566b and 566c correspond to a photoelectric conversion portion.

The layer 566a is preferably a low-resistance metal layer or the like. For example, aluminum, titanium, tungsten, tantalum, silver, or a stack thereof can be used.

A conductive layer having a high light-transmitting property with respect to visible light is preferably used as the layer 566d. For example, indium oxide, tin oxide, zinc oxide, indium tin oxide, gallium zinc oxide, indium gallium zinc oxide, graphene, or the like can be used. Note that a structure in which the layer 566d is omitted can also be employed.

A structure of a pn junction photodiode containing a selenium-based material in a photoelectric conversion layer can be used for the layers 566b and 566c of the photoelectric conversion portion, for example. A selenium-based material, which is a p-type semiconductor, is preferably used for the layer 566b, and gallium oxide or the like, which is an n-type semiconductor, is preferably used for the layer 566c.

A photoelectric conversion device containing a selenium-based material has characteristics of high external quantum efficiency with respect to visible light. In the photoelectric conversion device, electrons can be greatly amplified with respect to the amount of incident light by utilizing the avalanche multiplication. A selenium-based material has a high light-absorption coefficient and thus has advantages in production; for example, a photoelectric conversion layer can be formed using a thin film. A thin film of a selenium-based material can be formed by a vacuum evaporation method, a sputtering method, or the like.

As the selenium-based material, crystalline selenium such as single crystal selenium or polycrystalline selenium, amorphous selenium, a compound of copper, indium, and selenium (CIS), a compound of copper, indium, gallium, and selenium (CIGS), or the like can be used.

An n-type semiconductor is preferably formed using a material with a wide band gap and a light-transmitting property with respect to visible light. For example, zinc oxide, gallium oxide, indium oxide, tin oxide, or mixed oxide thereof can be used. In addition, these materials have a function of a hole-injection blocking layer, so that a dark current can be decreased.

Figure 22C:
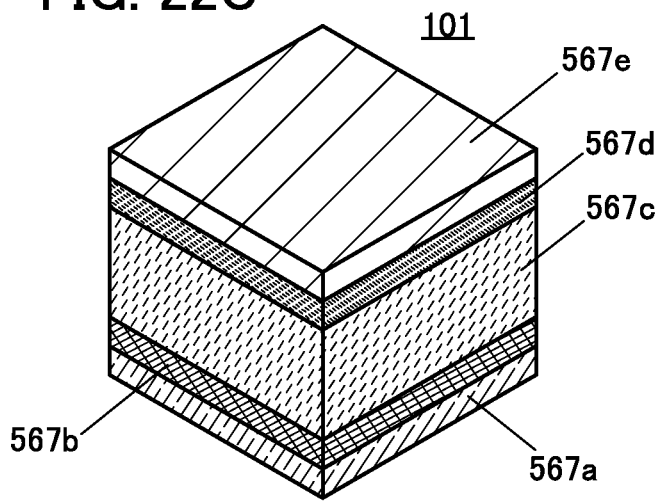

The photoelectric conversion device 101 included in the layer 561 may have a stack of a layer 567a, a layer 567b, a layer 567c, a layer 567d, and a layer 567e as illustrated in FIG. 22C. The photoelectric conversion device 101 illustrated in FIG. 22C is an example of an organic photoconductive film; the layer 567a is a lower electrode, the layer 567e is an upper electrode having a light-transmitting property, and the layers 567b, 567c, and 567d correspond to a photoelectric conversion portion.

One of the layers 567b and 567d in the photoelectric conversion portion can be a hole-transport layer and the other can be an electron-transport layer. The layer 567c can be a photoelectric conversion layer.

For the hole-transport layer, molybdenum oxide can be used, for example. For the electron-transport layer, fullerene such as $C_{60}$ or $C_{70}$, or a derivative thereof can be used, for example.

As the photoelectric conversion layer, a mixed layer of an n-type organic semiconductor and a p-type organic semiconductor (bulk heterojunction structure) can be used.

For the layer 563 illustrated in FIG. 21A, a silicon substrate can be used, for example. The silicon substrate includes a Si transistor or the like. With the use of the Si transistor, a pixel circuit can be formed. In addition, a circuit for driving the pixel circuit, a reading circuit of the pixel circuit, an image processing circuit, a neural network, a communication circuit, or the like can also be formed.

Furthermore, a memory circuit such as a DRAM (Dynamic Random Access Memory), a CPU (Central Processing Unit), an MCU (Micro Controller Unit), or the like may be formed. Note that in this embodiment, the circuit 10 and the circuit 11 described in Embodiment 1 are each referred to as a pixel circuit and the other circuits are each referred to as a functional circuit.

For example, some or all of the transistors included in the circuit 10, the circuit 11, and the functional circuits (the circuits 22, 23, 28, and the like) can be provided in the layer 563.

Figure 21B:
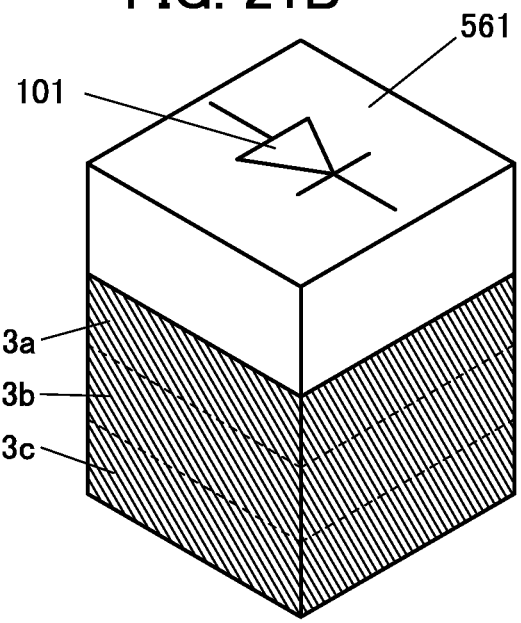

The layer 563 may be a stack of a plurality of layers as illustrated in FIG. 21B. Although FIG. 21B illustrates an example in which the layer 563 is a stack of three layers 563a, 563b, and 563c, it may be a stack of two layers. Alternatively, the layer 563 may be a stack of four or more layers. These layers can be stacked by a bonding process, for example. With this structure, the pixel circuits and the functional circuits can be dispersed in a plurality of layers; thus, the pixel circuits and the functional circuits can be provided to overlap with each other, which enables a small-sized and high-performance imaging device to be manufactured.

Figure 21C:
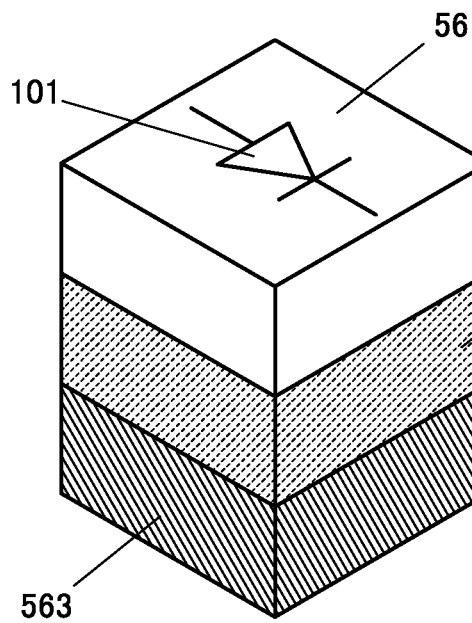

Furthermore, the pixel may have a stacked-layer structure of the layer 561, a layer 562, and the layer 563 as illustrated in FIG. 21C.

The layer 562 can include OS transistors. For example, the circuit 10 can be formed in the layer 562 and the circuit 11 can be formed in the layer 563. One or more of the functional circuits described above may be formed using OS transistors. Alternatively, one or more of the functional circuits may be formed using Si transistors included in the layer 563 and the OS transistors included in the layer 562. Alternatively, the layer 563 may be a support substrate such as a glass substrate, and the pixel circuits and the functional circuits may be formed using the OS transistors included in the layer 562.

A normally-off CPU (also referred to as "Noff-CPU") can be formed using an OS transistor and a Si transistor, for example. Note that the Noff-CPU is an integrated circuit including a normally-off transistor, which is in a non-conduction state (also referred to as an off state) even when a gate voltage is 0 V.

In the Noff-CPU, power supply to a circuit that does not need to operate can be stopped so that the circuit can be brought into a standby state. The circuit brought into the standby state because of the stop of power supply does not consume power. Thus, the power usage of the Noff-CPU can be minimized. Moreover, the Noff-CPU can retain data necessary for operation, such as setting conditions, for a long time even when power supply is stopped. The return from the standby state requires only restart of power supply to the circuit and does not require rewriting of setting conditions or the like. In other words, high-speed return from the standby state is possible. As described here, the Noff-CPU can have a reduced power consumption without a significant decrease in operation speed.

Figure 21D:
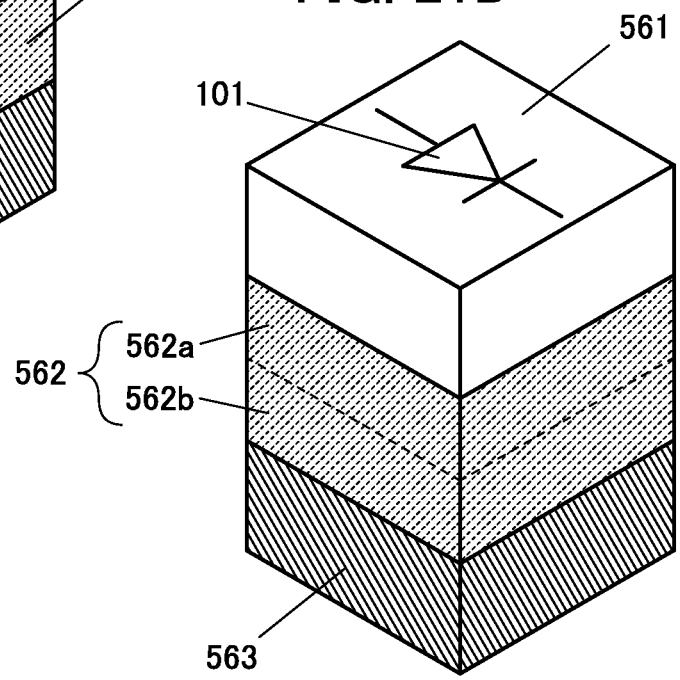

The layer 562 may be a stack of a plurality of layers as illustrated in FIG. 21D. Although FIG. 21D illustrates an example in which the layer 562 is a stack of two layers 562a and 562b, it may be a stack of three or more layers. These layers can be formed to be stacked over the layer 563, for example. Alternatively, the layer 562 may be formed by bonding a layer formed over the layer 563 and a layer formed over the layer 561.

As a semiconductor material used for an OS transistor, a metal oxide whose energy gap is greater than or equal to 2 eV, preferably greater than or equal to 2.5 eV, further preferably greater than or equal to 3 eV can be used. A typical example thereof is an oxide semiconductor containing indium, and a CAAC-OS, a CAC-OS, each of which will be described later, or the like can be used, for example. A CAAC-OS has a crystal structure including stable atoms and is suitable for a transistor that is required to have high reliability, and the like. A CAC-OS has high mobility and is suitable for a transistor that operates at high speed, and the like.

In an OS transistor, a semiconductor layer has a large energy gap, and thus the OS transistor has an extremely low off-state current of several yoctoamperes per micrometer (current per micrometer of a channel width). An OS transistor has features such that impact ionization, an avalanche breakdown, a short-channel effect, or the like does not occur, which are different from those of a Si transistor, and thus enables formation of a circuit having high withstand voltage and high reliability. Moreover, variations in electrical characteristics due to crystallinity unevenness, which are caused in the Si transistor, are less likely to occur in OS transistors.

A semiconductor layer in an OS transistor can be, for example, a film represented by an In-M-Zn-based oxide that contains indium, zinc, and M (one or more selected from metals such as aluminum, titanium, gallium, germanium, yttrium, zirconium, lanthanum, cerium, tin, neodymium, and hafnium). The In-M-Zn-based oxide can be formed by a sputtering method, an ALD (Atomic layer deposition) method, or an MOCVD (Metal organic chemical vapor deposition) method, for example.

In the case where the In-M-Zn-based oxide is formed by a sputtering method, the atomic ratio of metal elements in a sputtering target preferably satisfies In M and Zn M. The atomic ratio of metal elements in such a sputtering target is preferably In:M:Zn=1:1:1, In:M:Zn=1:1:1.2, In:M:Zn=3:1:2, In:M:Zn=4:2:3, In:M:Zn=4:2:4.1, In:M:Zn=5:1:3, In:M:Zn=5:1:6, In:M:Zn=5:1:7, In:M:Zn=5:1:8, In:M:Zn=10:1:3, or the like. Note that the atomic ratio in the formed semiconductor layer may vary from the above atomic ratio of metal elements in the sputtering target in a range of ±40%.

An oxide semiconductor with low carrier density is used for the semiconductor layer. For example, for the semiconductor layer, an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. The oxide semiconductor has a low density of defect states and can thus be referred to as an oxide semiconductor having stable characteristics.

Note that the composition is not limited to those described above, and a material having the appropriate composition may be used depending on required semiconductor characteristics and electrical characteristics of the transistor (e.g., field-effect mobility and threshold voltage). To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon, which is one of elements belonging to Group 14, is contained in the oxide semiconductor contained in the semiconductor layer, oxygen vacancies are increased, and the semiconductor layer becomes n-type. Thus, the concentration of silicon or carbon (the concentration obtained by secondary ion mass spectrometry) in the semiconductor layer is set to lower than or equal to $2\times10^{18}$ atoms/cm$^3$, preferably lower than or equal to $2\times10^{17}$ atoms/cm$^3$.

Alkali metal and alkaline earth metal might generate carriers when bonded to an oxide semiconductor, in which case the off-state current of the transistor might be increased. Therefore, the concentration of alkali metal or alkaline earth metal in the semiconductor layer (the concentration obtained by secondary ion mass spectrometry) is set to lower than or equal to $1\times10^{18}$ atoms/cm$^3$, preferably lower than or equal to $2\times10^{16}$ atoms/cm$^3$.

When nitrogen is contained in the oxide semiconductor contained in the semiconductor layer, electrons serving as carriers are generated and the carrier density increases, so that the semiconductor layer easily becomes n-type. As a result, a transistor using an oxide semiconductor that contains nitrogen is likely to have normally-on characteristics. Hence, the nitrogen concentration (the concentration obtained by secondary ion mass spectrometry) in the semiconductor layer is preferably set to lower than or equal to $5\times10^{18}$ atoms/cm$^3$.

When hydrogen is contained in the oxide semiconductor contained in the semiconductor layer, hydrogen reacts with oxygen bonded to a metal atom to be water, and thus sometimes forms oxygen vacancies in the oxide semiconductor. When the channel formation region in the oxide semiconductor includes oxygen vacancies, the transistor sometimes has normally-on characteristics. In some cases, a defect in which hydrogen enters oxygen vacancies functions as a donor and generates electrons serving as carriers. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen enters oxygen vacancies can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration of the oxide semiconductor, which is obtained by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with sufficiently reduced impurities such as hydrogen is used for a channel formation region of a transistor, stable electrical characteristics can be given.

The semiconductor layer may have a non-single-crystal structure, for example. Examples of the non-single-crystal structure include CAAC-OS (C-Axis Aligned Crystalline Oxide Semiconductor) including a c-axis aligned crystal, a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Alternatively, an oxide film having an amorphous structure has, for example, a completely amorphous structure and no crystal part.

Note that the semiconductor layer may be a mixed film including two or more of a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more of the above regions in some cases.

The composition of a CAC (Cloud-Aligned Composite)-OS, which is one embodiment of a non-single-crystal semiconductor layer, will be described below.

A CAC-OS refers to one composition of a material in which elements constituting an oxide semiconductor are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in an oxide semiconductor is hereinafter referred to as a mosaic pattern or a patch-like pattern.

Note that an oxide semiconductor preferably contains at least indium. It is particularly preferable that indium and zinc be contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (hereinafter, InO$_{X1}$ (X1 is a real number greater than 0)) or indium zinc oxide (hereinafter, In$_{X2}$Zn$_{Y2}$O$_{Z2}$ (X2, Y2, and Z2 are real numbers greater than 0)), and gallium oxide (hereinafter, GaO$_{X3}$ (X3 is a real number greater than 0)) or gallium zinc oxide (hereinafter, Ga$_{X4}$Zn$_{Y4}$O$_{Z4}$ (X4, Y4, and Z4 are real numbers greater than 0)), and a mosaic pattern is formed. Then, InO$_{X1}$ or In$_{X2}$Zn$_{Y2}$O$_{Z2}$ forming the mosaic pattern is evenly distributed in the film (this composition is hereinafter also referred to as a cloud-like composition).

That is, the CAC-OS is a composite oxide semiconductor having a composition in which a region including GaO$_{X3}$ as a main component and a region including In$_{X2}$Zn$_{Y2}$O$_{Z2}$ or $InO_{X1}$ as a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (ml is a natural number) or $In_{(1+x0)}Ga_{(1-x0)}O_3(ZnO)_{m0}$ (−1≤x0≤1; m0 is a given number).

The above crystalline compound has a single crystal structure, a polycrystalline structure, or a CAAC structure. Note that the CAAC structure is a crystal structure in which a plurality of IGZO nanocrystals have c-axis alignment and are connected in the a-b plane without alignment.

On the other hand, the CAC-OS relates to the material composition of an oxide semiconductor. The CAC-OS refers to a composition in which, in the material composition containing In, Ga, Zn, and O, some regions that include Ga as a main component and are observed as nanoparticles and some regions that include In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film including In as a main component and a film including Ga as a main component is not included.

Note that a clear boundary cannot sometimes be observed between the region including $GaO_{X3}$ as a main component and the region including $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction measurement that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region (ring region) and a plurality of bright spots in the ring region are observed. It is therefore found from the electron diffraction pattern that the crystal structure of the CAC-OS includes an nc (nano-crystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which the metal elements are evenly distributed, and has characteristics different from those of the IGZO compound. That is, in the CAC-OS, the region including $GaO_{X3}$ or the like as a main component and the region including $In_{X2}Zn_{Y2}O_{Z2}$ or $InO_{X1}$ as a main component are separated to form a mosaic pattern.

Here, a region including $In_{X2}Zn_{Y2}O_{Z2}$ or $InO_{X1}$ as a main component is a region whose conductivity is higher than that of a region including $GaO_{X3}$ or the like as a main component. In other words, when carriers flow through the regions including $In_{X2}Zn_{Y2}O_{Z2}$ or $InO_{X1}$ as a main component, the conductivity of an oxide semiconductor is exhibited. Accordingly, when the regions including $In_{X2}Zn_{Y2}O_{Z2}$ or $InO_{X1}$ as a main component are distributed in an oxide semiconductor like a cloud, high field-effect mobility (μ) can be achieved.

By contrast, a region including $GaO_{X3}$ or the like as a main component is a region whose insulating property is higher than that of a region including $In_{X2}Zn_{Y2}O_{Z2}$ or $InO_{X1}$ as a main component. In other words, when the regions including $GaO_{X3}$ or the like as a main component are distributed in an oxide semiconductor, a leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current (Ion) and high field-effect mobility (μ) can be achieved.

A semiconductor element using the CAC-OS has high reliability. Thus, the CAC-OS is suitably used as a constituent material of a variety of semiconductor devices.

<Stacked-Layer Structure 1>

Next, a stacked-layer structure of the imaging device will be described with reference to a cross-sectional view. Note that components such as insulating layers and conductive layers are described below as examples, and other components may be further included. Alternatively, some components described below may be omitted. A stacked-layer structure described below can be formed by a bonding process, a polishing process, or the like as needed.

Figure 23:
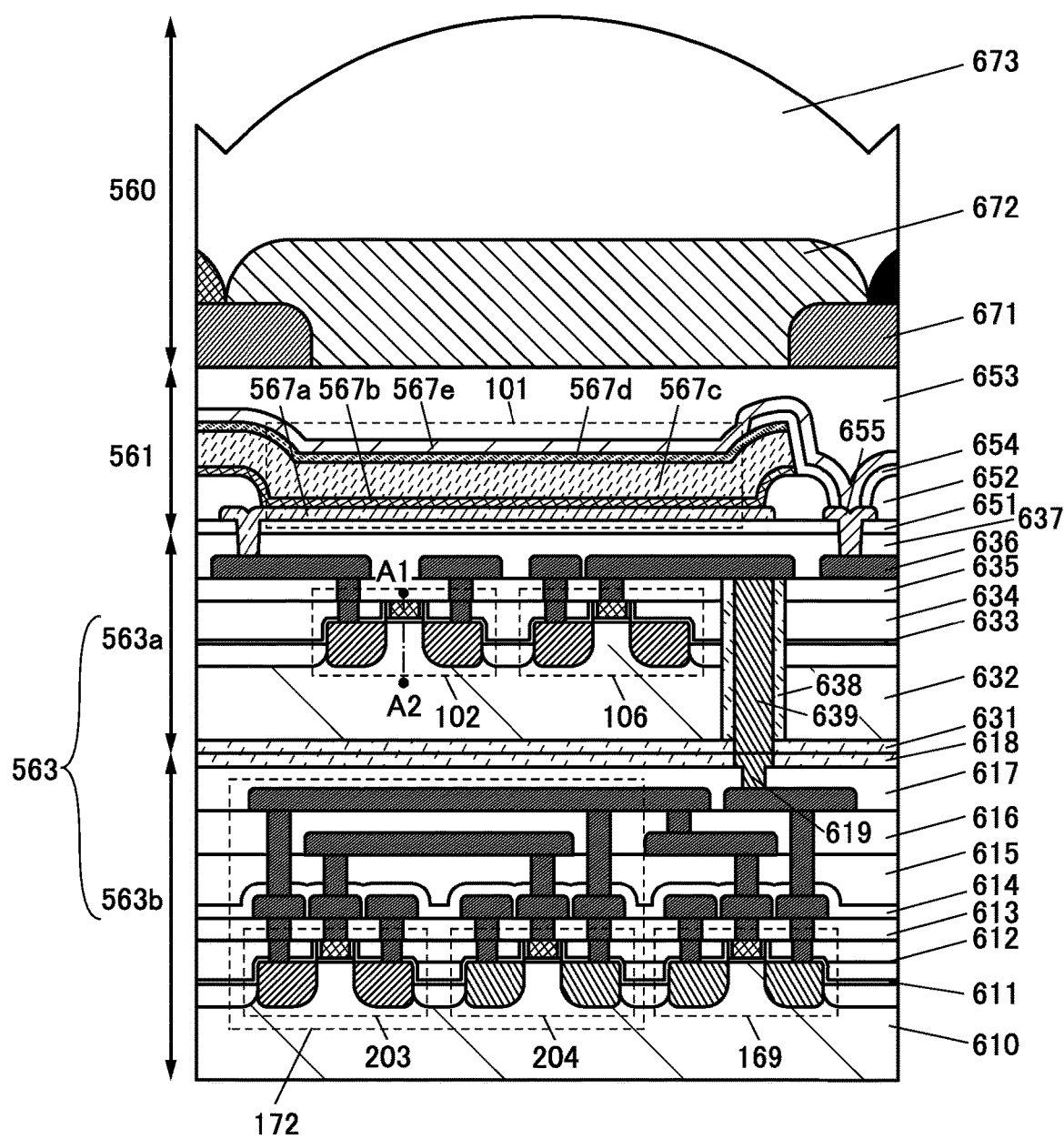
FIG. 23 is a cross-sectional view showing a pixel.

FIG. 23 is an example of a cross-sectional view of a stack including a layer 560, the layer 561, and the layer 563 and including a bonding surface between the layer 563a and the layer 563b of the layer 563.

<Layer 563b>

The layer 563b includes components of the circuit 11 provided on a silicon substrate 610. Here, the transistor 203 and the transistor 204, each of which is included in the inverter 172, and the transistor 169 are illustrated as some of the components of the circuit 11.

The silicon substrate 610 and insulating layers 611, 612, 613, 614, 615, 616, 617, and 618 are provided in the layer 563b. Moreover, a conductive layer 619 is provided. The insulating layer 611 functions as a protective film. The insulating layers 612, 613, 614, 615, 616, and 617 function as interlayer insulating films and planarization films. The insulating layer 618 and the conductive layer 619 function as bonding layers. The conductive layer 619 is electrically connected to the transistor 169.

As the protective film, for example, a silicon nitride film, a silicon oxide film, an aluminum oxide film, or the like can be used. As the interlayer insulating film and the planarization film, for example, an inorganic insulating film such as a silicon oxide film or an organic insulating film of an acrylic resin, a polyimide resin, or the like can be used. As the dielectric layer of the capacitor, a silicon nitride film, a silicon oxide film, an aluminum oxide film, or the like can be used. The bonding layers will be described later.

As a conductor that can be used for a wiring, an electrode, and a plug used for electrical connection between devices, a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like is selected and used as appropriate. The conductor is not limited to a single layer, and may be a plurality of layers including different materials.

<Layer 563a>

The layer 563a includes the components of the circuit 10. Here, the transistor 102 and the transistor 106 are illustrated as some of the components of the circuit 10. In the cross-sectional view illustrated in FIG. 23, electrical connection between the transistors is not illustrated.

A silicon substrate 632 and insulating layers 631, 633, 634, 635, 637, and 638 are provided in the layer 563a. In addition, conductive layers 636 and 639 are provided.

The insulating layer 631 and the conductive layer 639 function as bonding layers. The insulating layers 634, 635, and 637 function as interlayer insulating films and planarization films.

The insulating layer 633 functions as a protective film. The insulating layer 638 has a function of insulating the silicon substrate 632 from the conductive layer 639. The insulating layer 638 can be formed using a material similar to that for another insulating layer. The insulating layer 638 and the insulating layer 631 may be formed using the same material.

The conductive layer 639 is electrically connected to the gate of the transistor 106 and the conductive layer 619. The conductive layer 636 is electrically connected to the wiring 121 (see FIG. 1).

Figure 24A:
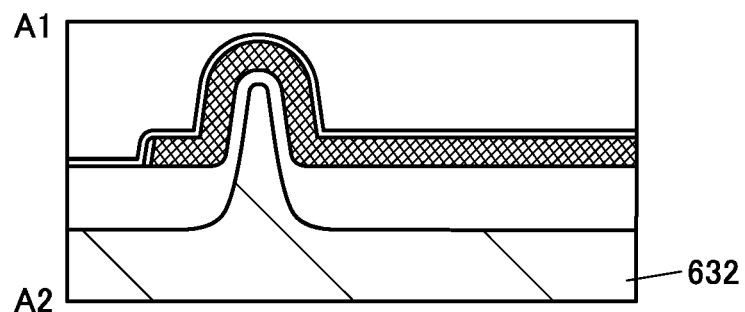
FIG. 24A to FIG. 24C are diagrams each showing a Si transistor.
Figure 24B:
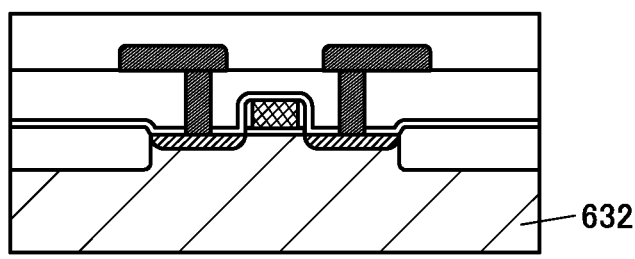

Si transistors illustrated in FIG. 23 are fin-type transistors including channel formation regions in the silicon substrates (the silicon substrates 610 and 632). FIG. 24A illustrates a cross section (a cross section along A1-A2 in the layer 563a in FIG. 23) in the channel width direction. Note that the Si transistors may each be a planar-type transistor as illustrated in FIG. 24B.

Figure 24C:
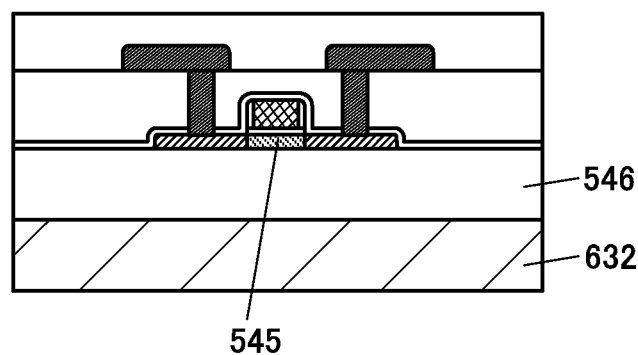

Alternatively, as illustrated in FIG. 24C, a transistor including a semiconductor layer 545 of a silicon thin film may be used. The semiconductor layer 545 can be single crystal silicon (SOI (Silicon on Insulator)) formed on an insulating layer 546 on the silicon substrate 632, for example.

<Layer 561>

The layer 561 includes the photoelectric conversion device 101. The photoelectric conversion device 101 can be formed over the layer 563a. FIG. 23 illustrates the photoelectric conversion device 101 having a structure in which the organic photoconductive film illustrated in FIG. 22C is used as the photoelectric conversion layer. Here, the layer 567a is a cathode, and the layer 567e is an anode.

Insulating layers 651, 652, 653, and 654 and a conductive layer 655 are provided in the layer 561.

The insulating layers 651, 653, and 654 function as interlayer insulating films and planarization films. The insulating layer 654 is provided to cover an end portion of the photoelectric conversion device 101, and has a function of preventing a short circuit between the layer 567e and the layer 567a. The insulating layer 652 functions as an element isolation layer. An organic insulating film or the like is preferably used as the element isolation layer.

The layer 567a corresponding to the cathode of the photoelectric conversion device 101 is electrically connected to one of the source and the drain of the transistor 102 included in the layer 563a. The layer 567e corresponding to the anode of the photoelectric conversion device 101 is electrically connected to the conductive layer 636 included in the layer 563a through the conductive layer 655.

<Layer 560>

The layer 560 is formed over the layer 561. The layer 560 includes a light-blocking layer 671, an optical conversion layer 672, and a microlens array 673.

The light-blocking layer 671 can suppress entry of light into an adjacent pixel. As the light-blocking layer 671, a metal layer of aluminum, tungsten, or the like can be used. The metal layer and a dielectric film functioning as an anti-reflection film may be stacked.

Figure 31A:
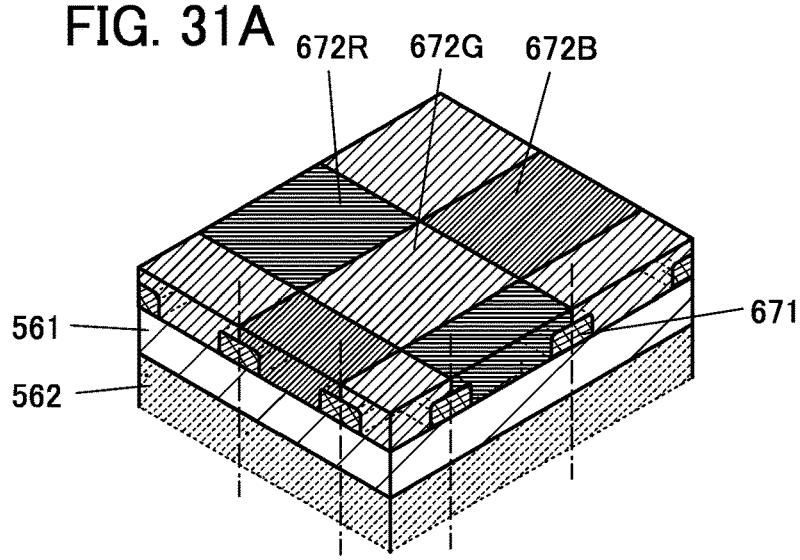
FIG. 31A to FIG. 31C are perspective views (cross-sectional views) showing pixels.

A color filter can be used as the optical conversion layer 672. When colors of (red), G (green), B (blue), Y (yellow), C (cyan), M (magenta), and the like are assigned to the color filters of different pixels, a color image can be obtained. For example, as illustrated in a perspective view (including a cross section) of FIG. 31A, a color filter 672R (red), a color filter 672G (green), and a color filter 672B (blue) can be assigned to different pixels.

When a wavelength cut filter is used as the optical conversion layer 672, the imaging device can capture images in various wavelength regions.

For example, when an infrared filter that blocks light having a wavelength shorter than or equal to that of visible light is used as the optical conversion layer 672, an infrared imaging device can be obtained. When a filter that blocks light having a wavelength shorter than or equal to that of near infrared light is used as the optical conversion layer 672, a far-infrared imaging device can be obtained. When an ultraviolet filter that blocks light having a wavelength longer than or equal to that of visible light is used as the optical conversion layer 672, an ultraviolet imaging device can be obtained.

Figure 31B:
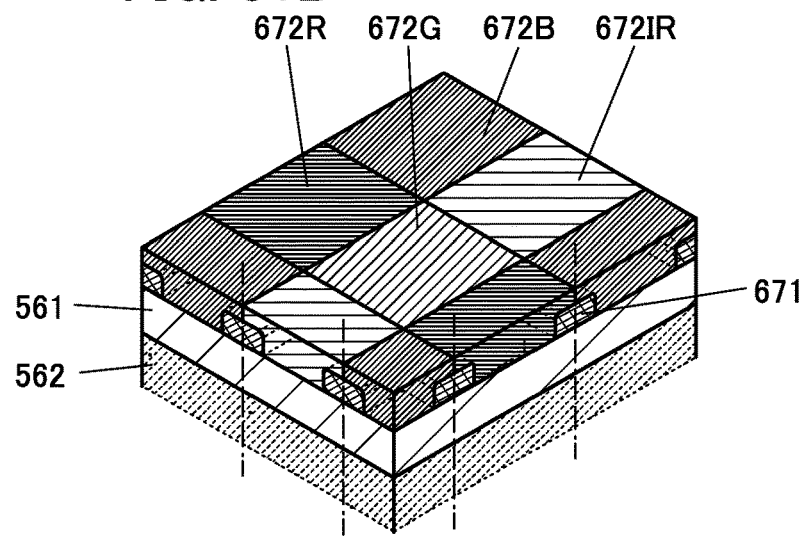

Note that different optical conversion layers may be provided in one imaging device. For example, as illustrated in FIG. 31B, the color filter 672R (red), the color filter 672G (green), the color filter 672B (blue), and an infrared filter 672IR can be assigned to different pixels. With this structure, a visible light image and an infrared light image can be obtained simultaneously.

Figure 31C:
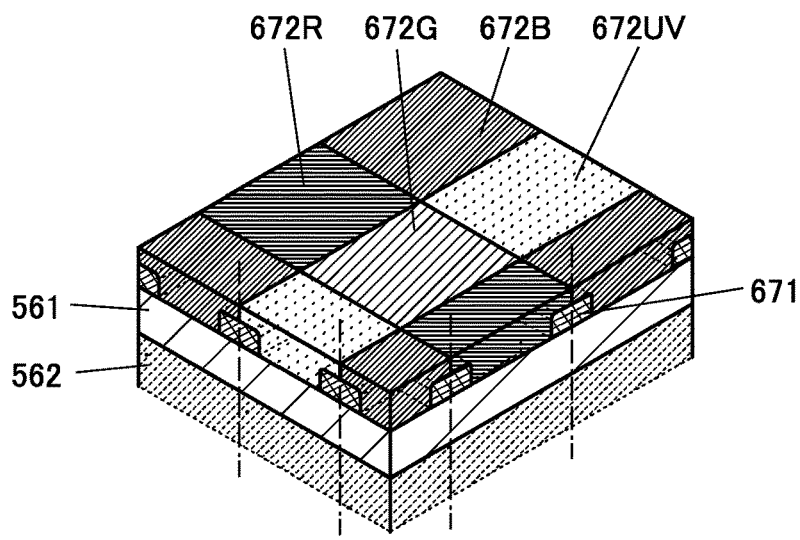

Alternatively, as illustrated in FIG. 31C, the color filter 672R (red), the color filter 672G (green), the color filter 672B (blue), and an ultraviolet filter 672UV can be assigned to different pixels. With this structure, a visible light image and an ultraviolet light image can be obtained simultaneously.

Furthermore, when a scintillator is used as the optical conversion layer 672, an imaging device that obtains an image visualizing the intensity of radiation, which is used for an X-ray imaging device or the like, can be obtained. Radiation such as X-rays passes through an object and enters the scintillator, and then is converted into light (fluorescence) such as visible light or ultraviolet light owing to a photoluminescence phenomenon. Then, the photoelectric conversion device 101 detects the light to obtain image data. Furthermore, the imaging device having this structure may be used in a radiation detector or the like.

A scintillator contains a substance that, when irradiated with radiation such as X-rays or gamma-rays, absorbs energy of the radiation to emit visible light or ultraviolet light. For example, a resin or ceramics in which $Gd_2O_2S:Tb$, $Gd_2O_2S:Pr$, $Gd_2O_2S:Eu$, BaFCl:Eu, NaI, CsI, $CaF_2$, $BaF_2$, $CeF_3$, LiF, LiI, ZnO, or the like is dispersed can be used.

The microlens array 673 is provided over the optical conversion layer 672. Light passing through an individual lens of the microlens array 673 goes through the optical conversion layer 672 directly under the lens, and the photoelectric conversion device 101 is irradiated with the light. With the microlens array 673, collected light can be incident on the photoelectric conversion device 101; thus, photoelectric conversion can be efficiently performed. The microlens array 673 is preferably formed using a resin, glass, or the like having a high light transmitting property with respect to light with a wavelength subjected to imaging.

<Bonding>

Next, bonding of the layer 563*b* and the layer 563*a* will be described.

The insulating layer 618 and the conductive layer 619 are provided in the layer 563*b*. The conductive layer 619 includes a region embedded in the insulating layer 618. Furthermore, the surfaces of the insulating layer 618 and the conductive layer 619 are planarized to be level with each other.

The insulating layer 631 and the conductive layer 639 are provided in the layer 563*a*. The conductive layer 639 includes a region embedded in the insulating layer 631. Furthermore, the surfaces of the insulating layer 631 and the conductive layer 639 are planarized to be level with each other.

Here, a main component of the conductive layer 619 and a main component of the conductive layer 639 are preferably the same metal element. Furthermore, the insulating layer 618 and the insulating layer 631 are preferably formed of the same component.

For the conductive layers 619 and 639, Cu, Al, Sn, Zn, W, Ag, Pt, or Au can be used, for example. Preferably, Cu, Al, W, or Au is used for easy bonding. In addition, for the insulating layers 618 and 631, silicon oxide, silicon oxynitride, silicon nitride oxide, silicon nitride, titanium nitride, or the like can be used.

That is, the same metal material described above is preferably used for the conductive layer 619 and the conductive layer 639. Furthermore, the same insulating material described above is preferably used for the insulating layer 618 and the insulating layer 631. With this structure, bonding can be performed at the boundary between the layer 563*b* and the layer 563*a*.

Note that the conductive layer 619 and the conductive layer 639 may each have a multilayer structure of a plurality of layers; in that case, the outer layers (bonding surfaces) are formed of the same metal material. The insulating layer 618 and the insulating layer 631 may each have a multilayer structure of a plurality of layers; in that case, the outer layers (bonding surfaces) are formed of the same insulating material.

Through the above bonding, the electrical connection between the conductive layer 619 and the conductive layer 639 can be obtained. Moreover, the connection between the insulating layer 618 and the insulating layer 631 with mechanical strength can be obtained.

For bonding metal layers to each other, a surface activated bonding method in which an oxide film, a layer adsorbing impurities, and the like on the surface are removed by sputtering or the like and the cleaned and activated surfaces are brought into contact to be bonded to each other can be used. Alternatively, a diffusion bonding method in which the surfaces are bonded to each other by using temperature and pressure together can be used, for example. Both methods cause bonding at an atomic level, and therefore not only electrically but also mechanically excellent bonding can be obtained.

Furthermore, for bonding insulating layers to each other, a hydrophilic bonding method or the like can be used; in the method, after high planarity is obtained by polishing or the like, the surfaces of the insulating layers subjected to hydrophilicity treatment with oxygen plasma or the like are arranged in contact with and bonded to each other temporarily, and then dehydrated by heat treatment to perform final bonding. The hydrophilic bonding method can also cause bonding at an atomic level; thus, mechanically excellent bonding can be obtained.

When the layer 563*b* and the layer 563*a* are bonded to each other, the insulating layers and the metal layers coexist on their bonding surfaces; therefore, the surface activated bonding method and the hydrophilic bonding method are performed in combination, for example.

For example, a method can be used in which the surfaces are made clean after polishing, the surfaces of the metal layers are subjected to antioxidant treatment and hydrophilicity treatment, and then bonding is performed. Furthermore, hydrophilicity treatment may be performed on the surfaces of the metal layers being hardly oxidizable metal such as Au. Note that a bonding method other than the above-mentioned methods may be used.

The above bonding allows the components included in the layer 563*b* to be electrically connected to the components included in the layer 563*a*.

<Modification Example of Stacked-Layer Structure 1>

Figure 25:
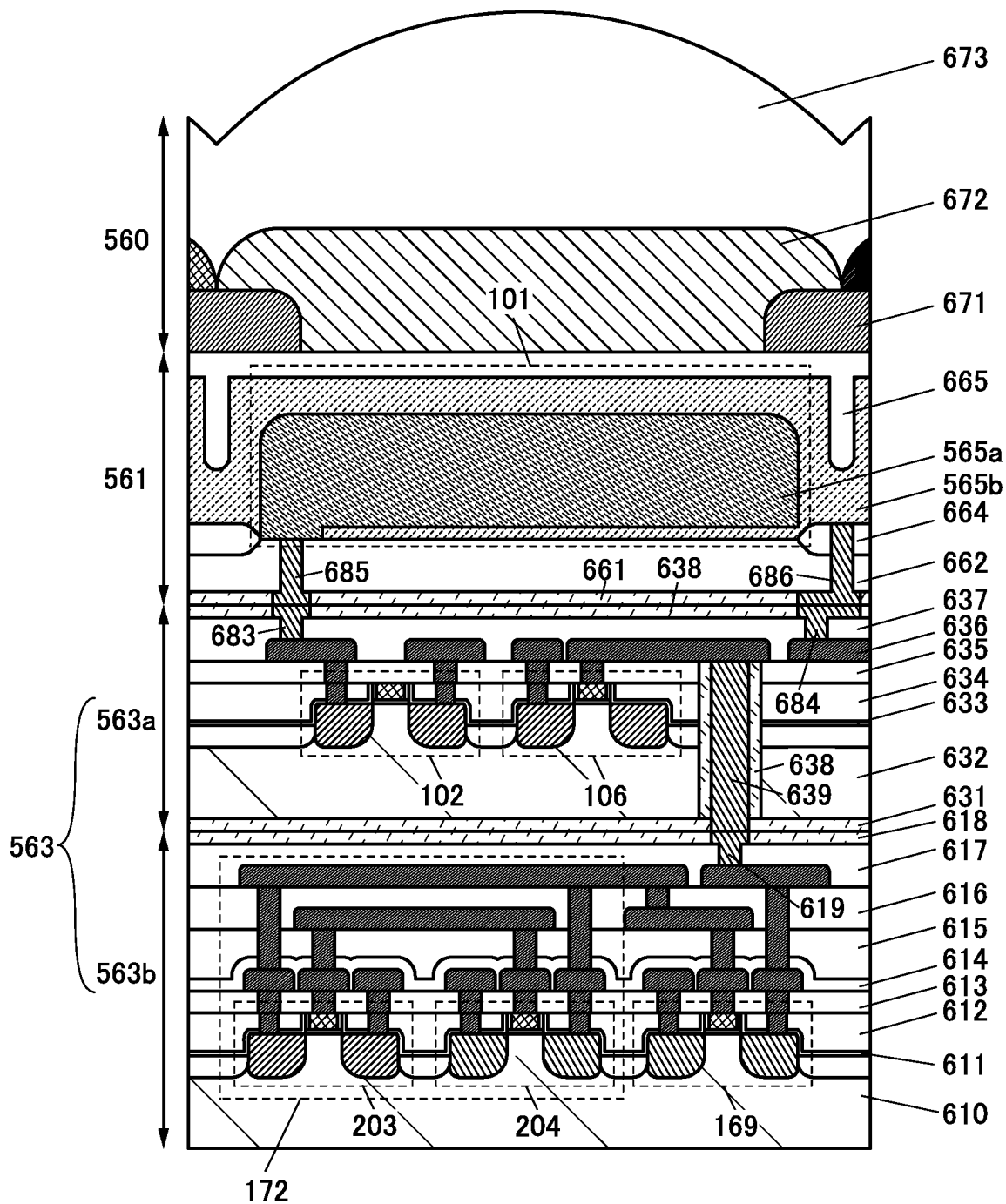
FIG. 25 is a cross-sectional view showing a pixel.

FIG. 25 is a modification example of the stacked-layer structure illustrated in FIG. 23 and differs from FIG. 23 in the structure of the photoelectric conversion device 101 included in the layer 561 and part of the structure of the layer 563*a*; a bonding surface is also included between the layer 561 and the layer 563*a*.

The layer 561 includes the photoelectric conversion device 101, insulating layers 661, 662, 664, and 665, and conductive layers 685 and 686.

The photoelectric conversion device 101 is a pn junction photodiode formed on a silicon substrate and includes the layer 565*b* corresponding to a p-type region and the layer 565*a* corresponding to an n-type region. The photoelectric conversion device 101 is a pinned photodiode, which can suppress a dark current and reduce noise with the thin p-type region (part of the layer 565*b*) provided on the surface side (current extraction side) of the layer 565*a*.

The insulating layer 661 and the conductive layers 685 and 686 function as bonding layers. The insulating layer 662 functions as an interlayer insulating film and a planarization film. The insulating layer 664 functions as an element isolation layer. The insulating layer 665 has a function of suppressing carrier leakage.

The silicon substrate is provided with a groove that separates pixels, and the insulating layer 665 is provided on the top surface of the silicon substrate and in the groove. The insulating layer 665 can suppress leakage of carriers generated in the photoelectric conversion device 101 to an adjacent pixel. The insulating layer 665 also has a function of suppressing entry of stray light. Therefore, color mixture can be suppressed with the insulating layer 665. Note that an anti-reflection film may be provided between the top surface of the silicon substrate and the insulating layer 665.

The element isolation layer can be formed by a LOCOS (LOCal Oxidation of Silicon) method. Alternatively, an STI (Shallow Trench Isolation) method or the like may be used to form the element isolation layer. As the insulating layer 665, for example, an inorganic insulating film of silicon oxide, silicon nitride, or the like or an organic insulating film of polyimide, acrylic, or the like can be used. The insulating layer 665 may have a multilayer structure. Note that a structure without the element isolation layer may also be employed.

The layer 565a (corresponding to the n-type region and the cathode) of the photoelectric conversion device 101 is electrically connected to the conductive layer 685. The layer 565b (corresponding to the p-type region and the anode) is electrically connected to the conductive layer 686. The conductive layers 685 and 686 each include a region embedded in the insulating layer 661. Furthermore, the surfaces of the insulating layer 661 and the conductive layers 685 and 686 are planarized to be level with each other.

In the layer 563a, the insulating layer 638 is formed over the insulating layer 637. In addition, a conductive layer 683 electrically connected to one of the source and the drain of the transistor 102 and a conductive layer 684 electrically connected to the conductive layer 636 are formed.

The insulating layer 638 and the conductive layers 683 and 684 function as bonding layers. The conductive layers 683 and 684 each include a region embedded in the insulating layer 638. Furthermore, the surfaces of the insulating layer 638 and the conductive layers 683 and 684 are planarized to be level with each other.

Here, the conductive layers 683, 684, 685, and 686 are the same bonding layers as the above-described conductive layers 619 and 639. The insulating layers 638 and 661 are the same bonding layers as the above-described insulating layers 618 and 631.

Thus, when the conductive layer 683 and the conductive layer 685 are bonded to each other, the layer 565a (corresponding to the n-type region and the cathode) of the photoelectric conversion device can be electrically connected to the one of the source and the drain of the transistor 102. In addition, when the conductive layer 684 and the conductive layer 686 are bonded to each other, the layer 565b (corresponding to the p-type region and the anode) of the photoelectric conversion device can be electrically connected to the wiring 121 (see FIG. 1). When the insulating layer 638 and the insulating layer 661 are bonded to each other, electrical bonding and mechanical bonding of the layer 561 and the layer 563a can be performed.

<Stacked-Layer Structure 2>

Figure 26:
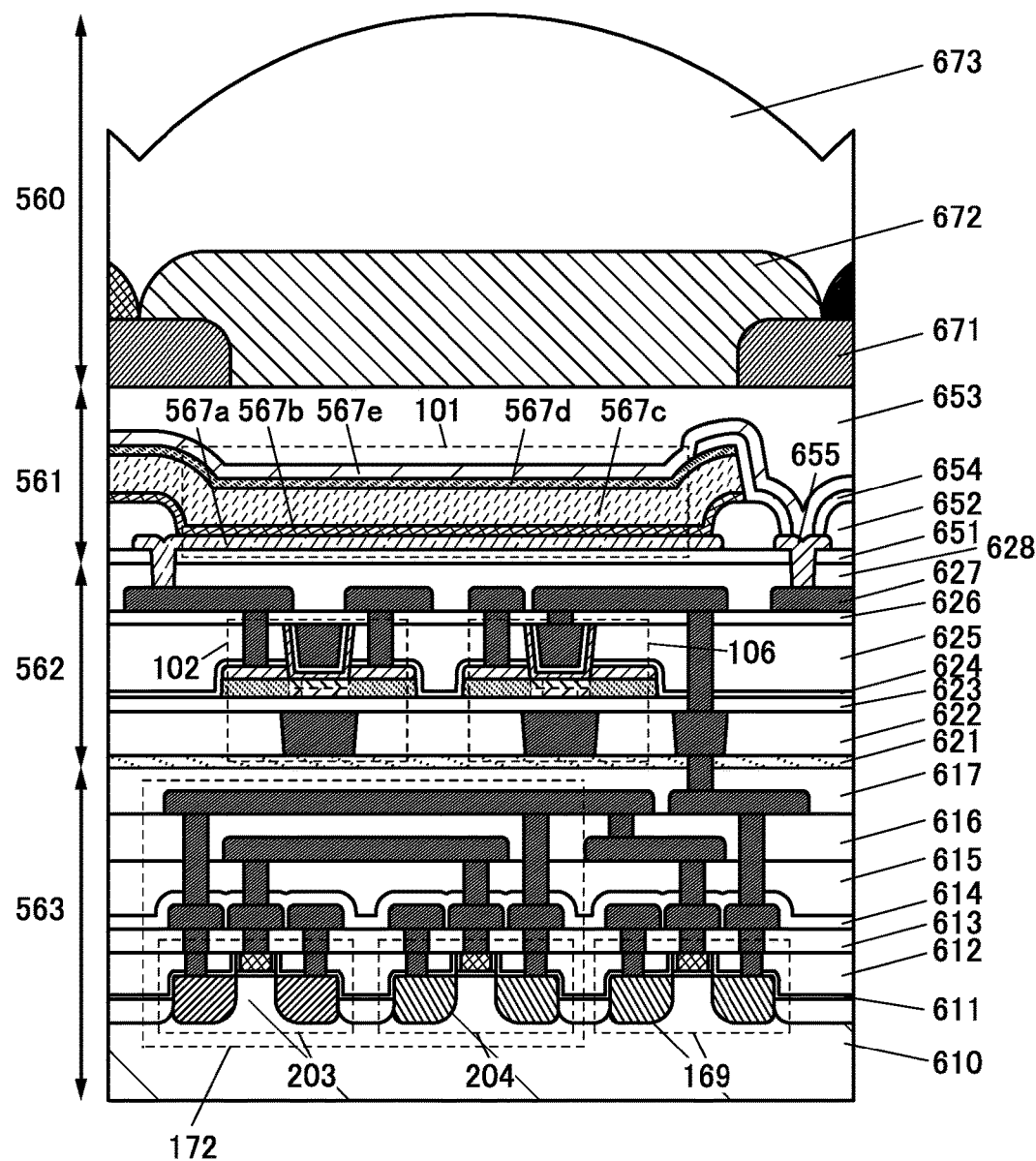
FIG. 26 is a cross-sectional view showing a pixel.

FIG. 26 is an example of a cross-sectional view of a stack including the layers 560, 561, 562, and 563 and not including a bonding surface. Si transistors are provided in the layer 563. OS transistors are provided in the layer 562. Note that the structures of the layer 563, the layer 561, and the layer 560 are not described here because they are the same as the structures illustrated in FIG. 23.

<Layer 562>

The layer 562 is formed over the layer 563. The layer 562 includes OS transistors. Here, the transistor 102 and the transistor 106 are illustrated as some of the components of the circuit 10. In the cross-sectional view illustrated in FIG. 26, electrical connection between the transistors is not illustrated.

Insulating layers 621, 622, 623, 624, 625, 626, and 628 are provided in the layer 562. Moreover, a conductive layer 627 is provided. The conductive layer 627 can be electrically connected to the wiring 121 (see FIG. 1).

The insulating layer 621 functions as a blocking layer. The insulating layers 622, 623, 625, 626, and 628 function as interlayer insulating films and planarization films. The insulating layer 624 has a function of a protective film.

As the blocking layer, a film that has a function of preventing hydrogen diffusion is preferably used. In a Si device, hydrogen is necessary to terminate dangling bonds; however, hydrogen in the vicinity of an OS transistor is one factor of generating carriers in an oxide semiconductor layer, which leads to a decrease in reliability. Therefore, a hydrogen blocking film is preferably provided between a layer in which the Si device is formed and a layer in which the OS transistor is formed.

For the blocking film, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ) can be used.

The gate of the transistor 106 is electrically connected to the transistor 169 through a plug.

The one of the source and the drain of the transistor 102 is electrically connected to the layer 567a of the photoelectric conversion device 101 included in the layer 561. The conductive layer 627 is electrically connected to the layer 567e of the photoelectric conversion device 101 included in the layer 561.

Figure 27A:
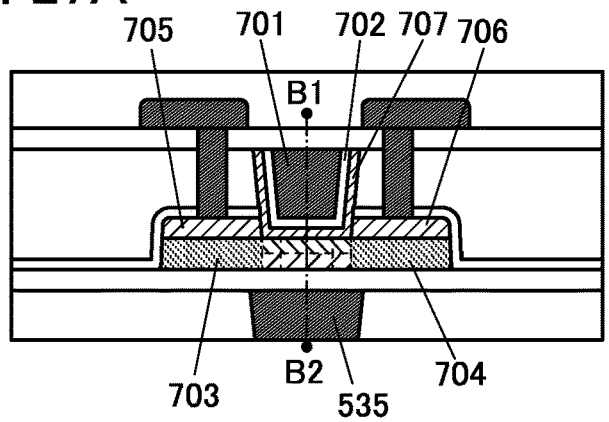
FIG. 27A to FIG. 27D are diagrams each showing an OS transistor.

The details of an OS transistor are illustrated in FIG. 27A. The OS transistor illustrated in FIG. 27A has a self-aligned structure in which a source electrode 705 and a drain electrode 706 are formed through provision of an insulating layer over stacked layers of an oxide semiconductor layer and a conductive layer and provision of opening portions reaching the oxide semiconductor layer.

The OS transistor can include a gate electrode 701 and a gate insulating film 702 in addition to a channel formation region, a source region 703, and a drain region 704, which are formed in the oxide semiconductor layer. At least the gate insulating film 702 and the gate electrode 701 are provided in the opening portion. The opening portion may further be provided with an oxide semiconductor layer 707.

Figure 27B:
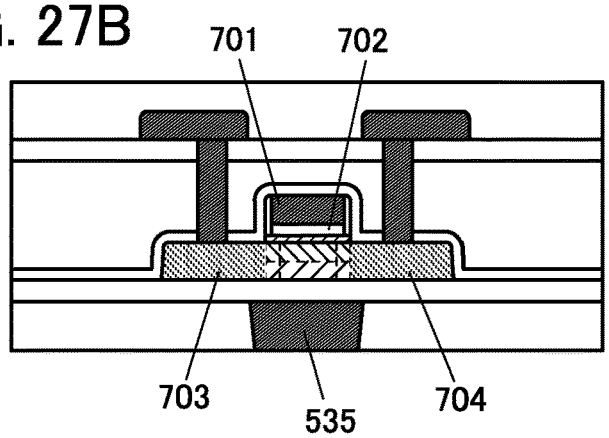

As illustrated in FIG. 27B, the OS transistor may have a self-aligned structure in which the source region 703 and the drain region 704 are formed in the semiconductor layer with the gate electrode 701 as a mask.

Figure 27C:
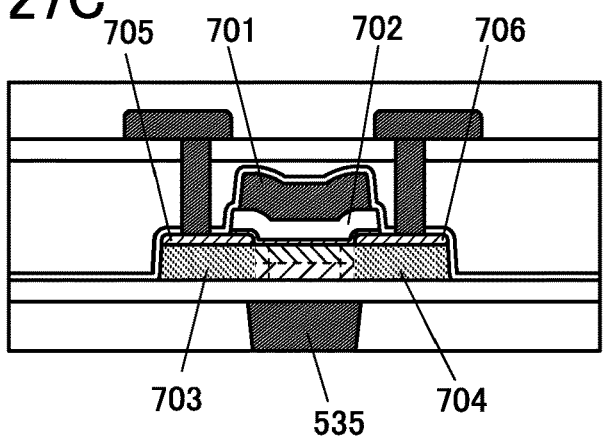

As illustrated in FIG. 27C, the OS transistor may be a non-self-aligned top-gate transistor including a region where the source electrode 705 or the drain electrode 706 overlaps with the gate electrode 701.

Figure 27D:
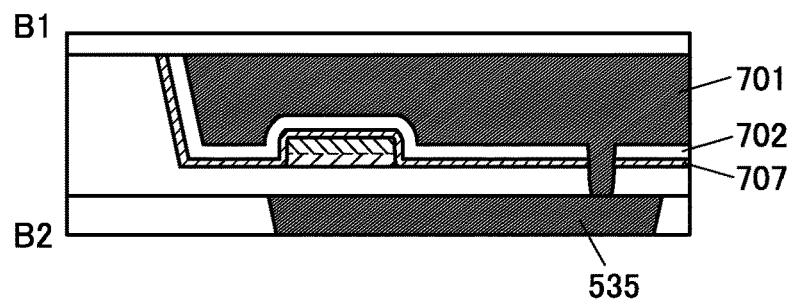

Although the OS transistor has a structure with a back gate 535, it may have a structure without a back gate. As illustrated in a cross-sectional view of the transistor in the channel width direction in FIG. 27D, the back gate 535 may be electrically connected to a front gate of the transistor, which is provided to face the back gate. Note that FIG. 27D illustrates an example of a B1-B2 cross section of the transistor in FIG. 27A, and the same applies to a transistor having any of the other structures. A structure where a fixed potential different from the potential supplied to the front gate is supplied to the back gate 535 may be employed.

<Modification Example 1 of Stacked-Layer Structure 2>

Figure 28:
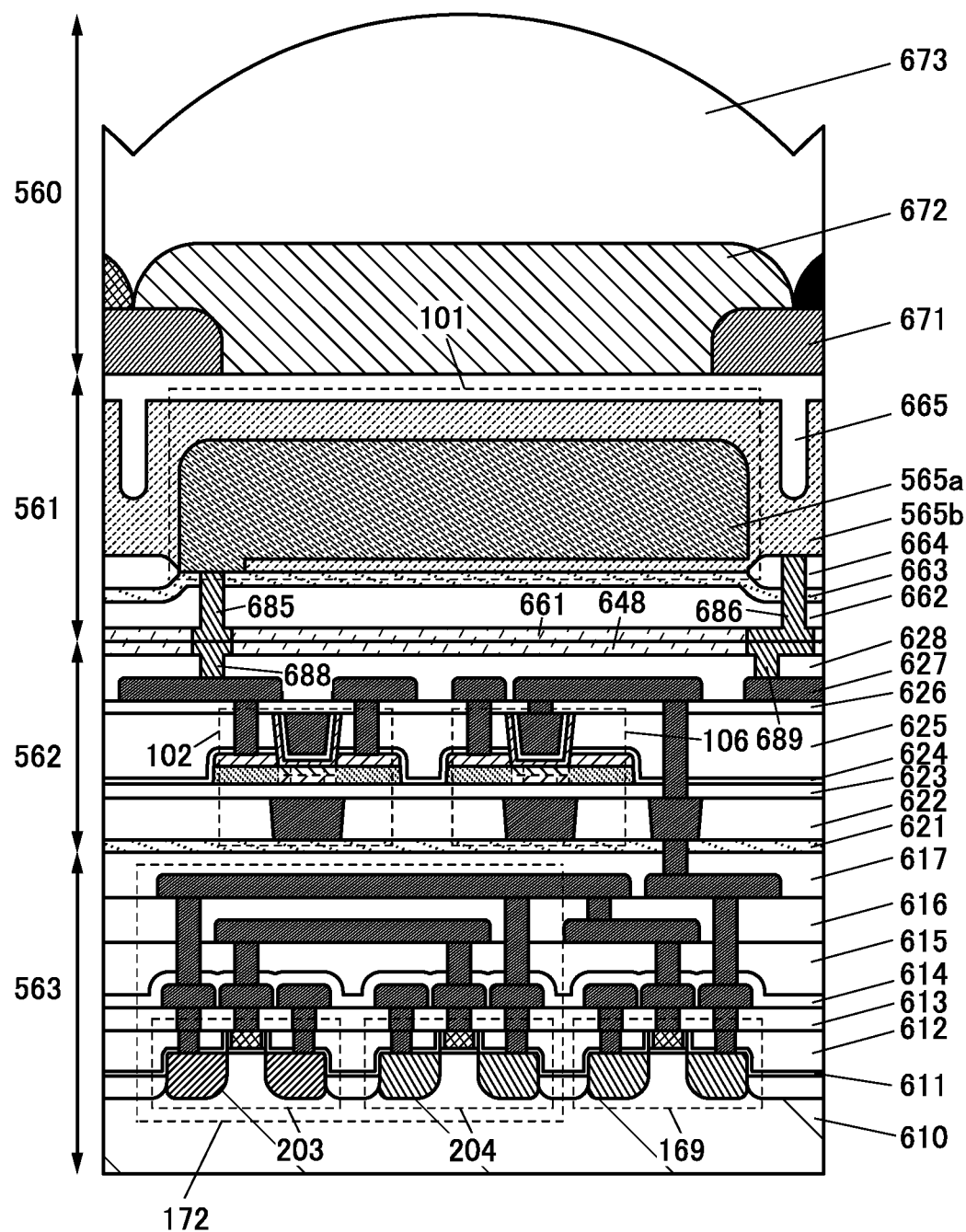
FIG. 28 is a cross-sectional view showing a pixel.

FIG. 28 is a modification example of the stacked-layer structure illustrated in FIG. 26 and differs from FIG. 26 in the structure of the photoelectric conversion device 101 included in the layer 561 and part of the structure of the layer 562; a bonding surface is included between the layer 561 and the layer 562.

The photoelectric conversion device 101 included in the layer 561 is a pn junction photodiode and has a structure similar to that illustrated in FIG. 25.

In the layer 562, an insulating layer 648 is formed over the insulating layer 626. In addition, a conductive layer 688 electrically connected to the one of the source and the drain of the transistor 102 and a conductive layer 689 electrically connected to the conductive layer 627 are formed.

The insulating layer 648 and the conductive layers 688 and 689 function as bonding layers. The conductive layers 688 and 689 each include a region embedded in the insulating layer 648. Furthermore, the surfaces of the insulating layer 648 and the conductive layers 688 and 689 are planarized to be level with each other.

Here, the conductive layers 688 and 689 are bonding layers like the above-described conductive layers 619 and 639. The insulating layer 648 is a bonding layer like the above-described insulating layers 618 and 631.

Thus, when the conductive layer 688 and the conductive layer 685 are bonded to each other, the layer 565a (corresponding to the n-type region and the cathode) of the photoelectric conversion device can be electrically connected to the one of the source and the drain of the transistor 102. In addition, when the conductive layer 689 and the conductive layer 686 are bonded to each other, the layer 565b (corresponding to the p-type region and the anode) of the photoelectric conversion device can be electrically connected to the wiring 121 (see FIG. 1). When the insulating layer 648 and the insulating layer 661 are bonded to each other, electrical bonding and mechanical bonding of the layer 561 and the layer 562a can be performed.

In the case where a plurality of Si devices are stacked, a polishing step and a bonding step are required to be performed a plurality of times. Consequently, there are issues such as a large number of manufacturing steps, the need for a dedicated apparatus, and a low yield, and the manufacturing cost is high. An OS transistor can be formed to be stacked over a silicon substrate on which a device is formed, and thus a bonding step can be skipped.

<Modification Example 2 of Stacked-Layer Structure 2>

Figure 29:
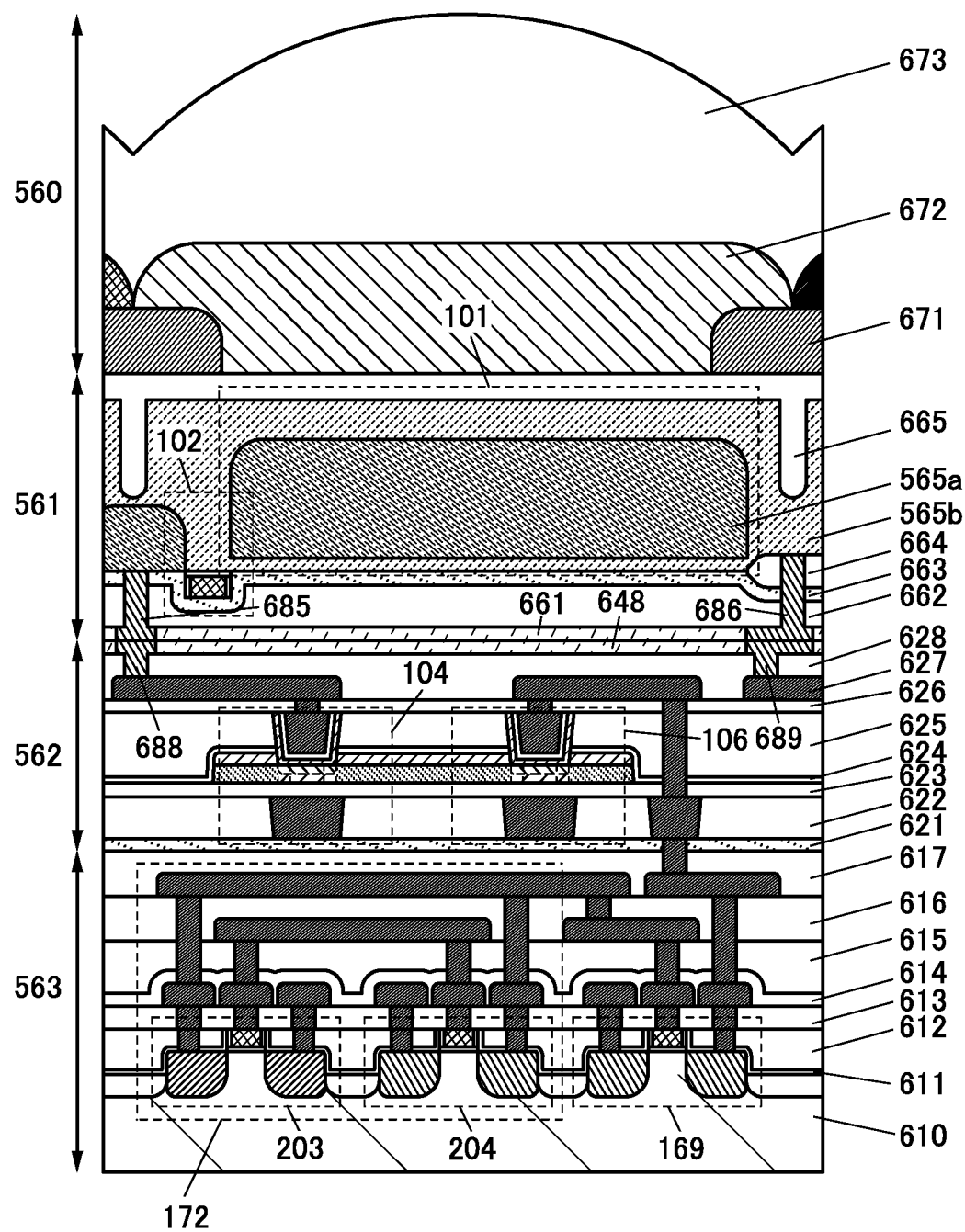
FIG. 29 is a cross-sectional view showing a pixel.

FIG. 29 is a modification example of the stacked-layer structure illustrated in FIG. 28 and differs from FIG. 28 in the structure of the layer 561 and part of the structure of the layer 562; a bonding surface is included between the layer 561 and the layer 562.

This modification example has a structure in which the transistor 102 included in the circuit 10 is provided in the layer 561. The transistor 102 is formed of a Si transistor in the layer 561. The one of the source and the drain of the transistor 102 is directly connected to the photoelectric conversion device 101 and the other of the source and the drain of the transistor 102 functions as the node FD1.

In that case, the transistors other than at least the transistor 102 included in the circuit 10 are provided in the layer 562.

FIG. 29 illustrates an example in which the transistor 104 and the transistor 106 are provided.

<Stacked-Layer Structure 3>

Figure 30:
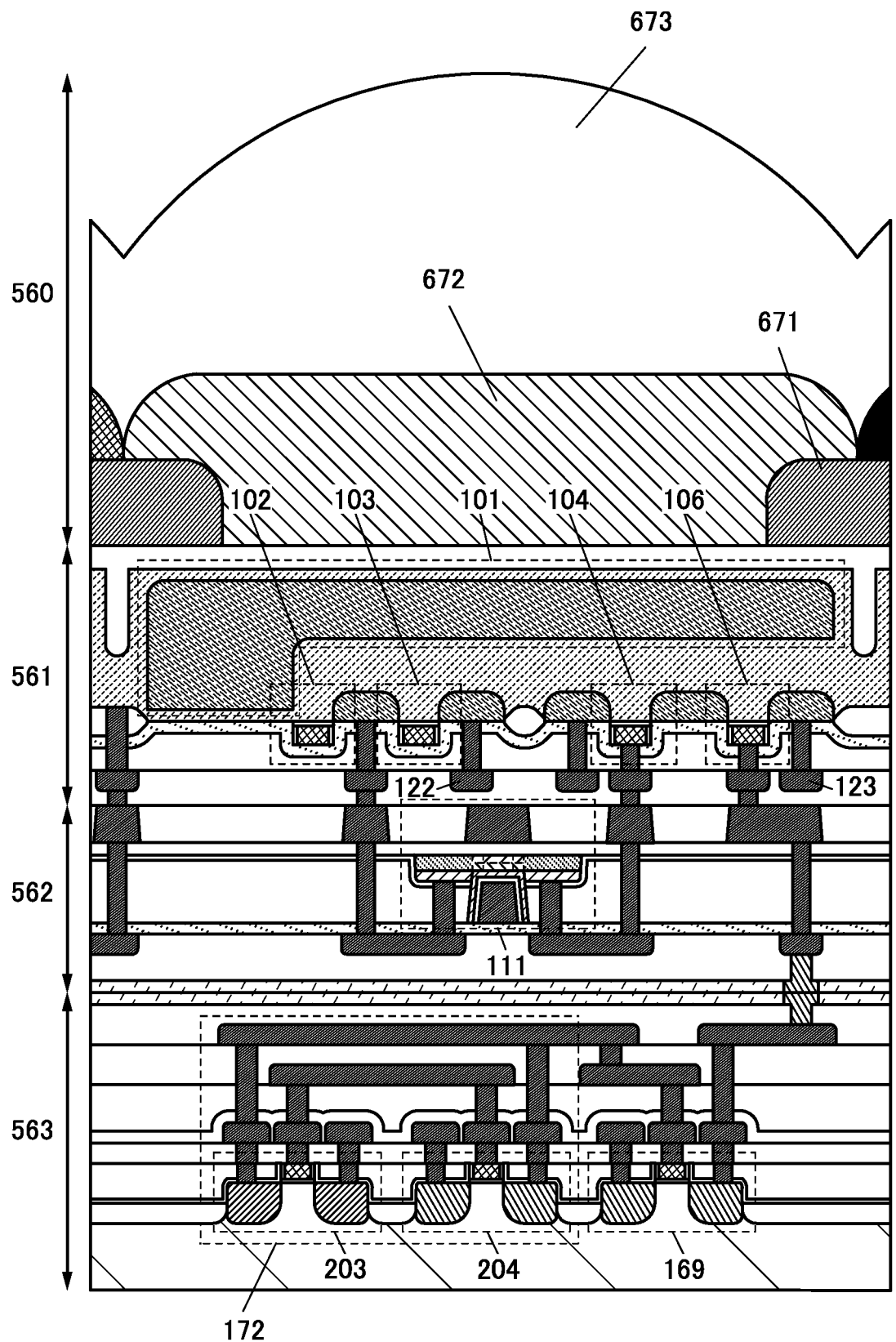
FIG. 30 is a cross-sectional view showing a pixel.

FIG. 25 to FIG. 29 illustrate examples of the stacked-layer structure of the circuit 10 illustrated in FIG. 1; the circuit 10 illustrated in FIG. 2B can have a structure illustrated in FIG. 30. FIG. 30 illustrates an example of the structure in which the transistors 102, 103, 104, 105, and 106 (the transistor 105 is not illustrated) are provided as Si transistors in the layer 561, and the transistor 111 is provided as an OS transistor in the layer 561. Although the structure in which the layer 562 and the layer 563 are bonded to each other is shown as an example in FIG. 30, the layer 561 and the layer 562 may be bonded to each other as in FIG. 29.

<Package, Module>

FIG. 32A1 is an external perspective view of the top surface side of a package in which an image sensor chip is placed. The package includes a package substrate 410 to which an image sensor chip 450 (see FIG. 32A3) is fixed, a cover glass 420, an adhesive 430 for bonding them, and the like.

FIG. 32A2 is an external perspective view of the bottom surface side of the package. A BGA (Ball grid array) in which solder balls are used as bumps 440 on the bottom surface of the package is employed. Note that, other than the BGA, an LGA (Land grid array), a PGA (Pin Grid Array), or the like may be employed.

FIG. 32A3 is a perspective view of the package, in which parts of the cover glass 420 and the adhesive 430 are not illustrated. Electrode pads 460 are formed over the package substrate 410, and the electrode pads 460 and the bumps 440 are electrically connected to each other via through-holes. The electrode pads 460 are electrically connected to the image sensor chip 450 through wires 470.

FIG. 32B1 is an external perspective view of the top surface side of a camera module in which an image sensor chip is placed in a package with a built-in lens. The camera module includes a package substrate 411 to which an image sensor chip 451 (see FIG. 32B3) is fixed, a lens cover 421, a lens 435, and the like. Furthermore, an IC chip 490 (see FIG. 32B3) having functions of a driver circuit, a signal conversion circuit, and the like of an imaging device is provided between the package substrate 411 and the image sensor chip 451; thus, the structure as an SiP (System in package) is included.

FIG. 32B2 is an external perspective view of the bottom surface side of the camera module. A QFN (Quad flat no-lead package) structure in which lands 441 for mounting are provided on the bottom surface and side surfaces of the package substrate 411 is employed. Note that this structure is only an example, and a QFP (Quad flat package) or the above-mentioned BGA may also be provided.

FIG. 32B3 is a perspective view of the module, in which parts of the lens cover 421 and the lens 435 are not illustrated. The lands 441 are electrically connected to electrode pads 461, and the electrode pads 461 are electrically connected to the image sensor chip 451 or the IC chip 490 through wires 471.

The image sensor chip placed in a package having the above-described form can be easily mounted on a printed substrate or the like, and the image sensor chip can be incorporated in a variety of semiconductor devices and electronic devices.

This embodiment can be combined with the description of the other embodiments as appropriate.

Embodiment 3

As electronic devices that can use the imaging device of one embodiment of the present invention, display devices, personal computers, image memory devices or image reproducing devices provided with storage media, mobile phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), vending machines, and the like are given. FIG. 33A to FIG. 33F illustrate specific examples of these electronic devices.

Figure 33A:
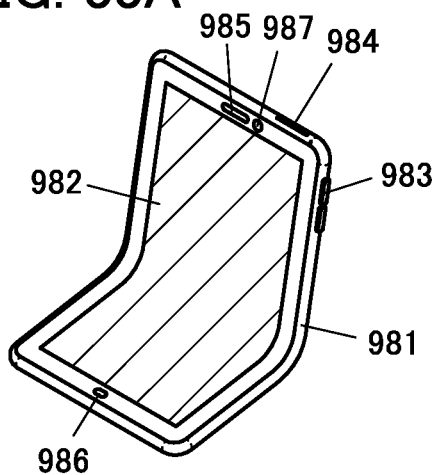
FIG. 33A to FIG. 33F are diagrams each showing an electronic device.

FIG. 33A is an example of a mobile phone, which includes a housing 981, a display portion 982, an operation button 983, an external connection port 984, a speaker 985, a microphone 986, a camera 987, and the like. The display portion 982 of the mobile phone is provided with a touch sensor. A variety of operations such as making a call and inputting text can be performed by touch on the display portion 982 with a finger, a stylus, or the like. The imaging device of one embodiment of the present invention and the operation method thereof can be used in the mobile phone, resulting in a reduction in power consumption.

Figure 33B:
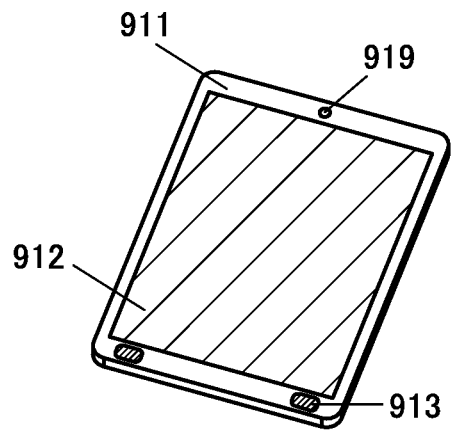

FIG. 33B is a portable data terminal, which includes a housing 911, a display portion 912, a speaker 913, a camera 919, and the like. A touch panel function of the display portion 912 enables input and output of information. Furthermore, a character or the like in an image that is captured by the camera 919 can be recognized and the character can be voice-output from the speaker 913. The imaging device of one embodiment of the present invention and the operation method thereof can be used in the portable data terminal, resulting in a reduction in power consumption.

Figure 33C:
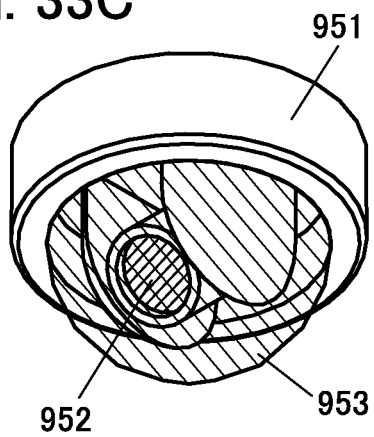

FIG. 33C is a surveillance camera, which includes a support base 951, a camera unit 952, a protection cover 953, and the like. By setting the camera unit 952 provided with a rotating mechanism and the like on a ceiling, an image of all of the surroundings can be taken. The imaging device of one embodiment of the present invention and the operation method thereof can be used for obtaining an image in the camera unit, resulting in a reduction in power consumption. Note that a surveillance camera is a name in common use and does not limit the use thereof. A device that has a function of a surveillance camera can also be called a camera or a video camera, for example.

Figure 33D:
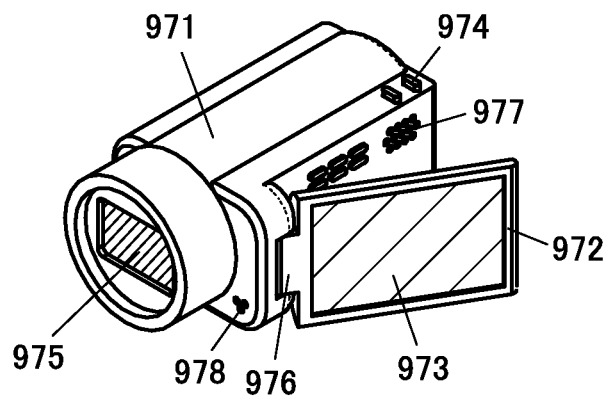

FIG. 33D is a video camera, which includes a first housing 971, a second housing 972, a display portion 973, an operation key 974, a lens 975, a connection portion 976, a speaker 977, a microphone 978, and the like. The operation key 974 and the lens 975 are provided for the first housing 971, and the display portion 973 is provided for the second housing 972. The imaging device of one embodiment of the present invention and the operation method thereof can be used in the video camera, resulting in a reduction in power consumption.

Figure 33E:
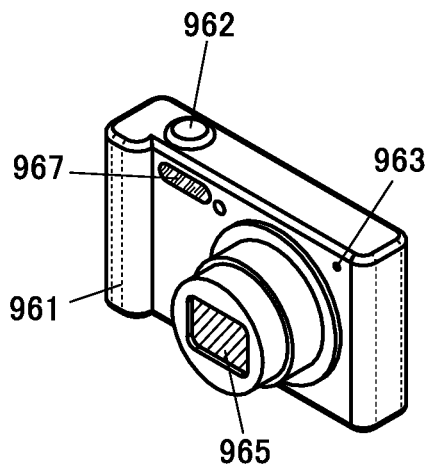

FIG. 33E is a digital camera, which includes a housing 961, a shutter button 962, a microphone 963, a light-emitting portion 967, a lens 965, and the like. The imaging device of one embodiment of the present invention and the operation method thereof can be used in the digital camera, resulting in a reduction in power consumption.

Figure 33F:
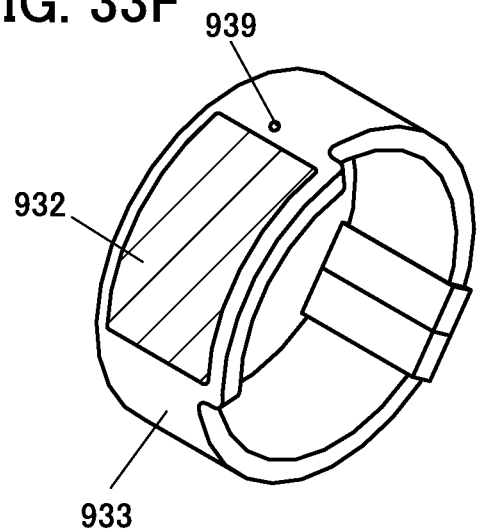

FIG. 33F is a wrist-watch-type information terminal, which includes a display portion 932, a housing and wristband 933, a camera 939, and the like. The display portion 932 is provided with a touch panel for performing the operation of the information terminal. The display portion 932 and the housing and wristband 933 have flexibility and fit a body well. The imaging device of one embodiment of the present invention and the operation method thereof can be used in the information terminal, resulting in a reduction in power consumption.

This embodiment can be combined with the description of the other embodiments as appropriate.

REFERENCE NUMERALS

10: circuit, 11: circuit, 11A: sense amplifier, 11B: sense amplifier, 11C: output circuit, 21: pixel array, 22: circuit, 23: circuit, 24: circuit, 25: circuit, 26: circuit, 28: circuit, 101: photoelectric conversion device, 102: transistor, 103: transistor, 104: transistor, 105: transistor, 106: transistor, 107: transistor, 108: capacitor, 109: capacitor, 111: transistor, 112: OR circuit, 113: transistor, 121: wiring, 122: wiring, 123: wiring, 124: wiring, 125: wiring, 127: wiring, 128: wiring, 129: wiring, 131: transistor, 132: transistor, 133: transistor, 134: transistor, 135: transistor, 136: transistor, 137: transistor, 138: transistor, 141: transistor, 142: transistor, 143: transistor, 144: transistor, 145: transistor, 146: transistor, 147: transistor, 148: transistor, 151: transistor, 152: transistor, 153: transistor, 154: transistor, 155: transistor, 156: transistor, 157: transistor, 158: transistor, 161: transistor, 162: transistor, 163: transistor, 164: transistor, 165: transistor, 166: transistor, 167: transistor, 168: transistor, 169: transistor, 171: inverter, 172: inverter, 203: transistor, 204: transistor, 231: wiring, 232: wiring, 233: wiring, 234: wiring, 235: wiring, 236: wiring, 237: wiring, 238: wiring, 239: wiring, 241: wiring, 242: wiring, 410: package substrate, 411: package substrate, 420: cover glass, 421: lens cover, 430: adhesive, 435: lens, 440: bump, 441: land, 450: image sensor chip, 451: image sensor chip, 460: electrode pad, 461: electrode pad, 470: wire, 471: wire, 490: IC chip, 535: back gate, 545: semiconductor layer, 546: insulating layer, 560: layer, 561: layer, 562: layer, 562a: layer, 562b: layer, 563: layer, 563a: layer, 563b: layer, 563c: layer, 565a: layer, 565b: layer, 566a: layer, 566b: layer, 566c: layer, 566d: layer, 567a: layer, 567b: layer, 567c: layer, 567d: layer, 567e: layer, 610: silicon substrate, 611: insulating layer, 612: insulating layer, 613: insulating layer, 614: insulating layer, 615: insulating layer, 616: insulating layer, 617: insulating layer, 618: insulating layer, 619: conductive layer, 621: insulating layer, 622: insulating layer, 623: insulating layer, 624: insulating layer, 625: insulating layer, 626: insulating layer, 627: conductive layer, 628: insulating layer, 631: insulating layer, 632: silicon substrate, 633: insulating layer, 634: insulating layer, 635: insulating layer, 636: conductive layer, 637: insulating layer, 638: insulating layer, 639: conductive layer, 648: insulating layer, 651: insulating layer, 652: insulating layer, 653: insulating layer, 654: insulating layer, 655: conductive layer, 661: insulating layer, 662: insulating layer, 664: insulating layer, 665: insulating layer, 671: light-blocking layer, 672: optical conversion layer, 673: microlens array, 683: conductive layer, 684: conductive layer, 685: conductive layer, 686: conductive layer, 688: conductive layer, 689: conductive layer, 701: gate electrode, 702: gate insulating film, 703: source region, 704: drain region, 705: source electrode, 706: drain electrode, 707: oxide semiconductor layer, 911: housing, 912: display portion, 913: speaker, 919: camera, 932: display portion, 933: housing and wristband, 939: camera, 951: support base, 952: camera unit, 953: protection cover, 961: housing, 962: shutter button, 963: microphone, 965: lens, 967: light-emitting portion, 971: housing, 972: housing, 973: display portion, 974: operation key, 975: lens, 976: connection portion, 977: speaker, 978: microphone, 981: housing, 982:

display portion, 983: operation button, 984: external connection port, 985: speaker, 986: microphone, 987: camera,

The invention claimed is:

1. An imaging device comprising a pixel comprising a first circuit and a second circuit,
   wherein the first circuit comprises a first node, a second node, and a first switch,
   wherein the first node has a function of retaining first image data generated in a first frame period,
   wherein the first node has a function of retaining second image data generated in an n-th frame (n is a natural number of 2 or more) period,
   wherein the second node has a function of retaining difference data that is a difference between the first image data and the second image data,
   wherein the first switch has a function of controlling output of the first image data and the second image data,
   wherein the second circuit comprises a comparison circuit and an output circuit,
   wherein the comparison circuit has a function of determining whether the difference data is within a voltage range set arbitrarily, and
   wherein the output circuit has a function of outputting a voltage for turning off the first switch when the difference data is within the voltage range and outputting a voltage for turning on the first switch when the difference data is outside the voltage range.

2. The imaging device according to claim 1,
   wherein the first circuit comprises a photoelectric conversion device, a first transistor, a second transistor, a third transistor, a fourth transistor, a fifth transistor, a sixth transistor, a first capacitor, and a second capacitor,
   wherein one electrode of the photoelectric conversion device is electrically connected to one of a source and a drain of the first transistor,
   wherein the other of the source and the drain of the first transistor is electrically connected to one of a source and a drain of the second transistor, a gate of the third transistor, one electrode of the first capacitor, and one electrode of the second capacitor,
   wherein one of a source and a drain of the third transistor is electrically connected to one of a source and a drain of the fourth transistor,
   wherein the other of the source and the drain of the third transistor is electrically connected to one of a source and a drain of the fifth transistor,
   wherein the other electrode of the second capacitor is electrically connected to one of a source and a drain of the sixth transistor, and
   wherein the fifth transistor is the first switch.

3. The imaging device according to claim 2,
   wherein the first transistor to the sixth transistor each include a metal oxide in a channel formation region.

4. The imaging device according to claim 2 or 3,
   wherein the first circuit further comprises a seventh transistor,
   wherein one of a source and a drain of the seventh transistor is electrically connected to the other of the source and the drain of the first transistor and the one of the source and the drain of the second transistor,
   wherein the other of the source and the drain of the seventh transistor is electrically connected to the gate of the third transistor, the one electrode of the first capacitor, and the one electrode of the second capacitor, and
   wherein the seventh transistor includes a metal oxide in a channel formation region.

5. The imaging device according to claim 3 or 4,
   wherein the metal oxide includes In, Zn, and M (M is one or more of Al, Ti, Ga, Ge, Sn, Y, Zr, La, Ce, Nd, and Hf).

6. The imaging device according to any one of claims 1 to 5,
   wherein the comparison circuit comprises a first sense amplifier and a second sense amplifier,
   wherein the first sense amplifier comprises a third node,
   wherein the second sense amplifier comprises a fourth node,
   wherein the output circuit comprises a fifth node,
   wherein the first sense amplifier comprises a first input unit to which a lowest voltage in the voltage range is input,
   wherein the second sense amplifier comprises a second input unit to which a highest voltage in the voltage range is input,
   wherein the first sense amplifier and the second sense amplifier each comprise a third input unit to which the second node is electrically connected,
   wherein the third node and the fourth node are electrically connected to the output circuit, and
   wherein the fifth node is electrically connected to the first switch.

7. The imaging device according to claim 6,
   wherein the third input unit is electrically connected to the second node of one pixel, and
   wherein the fifth node is electrically connected to the first switches of a plurality of pixels.

8. The imaging device according to claim 6 or 7,
   wherein the second circuit further comprises an inverter circuit, and
   wherein transistors included in the inverter circuit, the first sense amplifier, the second sense amplifier, and the output circuit can each include silicon in a channel formation region.

9. The imaging device according to claim 6 or 7,
   wherein the first sense amplifier and the second sense amplifier each comprise a first power switch and a second power switch,
   wherein the first power switch comprises a p-channel transistor,
   wherein the second power switch comprises an n-channel transistor,
   wherein the n-channel transistor includes a metal oxide in a channel formation region, and
   wherein the metal oxide includes In, Zn, and M (M is one or more of Al, Ti, Ga, Ge, Sn, Y, Zr, La, Ce, Nd, and Hf).

10. The imaging device according to any one of claims 1 to 9, comprising:
    a region where the first circuit and the second circuit overlap with each other.

11. The imaging device according to any one of claims 1 to 9, comprising:
    a region where a plurality of first circuits and one second circuit overlap with each other may be included.

12. An operation method of an imaging device, comprising the steps of
    setting a first voltage and a second voltage (the first voltage<the second voltage) in a pixel;
    obtaining first image data of a first frame period;
    obtaining second image data of an n-th frame (n is a natural number of 2 or more) period;

calculating a third voltage, which is a difference between the first image data and the second image data; and comparing the first voltage, the second voltage, and the third voltage, wherein the second image data is not read out from the pixel when the third voltage is greater than the first voltage and less than the second voltage, and wherein the second image data is read out from the pixel when the third voltage is less than the first voltage or the third voltage is greater than the second voltage.

13. An electronic device comprising:

the imaging device according to any one of claims 1 to 11, and a display device.

* * * * *